United States Patent [19]
Jaffe

[11] Patent Number: 5,130,670
[45] Date of Patent: Jul. 14, 1992

[54] PHASE-LOCKING CIRCUIT FOR SWEPT SYNTHESIZED SOURCE PREFERABLY HAVING STABILITY ENHANCEMENT CIRCUIT

[75] Inventor: Stanley E. Jaffe, Santa Rosa, Calif.

[73] Assignee: Hewlett-Packard Company, Palo Alto, Calif.

[21] Appl. No.: 739,592

[22] Filed: Aug. 1, 1991

[51] Int. Cl.$^5$ .................. H03L 7/07; H03L 7/093; H03L 7/12; H03L 7/18

[52] U.S. Cl. ........................... 331/2; 331/4; 331/10; 331/14; 331/16; 331/17; 331/25

[58] Field of Search .................. 331/2, 4, 10, 14, 16, 331/17, 25

[56] References Cited
U.S. PATENT DOCUMENTS 4,061,979 12/1977 Walker et al. .............. 331/17 X
4,363,004 12/1982 Englund, Jr. et al. ........ 331/17 X

*Primary Examiner*—Siegfried H. Grimm
*Attorney, Agent, or Firm*—William C. Milks, III

[57] ABSTRACT

A phase-lock loop for a swept synthesized source in which hysteresis, tuning nonlinearity, and drift over time and temperature of an oscillator incorporated into the swept synthesized source are compensated. The tuning current to the oscillator is initialized to zero to eliminate hysteresis effects. Then, the pretune current is set to produce the minimum operating frequency of the oscillator. Next, the main phase-lock loop is closed, and a low-frequency synthesizer is swept to in turn sweep the oscillator over a selected frequency span. If the selected frequency span extends over other frequency bands, the oscillator is swept to the maximum frequency of the present band and held at this frequency by a track and hold circuit. The main phase-lock loop is opened, the low-frequency synthesizer is re-initialized, the main phase-lock loop is again closed, and the low-frequency synthesizer is swept again. Each frequency band is crossed in a similar manner until the selected frequency span is swept. In order to improve phase-noise and transient response performance of the low-frequency synthesizer, a phase-lock loop speed-up and stability enhancement circuit comprising a zener diode connected across a passive lag-lead network is incorporated. Pretune calibration for the swept synthesized source is also provided.

20 Claims, 21 Drawing Sheets

SECOND INTEGRATOR OUTPUT
W/ CIRCUIT 66
5V/DIV, 200μs/DIV

VCO TUNE VOLTAGE
W/ CIRCUIT 66
2V/DIV, 200μs/DIV

SECOND INTEGRATOR OUTPUT
10V/DIV, 1ms/DIV

LAG-LEAD CAPACITOR VOLTAGE
W/ CIRCUIT 66
2V/DIV, 200 µs/DIV

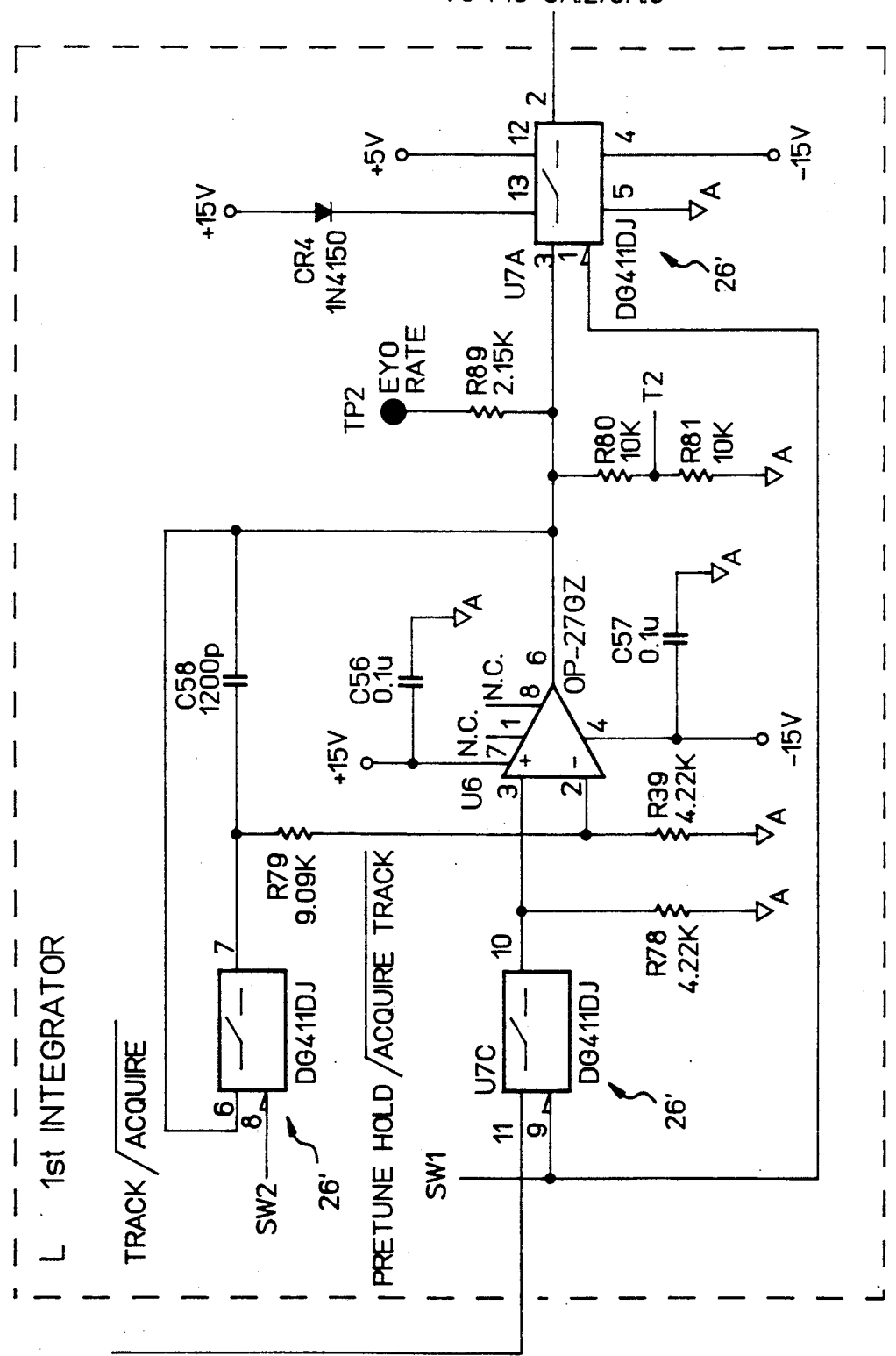

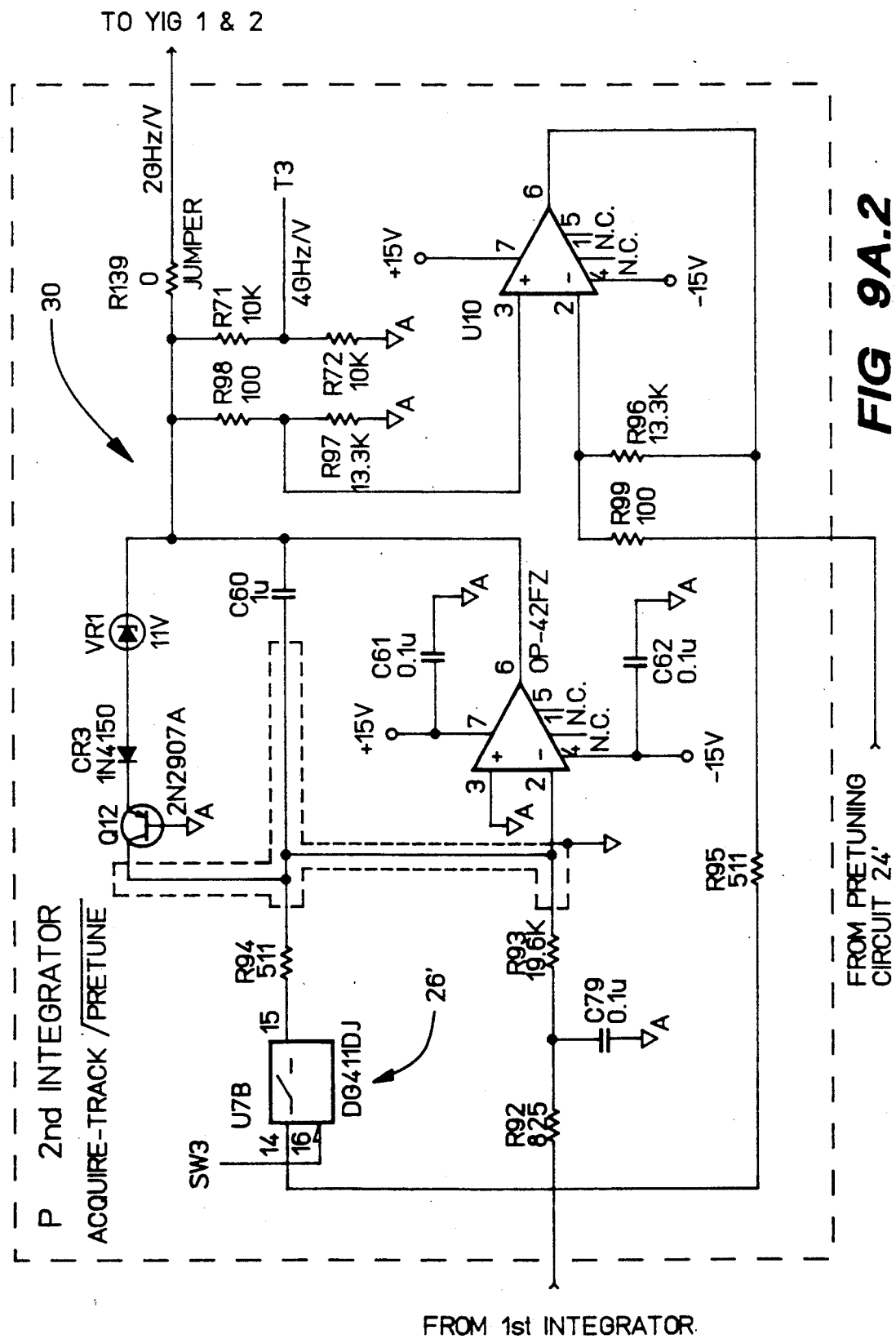
FIG 9A.2

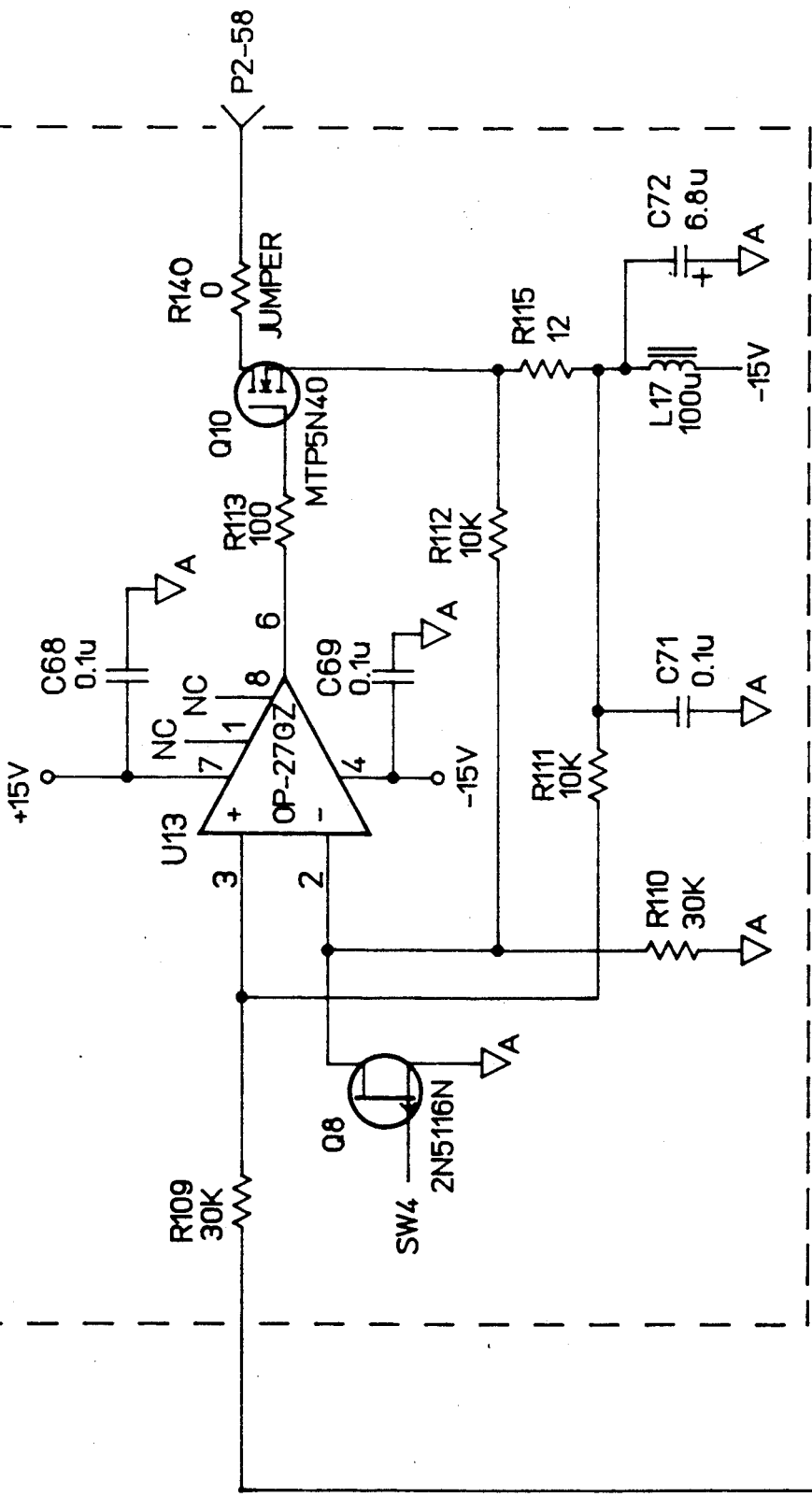
FIG 9A.3

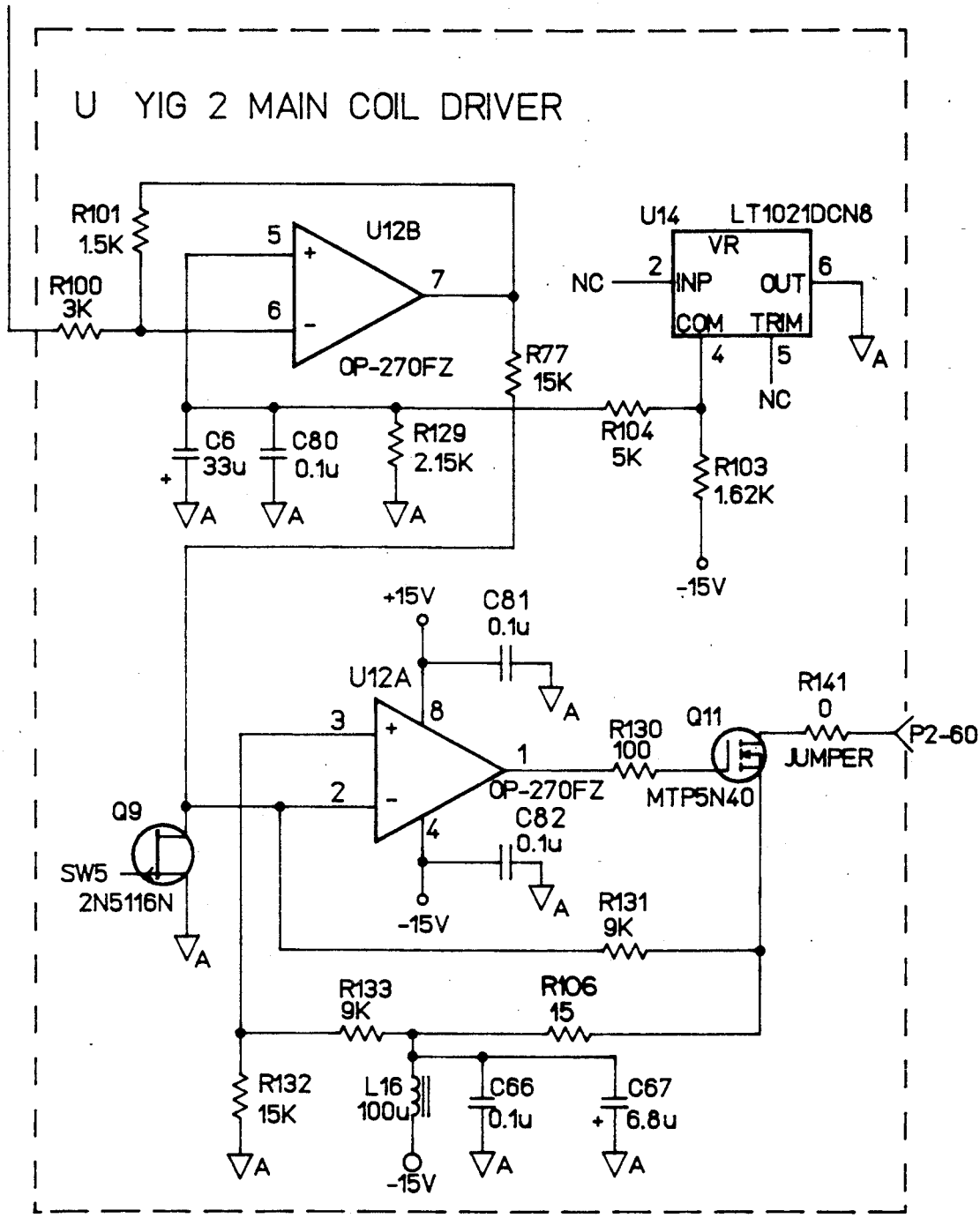
FIG 9A.4

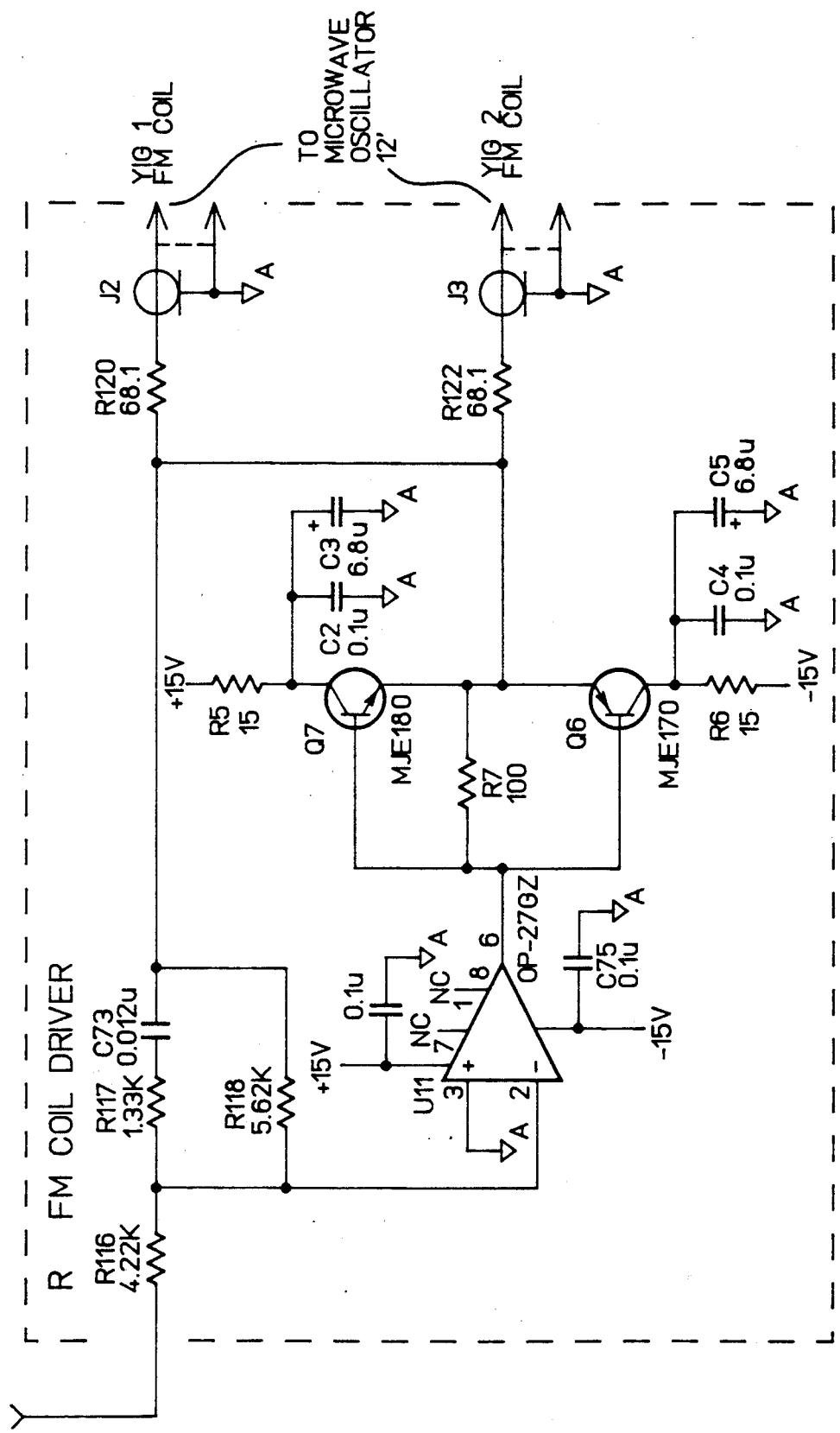
FIG 9A.5

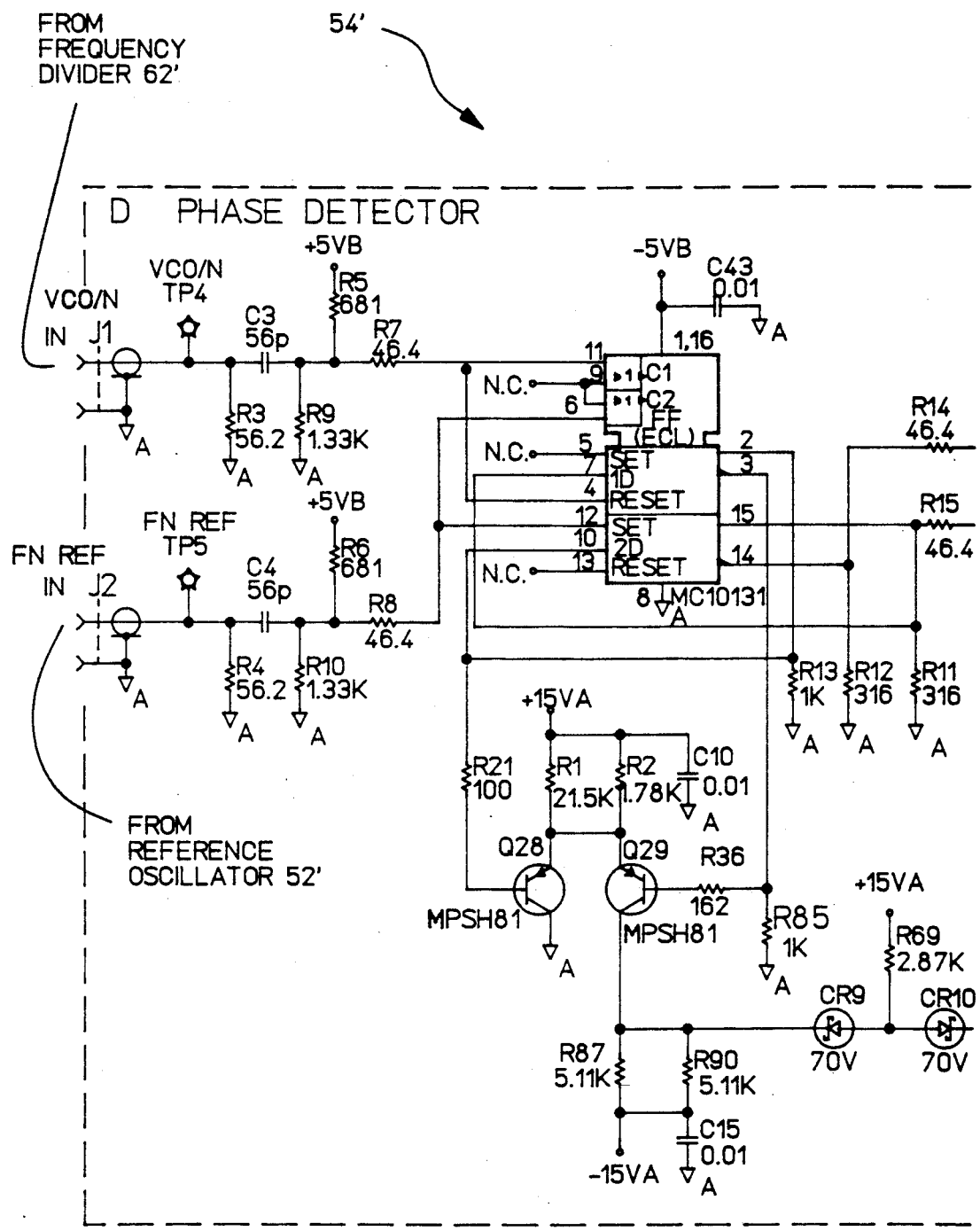
FIG 9B.1

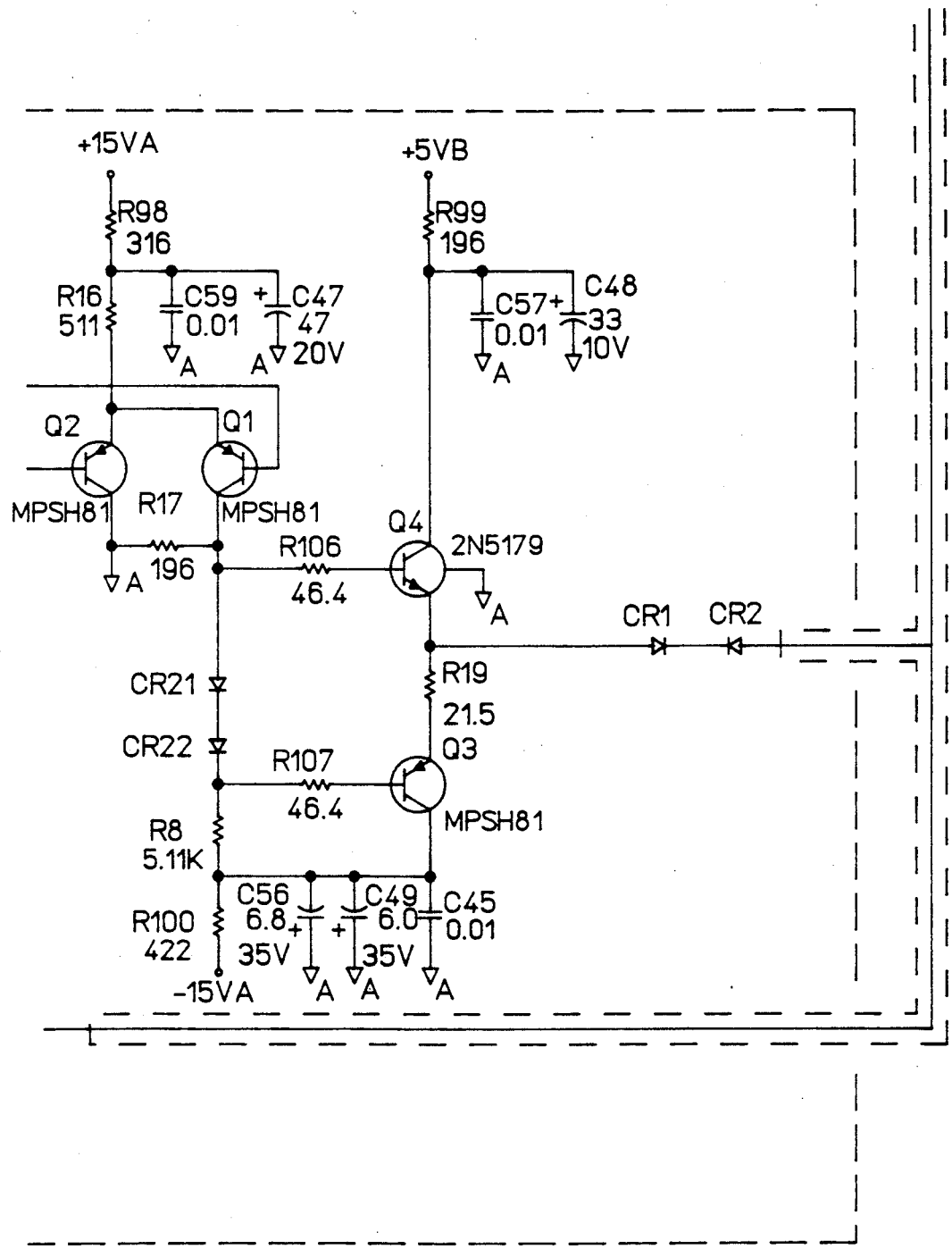
FIG 9B.2

PHASE-LOCKING CIRCUIT FOR SWEPT SYNTHESIZED SOURCE PREFERABLY HAVING STABILITY ENHANCEMENT CIRCUIT

BACKGROUND OF THE INVENTION

This invention relates to sources for generating high-frequency electrical signals and, more particularly, to frequency synthesizers for generating swept radio-frequency (RF) signals, including signals at microwave frequencies. Specifically, one embodiment of the invention provides a swept synthesized source having a phase-lock loop for providing improved control of the frequencies generated by the swept synthesized source and preferably also provides reduced phase-lock loop acquisition time and improved stability for a low-frequency synthesizer incorporated into the swept synthesized source to yield a swept synthesized source having improved frequency accuracy and reduced phase noise.

A block diagram of a conventional swept synthesized source is shown in FIG. 1. Such a swept synthesized source generates an electrical signal having a selectively variable frequency. Typically, the frequency is varied, or swept, either continuously or in discrete steps from one frequency, known as the "start frequency," to a higher frequency, known as the "stop frequency," the range of frequencies from the start frequency to the stop frequency being known as the "frequency span."

The typical swept synthesized source, generally indicated by the numeral 10 shown in FIG. 1, comprises a microwave electronically tunable oscillator 12, a frequency sampler 14, a low-frequency synthesizer 16, a phase/frequency detector 18, a reference oscillator 20, a loop filter/signal conditioning circuit 22, an electronic pretuning circuit 24, such as a digital-to-analog converter (DAC), and means to open and close the phase lock loop, such as a switch 26. Operation and synchronization of the low-frequency synthesizer 16, the pretuning circuit 24, and the switch 26 are controlled by a controller 28, such as a microprocessor.

Considered in more detail, in order to lock to any selected start frequency within the operating range of the swept synthesized source 10, the microwave oscillator 12 is pretuned near this frequency with the switch 26 operated by the controller 28 to the dotted line position indicated in FIG. 1, so that the main phase-lock loop of the swept synthesized source is open, and a tuning input of the microwave oscillator is connected to the pretuning circuit 24. Also, the low-frequency synthesizer 16 is set to its lowest frequency by the controller 28.

Once pretuning is complete, the switch 26 is operated to the solid line position indicated in FIG. 1, so that the main phase-lock loop is closed. The selected start frequency is attained when the microwave oscillator 12 locks on to the proper comb tooth that appears in the output of the sampler 14, as is well known. This occurs when the signal produced by the phase/frequency detector 18 reaches a null during operation of the main phase-lock loop after the loop is closed. The low-frequency synthesizer 16 is then swept by the controller 28 up to a frequency which produces the selected stop frequency of the microwave oscillator 12.

In order for the swept synthesized source 10 to be swept from the selected start frequency to the selected stop frequency, the frequency of the low-frequency synthesizer 16 is incremented by the controller 28 as will be described shortly. This causes the signal produced by the phase/frequency detector 18 to deviate from the null condition and feed an error voltage to the tuning input of the microwave oscillator 12, which drives the microwave oscillator to operate at a higher frequency. Once this higher frequency is attained, the main phase-lock loop operates so that the phase/frequency detector 18 again reaches a null condition. This process is repeated with the frequency being increased, either continuously or in discrete steps, until the selected stop frequency is reached.

The swept synthesized source 10 of the type shown in FIG. 1 has several known limitations. Most importantly, it is imperative to pretune accurately so that the microwave oscillator 12 does not lock on to the wrong comb tooth of the sampler 14.

However, there are inherent problems with the conventional pretuning technique described above. Specifically, the required pretune voltage produced by the pretuning circuit 24 is typically derived from a pretune calibration algorithm. For example, in the case where the pretuning circuit 24 is a DAC, the pretune calibration algorithm is based on a transfer function of selected pretune frequency versus required DAC setting. The voltage produced by the DAC in response to this DAC setting is converted to a current that is fed to the tuning input of the microwave oscillator 12 to drive the microwave oscillator.

Unfortunately, the microwave oscillator 12 is typically a yttrium-iron-garnet (YIG) oscillator or other tunable device comprising magnetic material. Therefore, the microwave oscillator 12 has a hysteresis in its tuning characteristic. This means that a given pretuning current produced in response to the DAC voltage can yield a range of output frequencies dependent on the previous amount of tuning current present.

Also, another difficulty results from the non-linear pretuning curve for the tuning current versus actual pretune frequency transfer function for different frequency bands of the microwave oscillator 12. The conventional swept synthesized source 10 employs a piecewise linear approximation to this curve, requiring derivation of several segment endpoints during the pretune calibration. However, this pretune calibration is affected by changes in time and temperature.

Consequently, the accuracy of the swept synthesized source 10 in generating a selected pretune frequency can be relatively low due to the hysteresis characteristic of the microwave oscillator 12. Additionally, the repeatability with which the swept synthesized source 10 can generate that selected pretune frequency is significantly affected over changes in time and temperature. Therefore, a swept synthesized source is needed to overcome these limitations.

Additionally, the low-frequency synthesizer 16 can comprise a synthesizer having a conventional configuration shown in the block diagram of FIG. 2. As shown in FIG. 2, a phase-lock loop for the low-frequency synthesizer 16 typically comprises another reference oscillator 52, another phase/frequency detector 54, integrator(s) 56, 58, a voltage controlled oscillator (VCO) 60, and a frequency divider 62. The VCO 60 is phase-locked to the reference oscillator 52 by using the phase-lock loop for the low-frequency synthesizer 16. The frequency of the VCO 60 is N times the frequency of the reference oscillator 52, where N is the divide number of the frequency divider 62 set by the controller 28.

In order to minimize phase error in high-speed frequency tracking, maximum gain is desired in the phase-lock loop for the low-frequency synthesizer 16. This can be achieved by using two integrators 56 and 58, rather than one. A phase-lock loop with two integrators, such as integrators 56 and 58, is conventionally known as a type III loop.

The transient response of the type III phase-lock loop shown in FIG. 2 is determined by the location of the poles and zeros in the loop bandwidth. For a type III phase-lock loop (two integrators 56 and 58), typically each integrator has a pole at 0 Hz and a zero somewhere between one-half and one-tenth of the loop bandwidth. These zeros are the dominant elements in determining overall transient response characteristics of the type III phase-lock loop.

For example, a type III phase-lock loop with a loop bandwidth of 100 kHz could have two integrators 56 and 58, each with a pole at 0 Hz and a zero at 10 kHz. This would result in a type III phase-lock loop with minimal ringing and overshoot for large changes in the divide number N and, hence, large changes in the frequency of the VCO 60.

In order to enhance phase-noise performance in a type III phase-lock loop, one conventional technique is to include a passive lag-lead network 64 between the second integrator 58 and a tune voltage input of the VCO 60, as shown in FIG. 2. In the given example, the second integrator 58 would still have its pole frequency at 0 Hz, but would shift the zero down to a low frequency, such as 25 Hz. The lag-lead network 64 would have a pole at this same frequency to cancel the zero and a zero at the original circuit location (in the above example, 10 kHz). The overall response of the second integrator 58 and the lag-lead network 64 would be equivalent (a pole at 0 Hz and a zero at 10 kHz), but any broadband noise at the output of the second integrator would be greatly attenuated by the lag-lead network. The result is improved phase-noise performance.

Transient response and/or stability of the phase-lock loop for the low-frequency synthesizer 16 are major design considerations. The phase-lock loop must settle quickly when the divide number N is changed to sweep the frequency of the low-frequency synthesizer 16 and, hence, the frequency of the microwave oscillator 12 shown in FIG. 1. The greatest demand is placed on the phase-lock loop of the low-frequency synthesizer 16 when the change in N is large.

Now, the stability of the phase-lock loop for the low-frequency synthesizer 16 can be divided into two components: small-signal stability and large-signal stability. Small-signal stability is defined as the transient response to small changes to N, with the resulting transient control voltages within the phase-lock loop of the low-frequency synthesizer 16 less than their saturation limits. Large-signal stability is defined as the response to large changes in N, with the integrators 56 and 58 entering into their saturation region. Under this large-signal operating condition, the operation of the phase-lock loop of the low-frequency synthesizer 16 is no longer linear.

A major limitation of the conventional low-frequency synthesizer 16 shown in FIG. 2 is its large-signal transient response. With a cutoff frequency of 25 Hz, the slew time during large changes in N is considerable. In order to discharge a capacitor 64A of the lag-lead network 64, the second integrator 58 swings to its negative rail, with the first integrator 56 at its positive rail. As the first integrator 56 recovers from saturation, it pulls the second integrator 58 out of saturation also. However, there is a lag time between the change in the output voltage of the first integrator 56 in response to the change in the output of the second integrator 58, as well as the output of the lag-lead network 64. This lag time creates a phase shift in the type III phase-lock loop, which results in instability. This instability appears as ringing in the transient response of the low-frequency synthesizer 16 at best, or as oscillation at worst.

Considered in more detail, FIG. 3 illustrates the transient response of the low-frequency synthesizer 16 shown in FIG. 2 during large-signal operation in response to a large change in the divide number N. When the divide number N is altered from a large number to a small number, the frequency of the VCO 60 switches from a high value to a low value. At the time that N is altered, the output of the first integrator 56 swings positive, the output of the second integrator 58 swings negative, the capacitor 64A of the lag-lead network 64 is discharged, and the frequency of the VCO 60 decreases. As the frequency of the VCO 60 continues to decrease past the desired frequency, the output of the first integrator 56 then goes negative to compensate. However, the time delay between the output of the first integrator 56 and the change in the output of the lag-lead network 64 is too great, introducing excessive phase shift and, hence, instability, as indicated by the arrow shown in FIG. 3.

Sharpe, C. A., "Speed up PLLs," Electronic Design 24, (Nov. 22, 1977) discloses speed-up circuitry to improve phase-lock loop acquisition time. Three approaches are suggested. The first approach is to detect large changes in the divide number N and slew the VCO at a rate faster than normal phase-lock loop dynamics allow by switching between two VCOs operating at different frequencies or range-switching one VCO with capacitors in an associated tank circuit, but the exact frequency shift needed must be known. The second approach is to select circuit values to optimize the slew rate without sacrificing the other phase-lock loop characteristics. The third approach is to tune the VCO frequency coarsely with channel information using a summing network, or with a tuning voltage using varactors, along with frequency lock-in by the phase-lock loop. These approaches are relatively restrictive and complex. In any event, stability of the phase-lock loop is not addressed, and, consequently, stability problems persist.

Therefore, there is a need for a phase-lock loop for a low-frequency synthesizer which has improved acquisition time and stability. It is also desirable to incorporate such a low-frequency synthesizer into a swept synthesized source to yield a swept synthesized source having improved frequency accuracy and reduced phase noise over a broad range of operating frequencies.

SUMMARY OF THE INVENTION

One embodiment of the present invention provides a swept synthesized source preferably comprising a microwave electronically tunable oscillator, a frequency sampler, a low-frequency synthesizer, a phase/frequency detector, a reference oscillator, a loop filter/signal conditioning circuit, an electronic pretuning circuit, such as a digital-to-analog converter (DAC), and means to open and close the phase lock loop, such as a switch. Additionally, in the case where the swept synthesized source is operated across several frequency bands, the swept synthesized source further comprises a track and hold circuit.

In accordance with this embodiment of the invention, the tuning current fed to the microwave oscillator is initially zeroed to eliminate hysteresis effects, for example, by initially disconnecting the tuning input of the microwave oscillator from the remainder of the circuit. Also, the electronic pretuning circuit, such as a DAC, is initially set to produce a voltage to drive the microwave oscillator, so that the microwave oscillator will operate near its minimum operating frequency, and a divide number N is reset, so that the low-frequency synthesizer is initialized near its minimum frequency of operation. Then, the pretuning circuit is connected to the tuning input of the microwave oscillator.

Next, the main phase-lock loop is closed, and the microwave oscillator phase locks to its minimum operating frequency. The low-frequency synthesizer in the main phase-lock loop is then swept to drive the microwave oscillator over the desired frequency span.

If the desired frequency span extends over several frequency bands, the low-frequency synthesizer is swept over its operating frequency range, which in turn sweeps the microwave oscillator to the maximum frequency of the present frequency band. Then, the main phase-lock loop is opened, and the tuning input of the microwave oscillator is connected to the track and hold circuit, so that the frequency of the microwave oscillator is held at the maximum frequency of the present frequency band, and the low-frequency synthesizer is re-initialized. Then, the switch is operated to disconnect the track and hold circuit and again close the main phase-lock loop, and the low-frequency synthesizer is swept again. Each frequency band is crossed in a similar manner until the desired frequency span from a selected start frequency to a selected stop frequency has been swept. The method in accordance with the invention compensates pretuning to eliminate hysteresis, tuning nonlinearity, and drift over time and temperature of the microwave oscillator.

Furthermore, the present invention provides a pretune calibration method so that the microwave oscillator will initially phase-lock to its minimum operating frequency as the swept synthesized source is initialized to begin its sweep. The pretune calibration method uses an internal frequency counter, an internal voltage comparator, and an internal voltmeter.

At the start of pretune calibration in accordance with one embodiment of the method of the invention, the DAC used to pretune the microwave oscillator is set to zero. Then, the minimum tuning voltage is measured. Next, the DAC is set to its maximum value. Thereafter, the maximum available tuning voltage is measured. From these measured values, a slope and offset are derived to allow computing a calibrated DAC value corresponding to each pretuning voltage over the entire range of available pretuning voltages.

An initial DAC "seed" value is stored in read only memory in the controller. This seed value is the DAC number to pretune the microwave oscillator to a frequency which is a predetermined frequency below the desired initial lock-up frequency corresponding to the minimum operating frequency of the microwave oscillator.

The DAC number is set to the seed value, so that the microwave oscillator is initially pretuned using the DAC seed value. Then, the initial frequency of the low-frequency synthesizer is set to near its minimum, and the microwave oscillator is pretuned using the current DAC number, which is initially the seed value. Thereafter, the actual tuning voltage produced by the DAC in response to the seed value is measured and stored.

Next, the main phase-lock loop is closed and phase-lock is attempted. The actual tuning voltage present when the main phase-lock loop is closed is stored. The operation of the main phase-lock loop is monitored by the internal voltage comparator to determine whether or not lock-up occurs.

If phase-lock does not occur, the DAC number is incremented by one. Then, initial phase-lock of the main phase-lock loop is again attempted at a tuning voltage derived from the incremented DAC number.

If lock-up occurs, the actual tuning voltage is measured and compared with the tuning voltage at pretune using the DAC seed value. From these two values (i.e., the actual tuning voltage at which phase-lock occurs and the initial pretune voltage), it is inferred whether the lock-up frequency is above or whether it is below the selected pretune frequency. If the lock-up frequency is below the selected pretune frequency, the DAC number is incremented by one, and phase-lock is again attempted at a tuning voltage derived from the incremented DAC number.

If the swept synthesized source phase locks to a frequency above the selected pretune frequency, it is determined whether or not the actual phase-lock frequency is the correct frequency (correct harmonic number) corresponding to the minimum operating frequency of the microwave oscillator. At this juncture, the main phase-lock loop is opened. Furthermore, a setting for the DAC number needed to produce the actual phase-lock frequency is derived based on measurement of the actual phase-lock frequency tuning voltage and slope and offset, the DAC is set with this number, and the corresponding pretuning voltage produced by the DAC is used to pretune the microwave oscillator. That is, the microwave oscillator is pretuned to a frequency using the same tuning voltage present when the swept synthesized source initially phase locked.

Next, the frequency output of the sampler is counted by the internal frequency counter and stored. The frequency of the low-frequency synthesizer is then shifted a known amount, and the frequency output of the sampler is again counted and stored.

The difference between the two counted sampler frequencies and the known amount that the frequency of the low-frequency synthesizer shifts are used to determine the harmonic to which the swept synthesized source is tuned. If phase-lock to the correct harmonic has occurred, the DAC number that was earlier derived (i.e., the DAC number corresponding to the tuning voltage which resulted in initial phase-lock) is stored, and this stored DAC number is used for pretuning to produce lock-up at the minimum operating frequency of the microwave oscillator during subsequent operation.

Otherwise, if it is determined that initial lock-up to the correct harmonic has not occurred, the initial pretune DAC number is incremented by one, and phase-lock is again attempted at a tuning voltage derived from the incremented DAC number. Preferably, a predetermined maximum number of attempts is undertaken to phase-lock to the correct pretune frequency, or the pretune calibration process is aborted.

Additionally, one embodiment of the invention provides a low-frequency synthesizer comprising a type III phase-lock loop incorporating another reference oscillator, another phase/frequency detector, two integrators, a passive lag-lead network, a voltage controlled oscillator (VCO), and a frequency divider. In accordance with the invention, the low-frequency synthesizer additionally comprises a zener diode in the lag-lead network to enable asymmetric charging and discharging of a capacitor in the lag-lead network to maintain loop stability (i.e., to avoid ringing and oscillation) by preventing loop saturation, especially for large changes in the divide number N which determines the operating frequency of the low-frequency synthesizer, thereby enhancing the stability, phase-noise performance, and transient response of the type III phase-lock loop.

The swept synthesized source in accordance with the various embodiments of the invention provides a phase-lock loop to achieve precise control of the frequencies generated by the swept synthesized source. The swept synthesized source also preferably provides improved phase-lock loop acquisition time and stability for a low-frequency synthesizer incorporated into the swept synthesized source to yield a swept synthesized source having improved frequency accuracy and reduced phase noise over a broad range of operating frequencies.

BRIEF DESCRIPTION OF THE DRAWINGS

The above and other features of the invention and the concomitant advantages will be better understood and appreciated by persons skilled in the field to which he invention pertains in view of the following description given in conjunction with the accompanying drawings. In the drawings:

FIG. 8, comprising

DETAILED DESCRIPTION OF THE PREFERRED EMBODIMENT

Previously, to lock to any arbitrary frequency within the range of a swept synthesized source, a microwave oscillator was simply pretuned near this frequency. The required pretune voltage was derived from a pretune calibration algorithm based on a transfer function of pretune frequency to the voltage produced by a digital-to-analog converter (DAC). As each frequency band of a desired swept frequency span was crossed, the main phase-lock loop was opened, and the DAC was set to a new value for the beginning frequency of the succeeding frequency band. Therefore, pretuning has heretofore not compensated for hysteresis and tuning nonlinearity and is susceptible to drift of the microwave oscillator over time and temperature. Consequently, the accuracy and repeatability of the frequency sweep of the swept synthesized source has been less than desirable.

Figure 1:
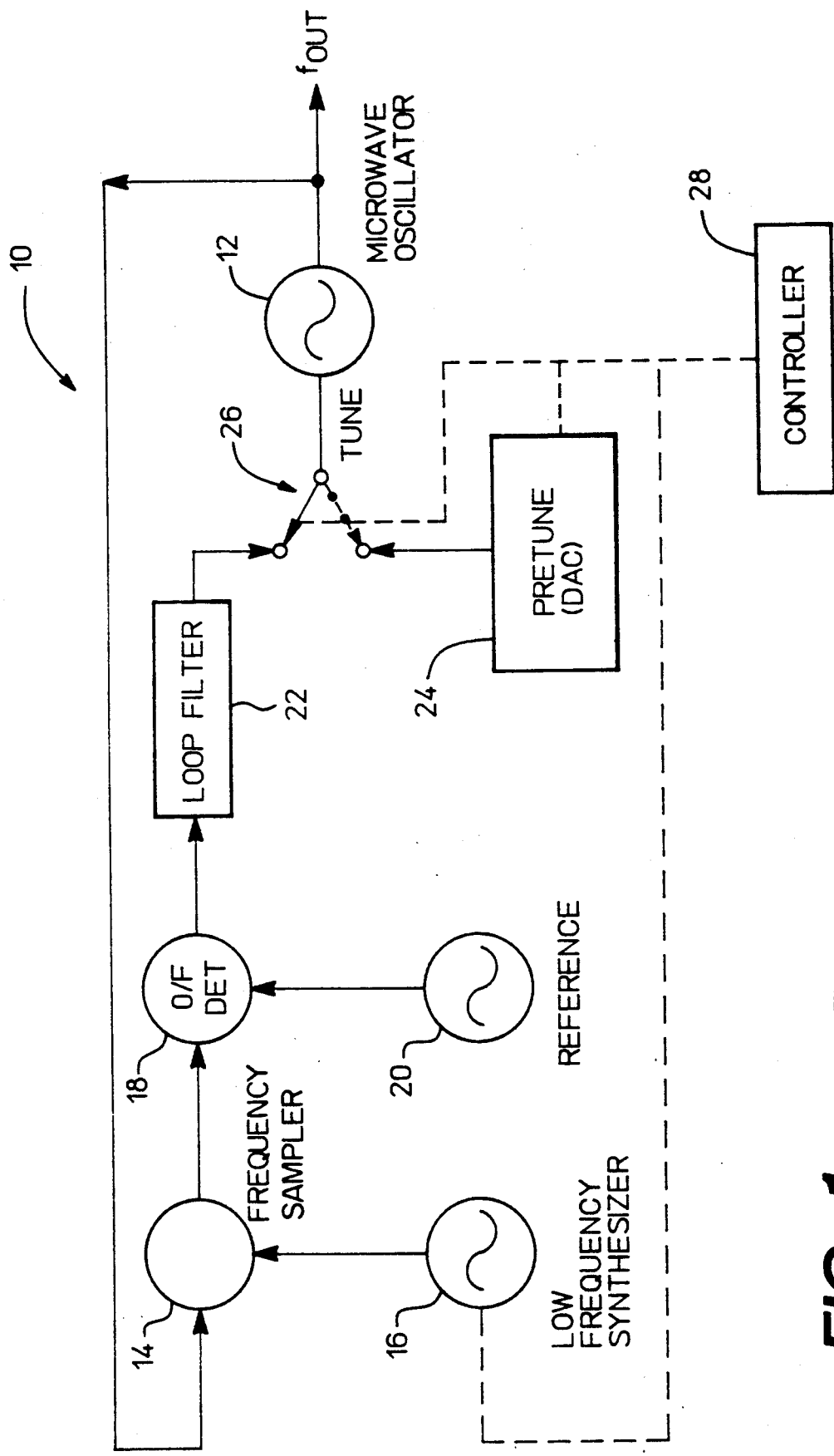
FIG. 1 is a block diagram of a conventional swept synthesized source.
Figure 2:
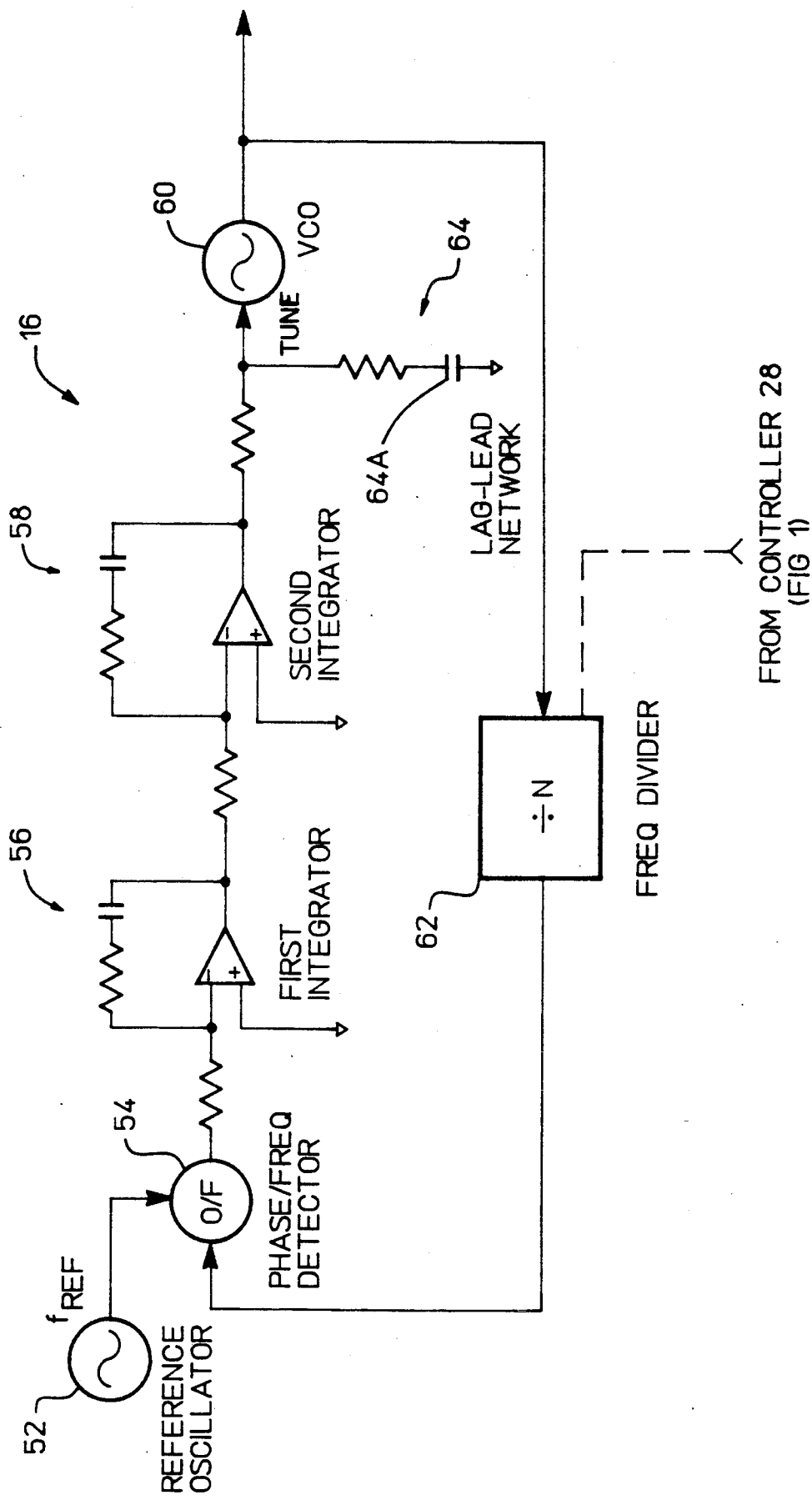
FIG. 2 is a block diagram of a conventional low-frequency synthesizer incorporated into the swept synthesized source shown in FIG. 1.
Figure 4:
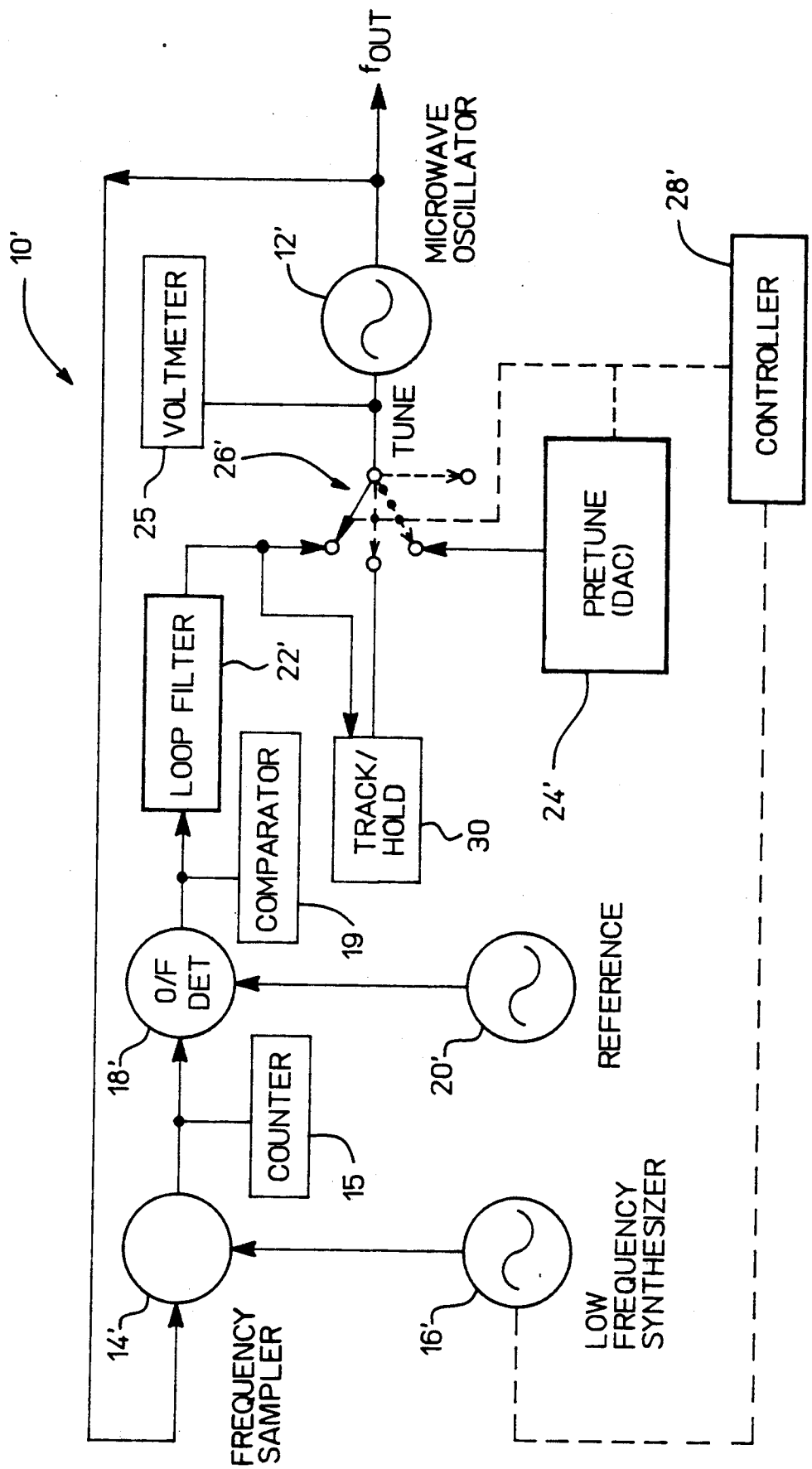
FIG. 4 is a block diagram of a swept synthesized source in accordance with one embodiment of the invention.

One embodiment of a swept synthesized source for achieving accurate, repeatable swept frequency operation in accordance with the invention, generally indicated by the numeral 10', is shown in FIG. 4. The swept synthesized source 10' comprises a microwave electronically tunable oscillator 12' connected in a main phase-lock loop with a frequency sampler 14', a low-frequency synthesizer 16', a phase/frequency detector 18', a reference oscillator 20', a loop filter/signal conditioning circuit 22', an electronic pretuning circuit 24', such as a digital-to-analog converter (DAC), and means to open and close the loop, such as a switch 26', similar to the configuration of the conventional swept synthesized source 10 shown in FIG. 1. Also similar to the conventional swept synthesized source 10 shown in FIG. 1, the switch 26' has a first position indicated by the solid line position in FIG. 4, in which an output of the loop filter 22' is connected to the tuning input of the microwave oscillator 12', and a second position indicated by the dotted line position in FIG. 4, in which the output of the pretuning circuit 24' is connected to the tuning input of the microwave oscillator.

Still referring to FIG. 4, the swept synthesized source 10' in accordance with one embodiment of the invention further comprises a track and hold circuit 30 having an input connected to the output of the loop filter 22' The track and hold circuit 30 stores the output of the loop filter 22' shown in FIG. 4, which corresponds to the most current value of the voltage produced during operation of the main phase-lock loop for driving the microwave oscillator 12'.

Also, in accordance with the one embodiment of the swept synthesized source 10' of the invention, the switch 26' has a third position indicated by the dashed line position in FIG. 4, in which the tuning input of the microwave oscillator 12' is disconnected from the remainder of the circuit and, for example, allows a zener diode and a resistor (not shown) connected across a tuning coil (not shown) of the microwave oscillator to turn on so that energy stored in the magnetic field of the coil is dissipated in a circulating current through the coil, zener diode, and resistor. Finally, the switch 26' has a fourth position indicated by the dash-dot line position in FIG. 4, in which the output of the track and hold circuit 30 is connected to the tuning input of the microwave oscillator 12'.

As shown in FIG. 4, operation and synchronization of the pretuning circuit 24' and the switch 26' are controlled by a controller 28', such as a microprocessor. The controller 28' also controls and synchronizes operation of the low-frequency synthesizer 16'.

Figure 5:
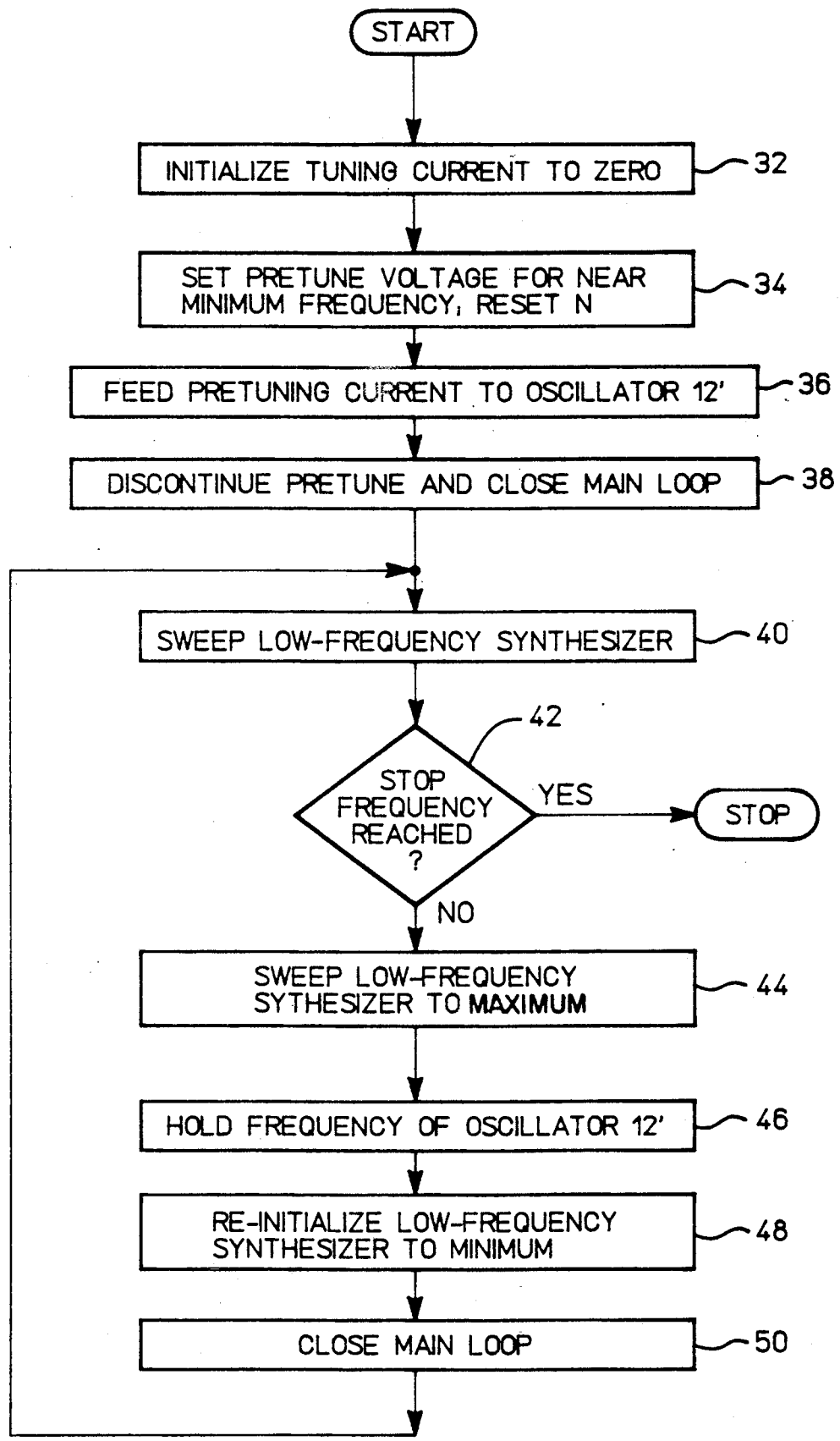
FIG. 5 is a flow chart of one embodiment of the method in accordance with the invention for achieving accurate and repeatable sweeping of the frequency of the swept synthesized source shown in FIG. 4.

In accordance with one embodiment of the method of the invention, illustrated in FIG. 5, the swept synthesized source 10' is operated so that the tuning current initially fed to the microwave oscillator 12' is zeroed, as indicated by the numeral 32 shown in FIG. 5. Therefore, any energy stored in the magnetic field resulting from previous operation of the microwave oscillator 12, is allowed to dissipate so that hysteresis effects are eliminated and, hence, do not affect subsequent operation of the microwave oscillator. Also, as indicated by the numeral 34 shown in FIG. 5, the pretune voltage is initially set to produce a voltage to cause the microwave oscillator 12' to be driven to operate near its minimum operating frequency, and the divide number N is reset so that the low-frequency synthesizer 16 is initialized near its minimum frequency of operation. Then, the pretuning current is fed to the microwave oscillator 12', as indicated by the numeral 36 shown in FIG. 5.

Next, as indicated by the numeral 38 shown in FIG. 5, pretuning is discontinued, and the main phase-lock loop is closed. Consequently, the microwave oscillator 12' phase locks to its minimum operating frequency. Then, the low-frequency synthesizer 16' in the main phase-lock loop is swept to drive the microwave oscillator 12' to in turn sweep the microwave oscillator across a frequency range, including the portion of the range from the minimum frequency to the desired start frequency (if these frequencies are in fact different) and then from the start frequency to the stop frequency, thereby sweeping the desired frequency span, as indicated by the numeral 40 shown in FIG. 5.

If the frequency span to be swept by the swept synthesized source 10' (i.e., the portion of the range from the minimum frequency of the microwave oscillator 12' to the stop frequency) includes all or a portion of a different frequency band(s) of the microwave oscillator than the initial frequency band, as determined by the numeral 42 shown in FIG. 5, the microwave oscillator is swept to the maximum frequency of the present frequency band. The maximum frequency of the current frequency band corresponds to the point in operation where the low-frequency synthesizer 16' is swept to its maximum frequency (i.e., the maximum value of the divide number N), as indicated by the numeral 44 shown in FIG. 5. At the point in the operating characteristic where the low-frequency synthesizer 16' reaches its maximum frequency for the one frequency band, the main phase-lock loop is opened, and the tuning input of the microwave oscillator 12' is connected to the output of the track and hold circuit 30 so that the frequency of the microwave oscillator is held at the current frequency by the track and hold circuit, as indicated by the numeral 46 shown in FIG. 5. Then, as indicated by the numeral 48 shown in FIG. 5, while the main phase-lock loop is open, the low-frequency synthesizer 16' is re-initialized to near its minimum frequency (the divide by N number is reset to its minimum).

Next, the main phase-lock loop is again closed, as indicated by the numeral 50 shown in FIG. 5. The low-frequency synthesizer 16' is then swept again so that the microwave oscillator 12' resumes sweeping to higher frequencies in the adjacent frequency band, as indicated by the numeral 40 shown in FIG. 5. Each frequency band is crossed in a similar manner until the selected stop frequency is attained, as determined by the numeral 42 shown in FIG. 5.

Considered in more detail with reference to FIG. 4, the swept synthesized source 10' operates as follows to solve problems attributable to hysteresis and nonlinearity of the microwave oscillator 12'. In order to assure that a given pretuning current will yield a selected pretune frequency, the tuning current is always set to zero prior to pretuning. This, in effect, removes the stored hysteresis in the magnetic material of the microwave oscillator 12' Accordingly, the controller 28' operates the switch 26' to the dashed line position indicated in FIG. 4 to zero the tuning current to the microwave oscillator 12'. Therefore, the tuning input of the microwave oscillator 12' is first disconnected from the remainder of the circuit before the microwave oscillator is pretuned.

When the tuning current is effectively reset to zero by disconnecting the tuning input of the microwave oscillator 12' from the remainder of the circuit, a finite amount of time is required for the magnetic field in the magnetic material of the microwave oscillator to dissipate (i.e., for the microwave oscillator to stabilize). This time can be on the order of tens of milliseconds, for example, approximately 30 milliseconds in the case that the main coil of the microwave oscillator 12' incorporates a 1 henry coil.

Furthermore, the microwave oscillator 12' is consistently pretuned to near its minimum frequency when it is pretuned. In order to pretune the microwave oscillator 12' to near the minimum frequency of its operating frequency range, the controller 28' sets the DAC of the pretuning circuit 24' with a value that will cause the DAC to produce a voltage needed to provide the tuning current required to pretune the microwave oscillator to near its minimum operating frequency. Then, the controller 28' operates the switch 26' to the dotted line position indicated in FIG. 4 to connect the output of the pretuning circuit 24' to the tuning input of the microwave oscillator 12' to drive the microwave oscillator to operate near its minimum operating frequency.

In order to phase lock the microwave oscillator 12' to a selected pretune frequency, the time for the microwave oscillator to settle is proportional to the extent of the frequency range over which the microwave oscillator must slew to the selected pretune frequency. The higher the pretune frequency, the longer the settling time is for the microwave oscillator 12'. Pretuning to the minimum frequency of operation of the microwave oscillator 12' in accordance with the invention minimizes the settling time of the microwave oscillator, as well as causes the operation of the microwave oscillator to be more repeatable.

Next, the main phase-lock loop is closed. In order to close the main phase-lock loop, the controller 28' operates the switch 26' to its solid line position indicated in FIG. 4 to connect the output of the loop filter 22' to the tuning input of the microwave oscillator 12'. The operation of the main phase-lock loop subsequently causes the microwave oscillator 12' to lock to its minimum operating frequency.

The low-frequency synthesizer 16' is then swept up to a frequency which produces the stop frequency of the swept synthesized source 10' or to the maximum frequency of the low-frequency synthesizer, which ever occurs first. If the selected stop frequency of the swept o synthesized source 10' is in another frequency band of the microwave oscillator 12' (that is, a different comb tooth at the output of the sampler 14'), the controller 28' sweeps the microwave oscillator to the maximum frequency of the present frequency band by sweeping the low-frequency synthesizer 16' to its maximum frequency (i.e., to the maximum divide number N). The controller 28' then operates the switch 26' to the dash-dot line position indicated in FIG. 4 so that the output of the track and hold circuit 30 is connected to the tuning input of the microwave oscillator 12'. Consequently, the microwave oscillator 12' is held at the current frequency by the track and hold circuit 30.

Operation of the switch 26' to its dash-dot line position indicated in FIG. 4 also opens the main phase-lock loop so that the controller 28' can re-initialize the low-frequency synthesizer 16' to near its minimum operating frequency by resetting the divide number N to its minimum. Re-initialization of the low-frequency synthesizer 16' is needed to initiate sweeping of the next frequency band of the range of operation of the microwave oscillator 12'.

Then, the controller 28' operates the switch 26' to the solid line position indicated in FIG. 4 to disconnect the tuning input of the microwave oscillator 12' from the output of the track and hold circuit 30 and again close the main phase-lock loop. Since the microwave oscillator 12' was held on the comb tooth of the sampler 14' at the completion of the previous sweep of the low-frequency synthesizer 16', operation continues from this operating point. Thereafter, when the controller 28' again causes the low-frequency synthesizer 16' to sweep from its minimum toward its maximum frequency, the microwave at the highest frequency of the previous frequency band and track the low-frequency synthesizer to generate higher frequencies. Each frequency band is crossed in a similar manner until the selected stop frequency of the swept synthesized source 10' is attained.

The above-described operation minimizes the influence of the hysteresis, tuning nonlinearity, and time and temperature drift of the microwave oscillator 12'. The basis of the solution in accordance with the embodiment of the swept synthesized source 10' shown in FIG. 4 is to eliminate hysteresis problems by always resetting the tuning current to zero before pretuning the microwave oscillator 12' Furthermore, the microwave oscillator 12' is restricted to be pretuned to near its minimum operating frequency and is always driven to its minimum operating frequency to avoid pretuning the microwave oscillator to any arbitrary frequency. This eliminates the need to derive piece-wise linear transfer function segments used to compute arbitrary pretune frequencies for crossing different frequency bands during operation of the swept synthesized source 10'. Nonlinearity of the microwave oscillator 12' is likewise not a major concern, as long as it does not contain any discontinuities.

Also in accordance with the present invention, a pretune calibration method is provided to assure proper initial pretuning of the swept synthesized source 10'. This pretune calibration method is preferably performed prior to the step 32 shown in FIG. 5. One embodiment of the pretune calibration method in accordance with the invention for the swept synthesized source 10' is shown in the flow chart of FIGS. 6A-6C and will now be described.

The purpose of the pretune calibration method is to derive the DAC value, or number, needed to pretune the microwave oscillator 12' to approximately the initial lock-up frequency (i.e., the minimum operating frequency of the microwave oscillator). Once pretuned near this frequency, the main phase-lock loop of the swept synthesized source 10' is closed, and phase-lock is achieved. It is necessary that the pretune frequency approximately equal the initial lock-up frequency in order to avoid phase-locking to the wrong comb tooth of the sampler 14'.

Figure 6:
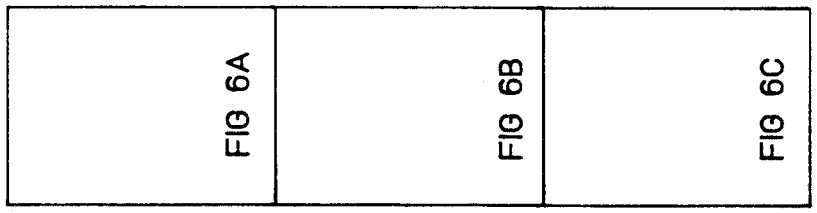
FIG. 6, comprising
Figure 6A:
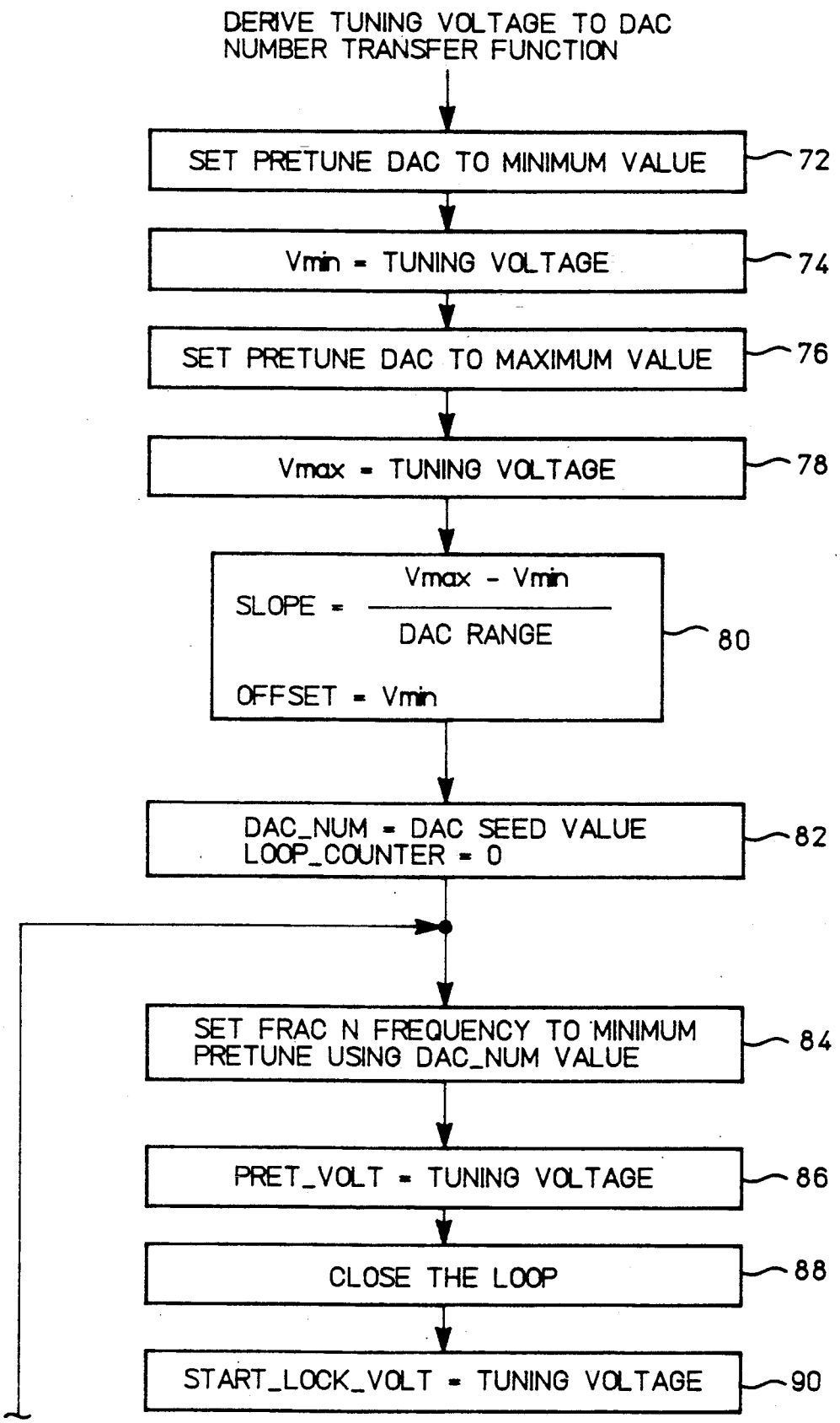
FIGS. 6A-6C, is a flow chart of one embodiment of a method in accordance with the invention for pretune calibration of the swept synthesized source shown in FIG. 4.
Figure 6B:
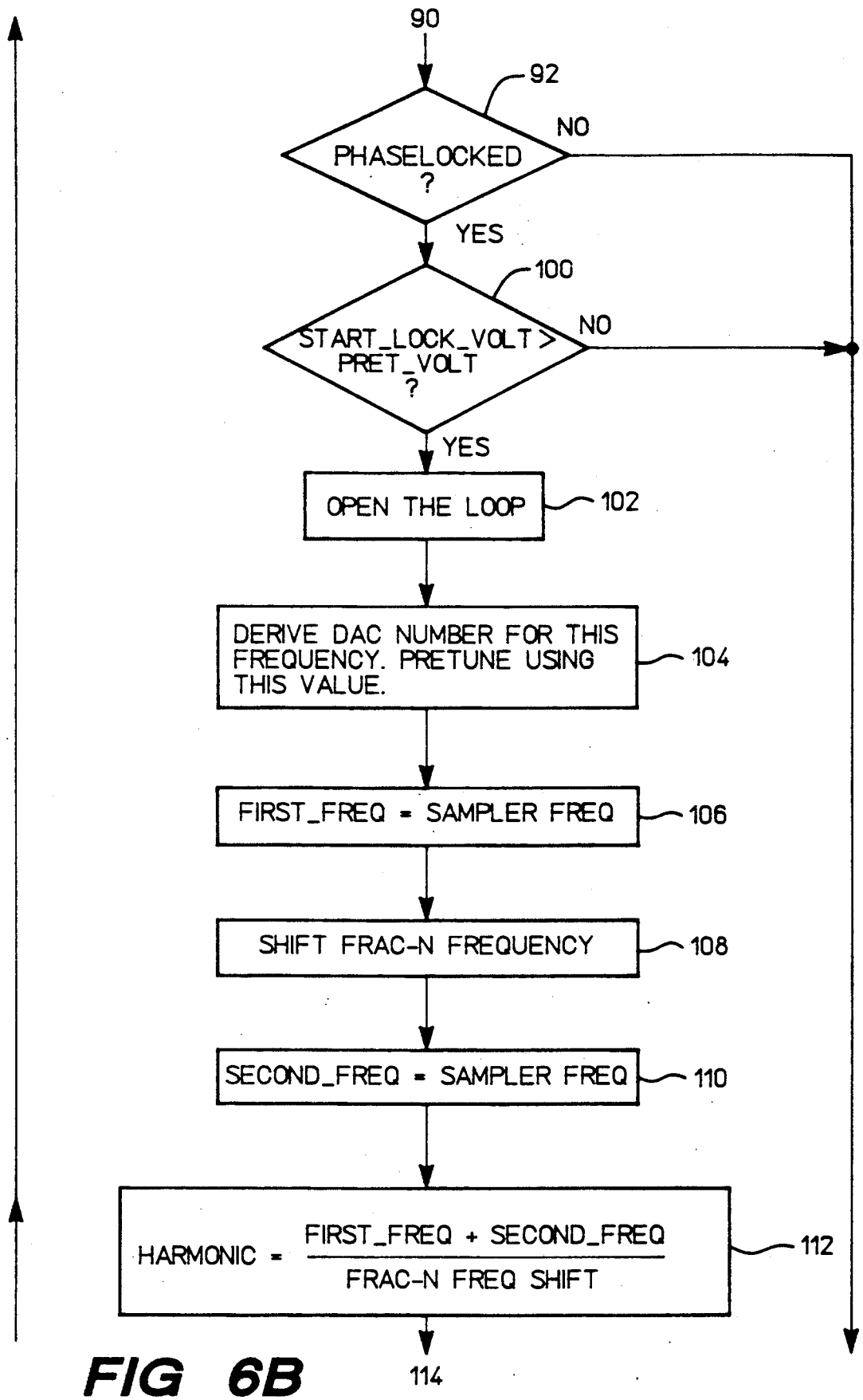
Figure 6C:
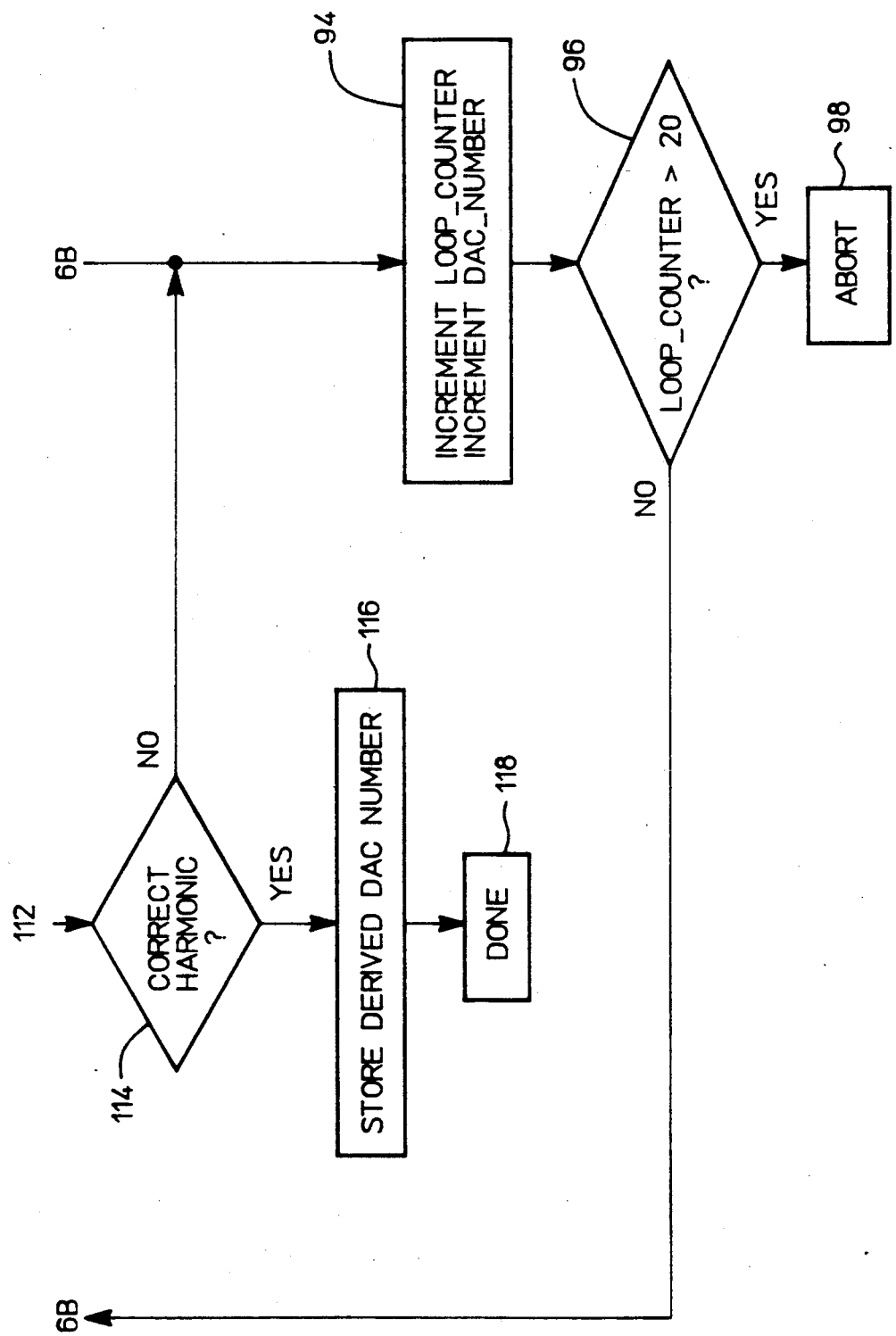

The pretune calibration method shown in FIGS. 6A-6C uses an internal frequency counter 15 connected to the 25 output of the sampler 14', an internal voltage comparator 19 connected to the output of the phase/frequency detector 18', and an internal voltmeter 25 connected to the tuning input of the microwave oscillator 12', as shown in FIG. 4. The internal voltmeter 25 is used to measure the tuning voltage fed to the microwave oscillator 12'. In the embodiment of the swept synthesized source 10' shown in FIG. 4, the internal frequency counter 15 has a maximum frequency limitation of approximately 18 MHz, so the frequency of the swept synthesized source cannot be counted directly. Consequently, the internal frequency counter 15 is used to count the intermediate frequency from the output of the sampler 14'. This frequency is:

$$Fif = N*Fn.f - Fs$$

where
Fif = the intermediate frequency;
N = harmonic comb tooth number;
Fn.f = frequency of the low-frequency (e.g., fractional-n) synthesizer 16'; and
Fs = frequency of the microwave oscillator 12'.

Pretune calibration is preferably performed when the swept synthesized source 10' is powered-up, on source preset, and whenever the pretune frequency has varied more than approximately 30 MHz from the previously derived value. (After each sweep, the DAC pretune number is adjusted for an optimum offset from the desired initial lock-up frequency.)

Referring to FIGS. 6A-6C, at the start of pretune calibration, the DAC is set to its minimum value (e.g., zero), as indicated by the numeral 72 shown in FIG. 6A. Then, as indicated by the numeral 74 shown in FIG. 6A, the resulting minimum tuning voltage, Vmin, is measured. Next, the DAC is set to its maximum value, as indicated by the numeral 76 shown in FIG. 6A. Thereafter, as indicated by the numeral 78 shown in FIG. 6A, the resulting maximum available tuning voltage, Vmax, is measured. From these values for Vmin and Vmax, a slope and offset are derived to allow computing a calibrated DAC value corresponding to each pretuning voltage over the entire range of available pretuning voltages, as indicated by the numeral 80 shown in FIG. 6A.

An initial DAC "seed" value is stored in read only memory (EEPROM) in the controller 28' at the factory. This seed value is the DAC number which is set at the factory to pretune the microwave oscillator 12' to a frequency approximately 50 MHz below the desired initial lock-up frequency corresponding to the minimum operating frequency of the microwave oscillator. This large offset (50 MHz) is predetermined so that the initial pretune frequency will always be below the desired initial lock-up frequency irrespective of worst-case temperature conditions and any aging effects experienced by the microwave oscillator 12'.

As indicated by the numeral 82 shown in FIG. 6A, the DAC number is initially set to the seed value, so that the microwave oscillator 12' is initially pretuned using the DAC seed value, and "loop_counter" is set to zero. Then, the divide number N is set near its minimum to determine the initial frequency of the low-frequency synthesizer 16', and the microwave oscillator 12' is pretuned using the current DAC number, which is initially the seed value, as indicated by the numeral 84 shown in FIG. 6A. Thereafter, the actual tuning voltage produced by the DAC in response to the seed value is measured and stored as "pret_volt", as indicated by the numeral 86 shown in FIG. 6A.

Next, as indicated by the numeral 88 shown in FIG. 6A, the main phase-lock loop is closed, and phase-lock is attempted. The actual tuning voltage present when the main phase-lock loop is closed is stored as "start_lock_volt", as indicated by the numeral 90 shown in FIG. 6A.

The operation of the main phase-lock loop is monitored to determine whether or not lock-up occurs, as indicated by the numeral 92 shown in FIG. 6B. For example, the output of the phase/frequency detector 18' is checked by the internal voltage comparator 19 shown in FIG. 4 to test whether or not phase-lock has been achieved.

If phase-lock does not occur, the DAC number is incremented by one, and "loop_counter" is also incremented by one, as indicated by the numeral 94 shown in FIG. 6C. If "loop_counter" exceeds twenty (i.e., twenty previous attempts have failed to effect initial lock-up), as indicated by the numeral 96 shown in FIG. 6C, the pretune calibration process is terminated, as indicated by the numeral 98 shown in FIG. 6C. Otherwise, initial phase-lock of the main phase-lock loop is again attempted, as indicated by the steps 84, 86, 88, 90, and 92 shown in FIGS. 6A and 6B, at a tuning voltage derived from the incremented DAC number.

If lock-up occurs, as determined at the step 92 shown in FIG. 6B, the actual tuning voltage is measured and compared with the tuning voltage at pretune. From these two values (i.e., the actual tuning voltage at which phase-lock occurs and the initial pretune voltage), it is inferred whether the lock-up frequency is above or whether it is below the selected pretune frequency, as indicated by the numeral 100 shown in FIG. 6B. If the lock-up frequency is below the selected pretune frequency, the DAC number is incremented by one, as indicated by the numeral 94 shown in FIG. 6C, and phase-lock is again attempted, as indicated by the steps 84, 86, 88, 90, and 92 shown in FIGS. 6A and 6B, at a tuning voltage derived from the incremented DAC number. Again, however, as indicated by the steps 96 and 98 shown in FIG. 6C, a maximum of twenty attempts is undertaken to phase lock to the correct start frequency.

If the swept synthesized source 10' phase locks to a frequency above the selected pretune frequency, it is determined whether or not the actual phase-lock frequency is the correct frequency (correct harmonic number) corresponding to the minimum operating frequency of the microwave oscillator 12'. At this juncture, the main phase-lock loop is opened, as indicated by the numeral 102 shown in FIG. 6B. Furthermore, a setting for the DAC number needed to produce the actual phase-lock frequency is derived based on measurement of the actual phase-lock frequency tuning voltage (start_lock_volt) and slope and offset values determined at the step 80 shown in FIG. 6A, the DAC is set with this number, and the corresponding pretuning voltage produced by the DAC is used to pretune the microwave oscillator 12', as indicated by the numeral 104 shown in FIG. 6B. That is, the microwave oscillator 12' is pretuned to a frequency using the same tuning voltage as when the swept synthesized source 10' was initially phase-locked.

Next, the frequency output of the sampler 14' (Fif) is counted and stored as "first_freq", as indicated by the numeral 106 shown in FIG. 6B. As indicated by the numeral 108 shown in FIG. 6B, the frequency of the low-frequency synthesizer 16' is then shifted a known amount, and the frequency output of the sampler 14' is again counted and stored as "second_freq", as indicated by the numeral 110 shown in FIG. 6B.

Since the microwave oscillator 12' is not phase-locked, its frequency will drift by a discernible amount. It is important to shift the low-frequency synthesizer 16' as far as possible to achieve a maximum shift in the frequency output of the sampler 14'. This minimizes the effect of the drift of the microwave oscillator 12'.

Initially, for example, the swept synthesized source 10' can be approximately 12 MHz below the harmonic of the low-frequency synthesizer 16'. After the frequency shift of the low-frequency synthesizer 16' occurs, the swept synthesized source 10' can be approximately 12 MHz above the harmonic of the low-frequency synthesizer. This yields a frequency shift of approximately 24 MHz, while remaining well below the maximum frequency limitation of 18 MHz of the internal frequency counter 15 at the output of the sampler 14'. (Drift of the microwave oscillator 12' will decrease the approximately 6 MHz margin and, hence, the choice of 12 MHz for the example).

The difference between the two counted sampler frequencies and the known amount that the frequency of the low-frequency synthesizer 16' shifts are used to determine the harmonic to which the swept synthesized source 10' is tuned, as indicated by the numeral 112 shown in FIG. 6B. If phase-lock to the correct harmonic has occurred, as determined by the numeral 114 shown in FIG. 6B, the DAC number derived at the step 104 shown in FIG. 6B is stored, as indicated by the numeral 116, and this stored DAC number is used for pretuning to produce lock-up at the minimum operating frequency of the microwave oscillator 12' during subsequent operation. This completes the pretune calibration process, as indicated by the numeral 118 shown in FIG. 6B.

Otherwise, if it is determined at the step 114 shown in FIG. 6B that initial lock-up to the correct harmonic has not occurred, the DAC number is incremented by one, as indicated by the step 94 shown in FIG. 6C, and phase-lock is again attempted, as indicated by the steps 84, 86, 88, 90, and 92 shown in FIGS. 6A and 6B, at a tuning voltage derived from the incremented DAC number. Again, however, as indicated by the steps 96 and 98 shown in FIG. 6C, a maximum of twenty attempts is undertaken to phase lock to the correct pretune frequency, or the pretune calibration process is aborted.

This invention also addresses the requirement of maintaining phase-lock loop linearity for large changes in the divide number N during operation of the low-frequency synthesizer 16'. One embodiment of the phase-lock loop stability enhancement circuit in accordance with the invention allows a non-linear override during periods of large-signal response of the phase-lock loop of the low-frequency synthesizer 16', but produces no effect during normal small-signal operation, as will now be described with reference to FIG. 7.

Figure 7:
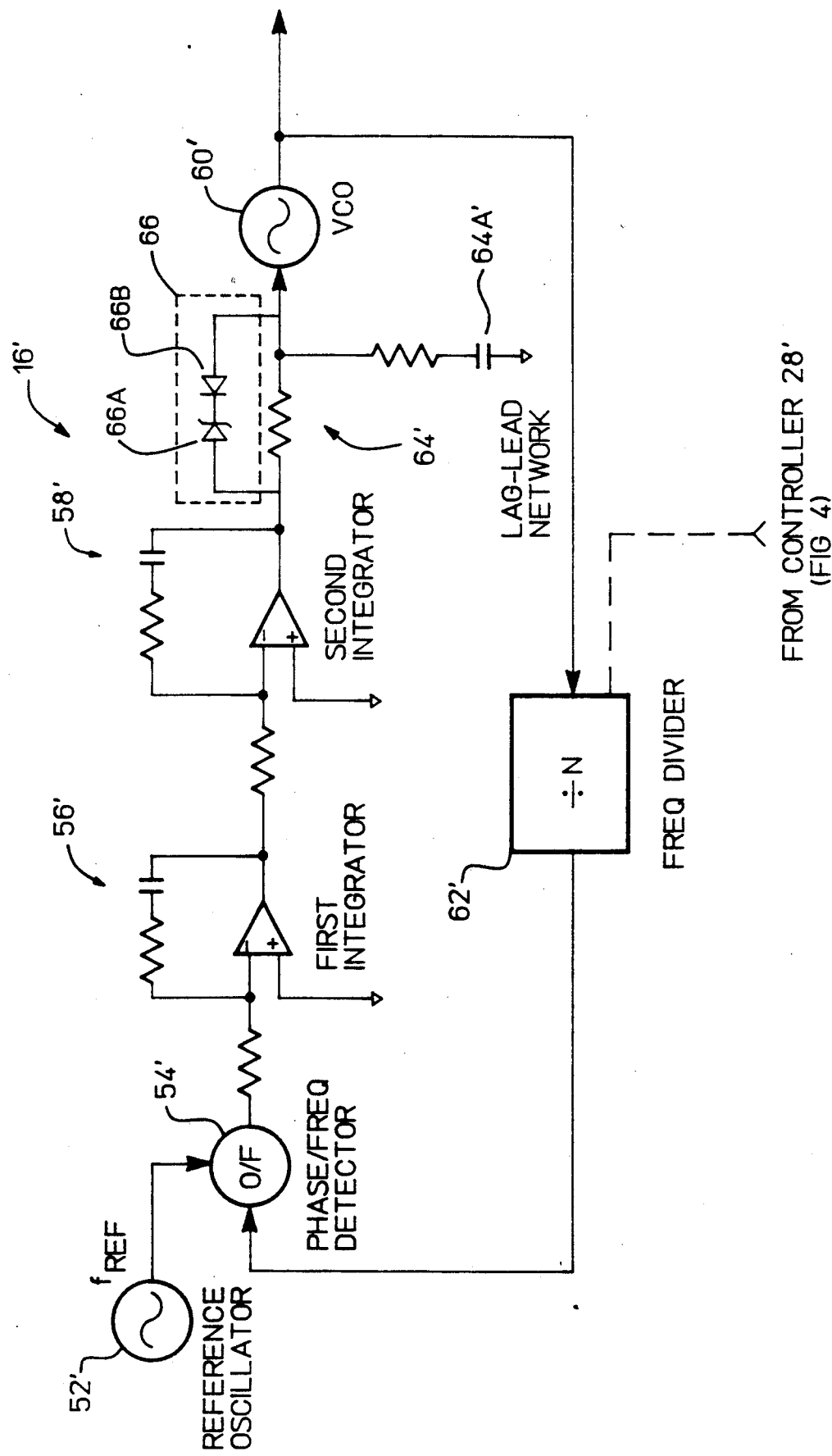
FIG. 7 is a block diagram of a low-frequency synthesizer in accordance with one embodiment of the invention for incorporation into the swept synthesized source shown in FIG. 4 to enhance the stability, phase-noise performance, and transient response of the swept synthesized source.

As shown in FIG. 7, one embodiment the low-frequency synthesizer 16' in accordance with the invention can comprise another reference oscillator 52', another phase/frequency detector 54', integrator(s) 56' and 58', a voltage controlled oscillator (VCO) 60', a frequency divider 62', and a lag-lead network 64', comprising a capacitor 64A', connected in a type III phase-lock loop. The VCO 60' is phase-locked to the reference oscillator 52' by using the phase-lock loop. The frequency of the VCO 60' is N times the frequency of the reference oscillator 52', where N is the divide number of the frequency divider 62' set by the controller 28' shown in FIG. 4.

In the embodiment of the low-frequency synthesizer 16' shown in FIG. 7, a phase-lock loop stability enhancement circuit 66 is incorporated to provide a non-linear override during periods of large-signal response of the phase-lock loop of the low-frequency synthesizer 16' but produces no effect during normal small-signal operation. Preferably, the phase-lock loop stability enhancement circuit 66 comprises a normally reverse-biased series-connected zener diode 66A and diode 66B connected across the lag-lead network 64', as shown in FIG. 7.

In order to minimize phase error in high-speed frequency tracking between the low-frequency synthesizer 16' and the microwave oscillator 12' shown in FIG. 4, maximum gain is desired in the phase-lock loop for the low-frequency synthesizer. This can be achieved by using the two integrators 56' and 58'.

The phase-lock loop of the low-frequency synthesizer 16' must settle quickly when the divide number N is changed to sweep the frequency of the low-frequency synthesizer and, hence, the frequency of the microwave oscillator 12' shown in FIG. 4. The resulting transient response voltages within the phase-lock loop are below their saturation limits when changes to N are small and, consequently, the loop exhibits stable small-signal operation. However, in response to large changes to N, the integrators 56' and 58' enter into their saturation region so that in the low-frequency synthesizer 16' there is a potential for large-signal instability.

The large-signal transient response of the low-frequency synthesizer 16' shown in FIG. 7 is as follows. With a cutoff frequency of 25 Hz, for example, the slew time during large changes in the divide number N is considerable. When the divide number N is altered from a large number to a small number, the frequency of the VCO 60' switches from a high value to a low value. At the time that N is altered, the output of the first integrator 56' swings positive, the output of the second integrator 58' swings negative, the capacitor 64A' of the lag-lead network 64' is discharged, and the frequency of the VCO 60' decreases.

As the frequency of the VCO 60' continues to decrease past the desired frequency, the output of the first integrator 56' then swings negative to compensate. However, the time delay between the output of the first integrator 56' and the change in the output of the lag-lead network 64' are potentially too great, introducing excessive phase shift and, hence, potential instability.

The embodiment of the phase-lock loop stability enhancement circuit 66 in accordance with the invention operates as follows. During periods of large-signal switching, the breakdown voltage of the zener diode 66A is exceeded, and the zener diode turns on so that the phase-lock loop stability enhancement circuit 66 overrides the lag-lead network 64' to allow the lag-lead capacitor 64A' to discharge very quickly. As a result, the voltage across the lag-lead network 64' undershoots, causing the input voltage to the lag-lead network to compensate by going positive. The phase-lock loop of the low-frequency synthesizer 16' then overshoots, but the lag-lead capacitor 64A' is charged at a very low charge rate.

Basically, the phase-lock loop stability enhancement circuit 66 allows an asymmetric charging and discharging of the lag-lead capacitor 64A' to improve the retrace condition. Retrace is defined as the switching from a high frequency of the VCO 60' to a low frequency.

Figure 8A:
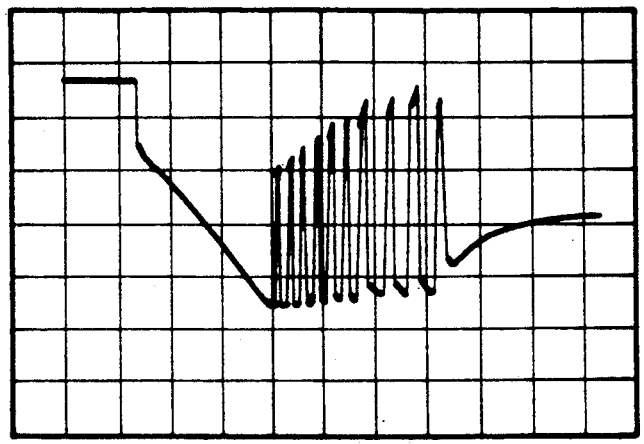
FIGS. 8A, 8B, and 8C, illustrates the transient responses of the low-frequency synthesizer shown in FIG. 7.
Figure 3:
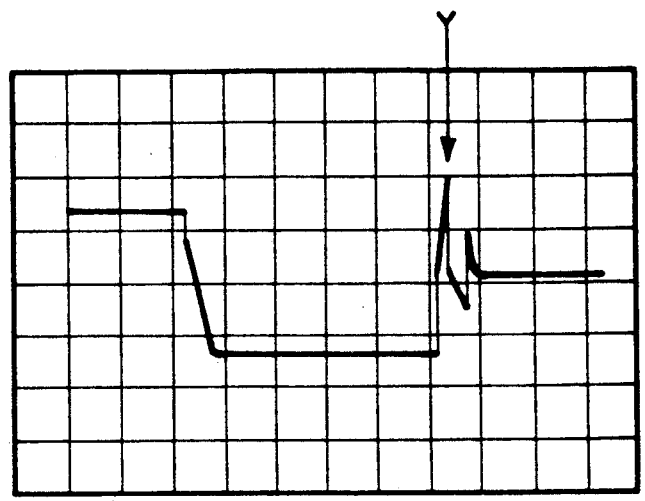
FIG. 3 illustrates the transient response of the conventional low-frequency synthesizer shown in FIG. 2 during large-signal operation in response to a large change in the divide number N.

FIG. 8A illustrates the output of the second integrator 58' in the phase-lock loop of the low-frequency synthesizer 16' with the phase-lock loop stability enhancement circuit 66. Note that the settling time is approximately 1.6 milliseconds versus approximately 6 milliseconds shown in FIG. 3 for the phase-lock loop without the phase-lock loop stability enhancement circuit 66. The output voltage of the second integrator 58' remains saturated at its negative rail voltage for several milliseconds, with the loop now in its nonlinear state. Its negative voltage swing is about −8 volts, which is well above the saturation limit. When the phase-lock loop of the low-frequency synthesizer 16' finally recovers from saturation, it overshoots and rings until attaining its final target value.

Figure 8B:
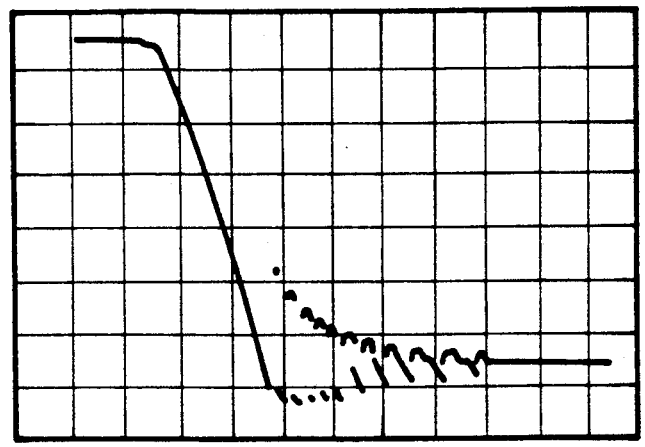
Figure 8C:
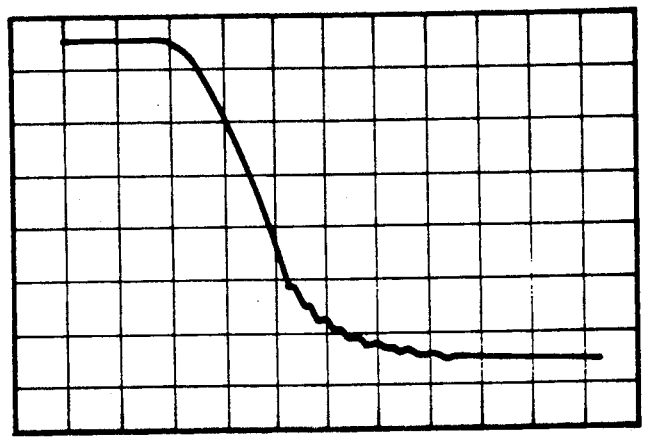

FIG. 8B illustrates the tune voltage to the VCO 60' (output of the lag-lead network 64') with the phase-lock loop stability enhancement circuit 66. Note that there are several cycles of under- and overshoot before the voltage stabilizes. The undershoot quickly discharges the lag-lead capacitor 64A', while the overshoot voltage has minimal charging effect. This can be seen in FIG. 8C. The change in capacitor voltage versus time is very steep during the discharge period, while the slope is almost flat during the charging period. This cycling repeats until the voltage across the lag-lead capacitor 64A' (and, hence, the output voltage of the lag-lead network 64') converges to the target value. What appears as instability at first glance is actually quite stable on closer inspection. The turn-on voltage of the zener diode 66A determines the hysteresis of the phase-lock loop of the low-frequency synthesizer 16'.

The phase-lock loop stability enhancement circuit 66 greatly improves phase-lock loop transient response time. When used with a type III phase-lock loop with lag-lead network 64' to improve VCO phase noise, it minimizes loop instability (ringing and oscillation) by preventing loop saturation.

Figure 9A:
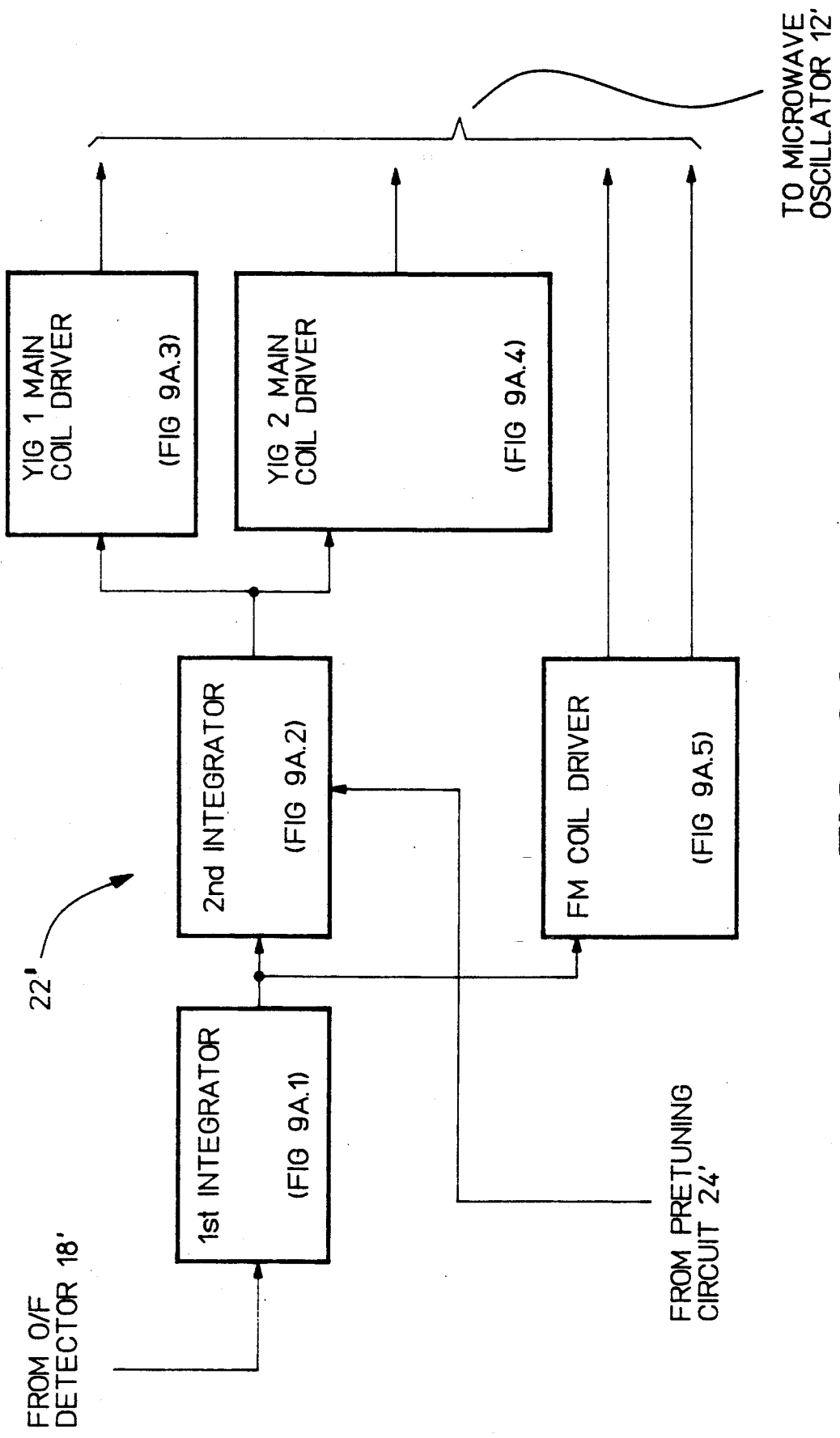
FIG. 9, comprising FIGS. 9A.1-9A.5, 9B.1, 9B.2, 9C and 9D, are schematic diagrams for implementation of various circuits of the swept synthesized source shown in FIG. 4.
Figure 9C:
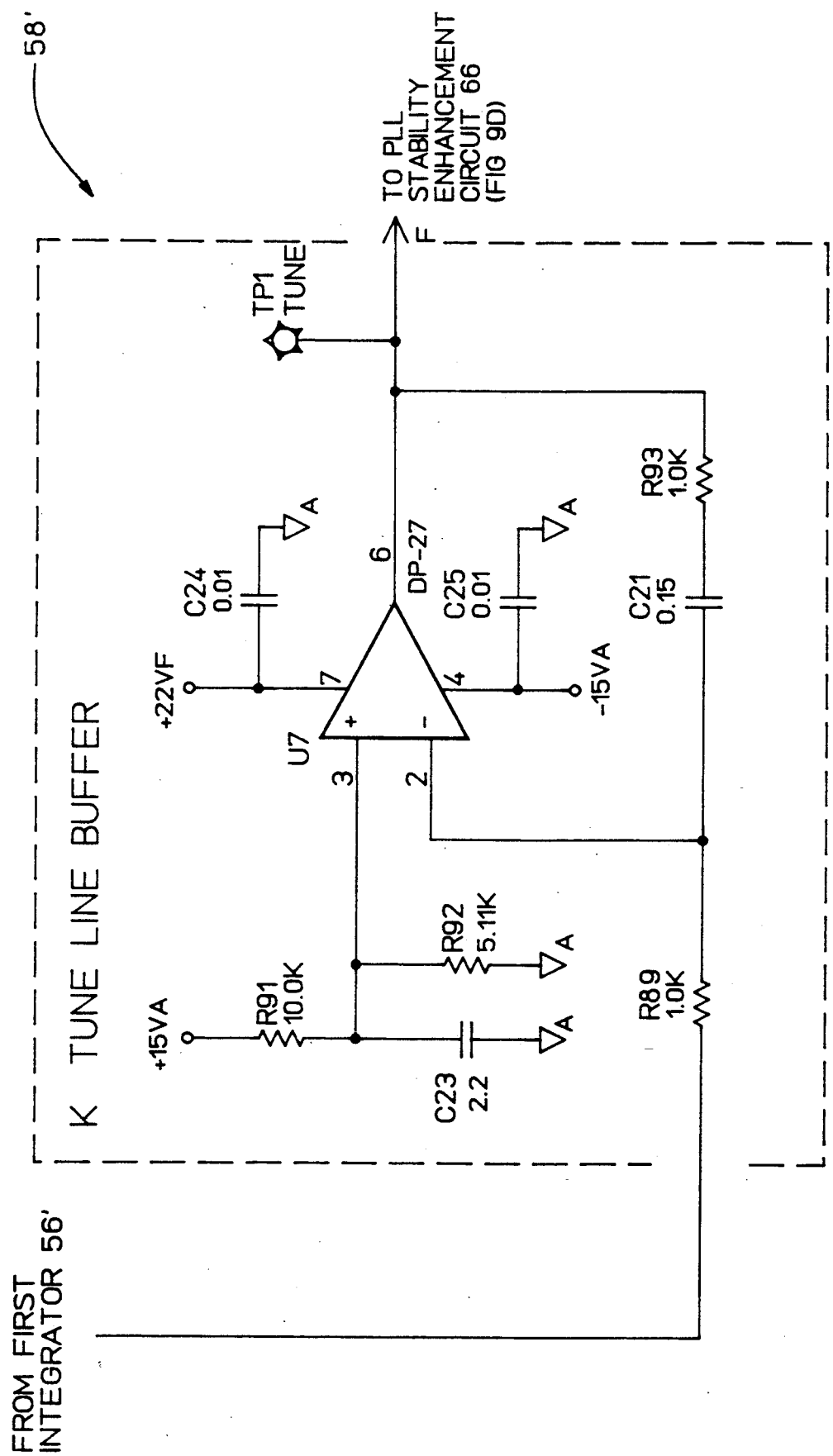
Figure 9D:
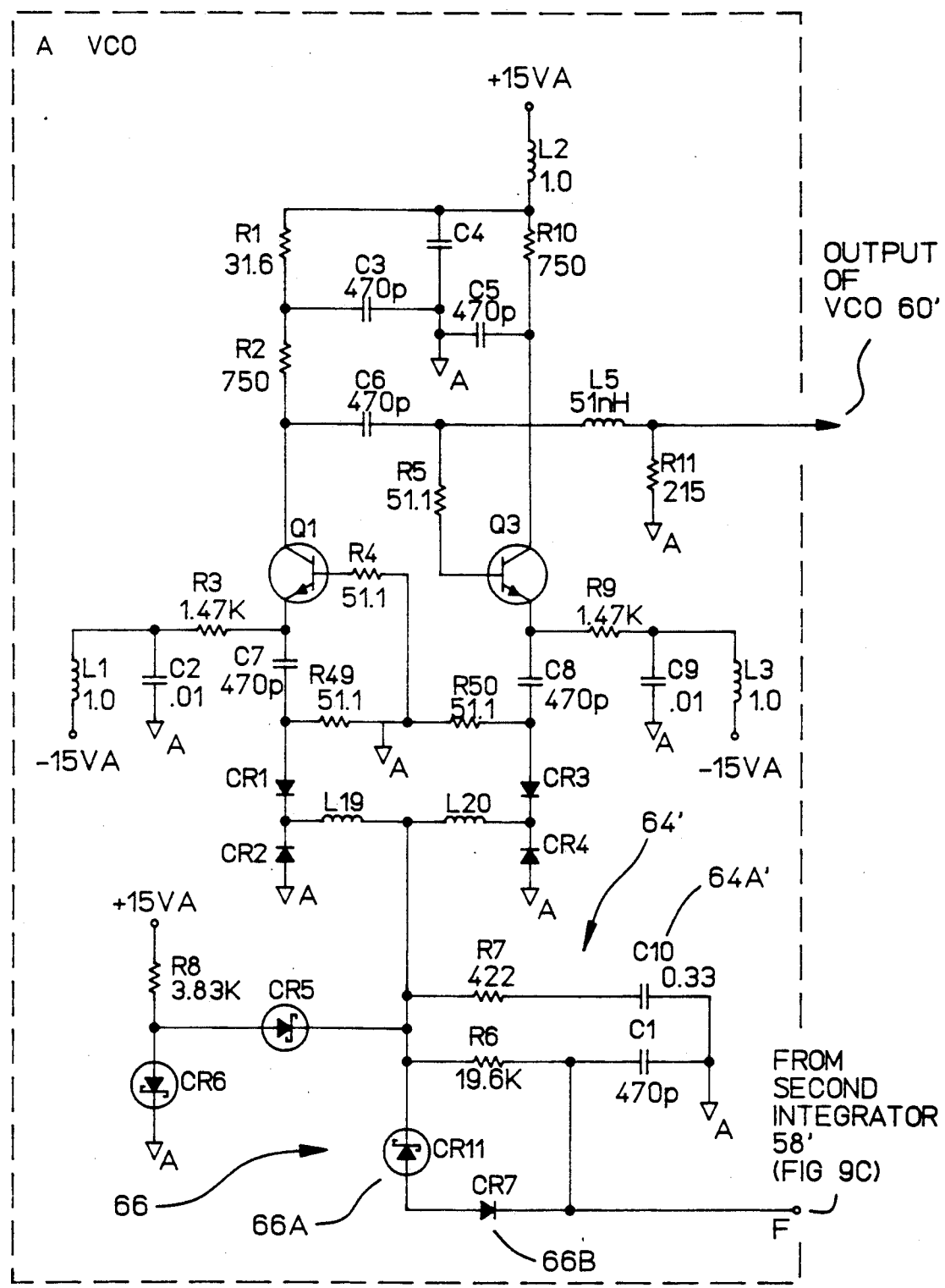

The embodiment of the swept synthesized source 10' shown in FIG. 4, including the low-frequency synthesizer 16' having the phase-lock loop stability enhancement circuit 66 shown in FIG. 7, can be implemented through modifications to a commercially available Model HP 8720B network analyzer available from Hewlett-Packard Company, Palo Alto, Calif. In the Model HP 8720B, the low-frequency synthesizer 16' is a fractional-n synthesizer. The needed modifications to the circuit of the Model HP 8720B are shown in the schematic circuit diagrams of FIGS. 9A-9D. Specifically, FIG. 9A shows an implementation of the loop filter/signal conditioning circuit 22' comprising a "1st INTEGRATOR" and a "2nd INTEGRATOR." The switch 26' preferably incorporates the added circuit which appears at the output of the 1st INTEGRATOR. The values of the components which comprise the 2nd INTEGRATOR in the Model HP 8720B have also been modified to the values shown in FIG. 9A, which facilitates implementation of the added track and hold circuit 30. Finally, the values of the components which comprise the "YIG 1 MAIN COIL DRIVER," "YIG 2 MAIN COIL DRIVER," and "FM COIL DRIVER" of the microwave oscillator 12' have also been modified to the values shown in FIG. 9A from the values of the components in the Model HP 8720B. As shown in FIG. 9B, the phase/frequency detector 54' is modified from that in the Model HP 8720B to provide detection of bidirectional, as opposed to only unidirectional, shifts in the frequency output of the sampler 14'. FIG. 9C shows the second integrator 58' added to the circuit of the Model HP 8720B at the output of the integrator resident in the previous circuit. Finally, FIG. 9D shows the lag-lead network/phase-lock loop stability enhancement circuit 64', 66 added to the circuit of the Model HP 8720B between the added second integrator 58' and the VCO resident in the previous circuit. The internal frequency counter 15, internal voltage comparator 19, and internal voltmeter 25 shown in FIG. 4 are presently resident in the circuit of the Model HP 8720B.

Finally, Appendices A-D comprise a source code listing of the firmware executed by the controller 28'. Appendix A is the firmware which controls phase locking of the swept synthesized source 10'. Appendix B is the firmware which controls the DAC of the pretuning circuit 24'. Appendix C is the firmware for controlling operation of the low-frequency synthesizer 16'. Finally, Appendix D is the firmware for the pretune calibration method in accordance with the embodiment of the invention shown in FIGS. 6A–6C.

Accordingly, the present invention provides a low-frequency synthesizer which has improved transient response and stability of the phase-lock loop of the low-frequency synthesizer. It also provides a low-frequency synthesizer for a swept synthesized source to yield a swept synthesized source having improved frequency accuracy and reduced phase noise over a broad range of operating frequencies.

The foregoing description is offered primarily for purposes of illustration. While a variety of embodiments of a swept synthesized source has been disclosed, it will be readily apparent to those skilled in the art that numerous other modifications and variations not mentioned above can still be made without departing from the spirit and scope of the invention as claimed below.

APPENDIX A

```
M68KL,P,"phlock"
BEGIN include "fmenu2.h";      & h_set                                                      &
include "fstimul4.h";    & ch_freq_at_mpt                                             &
#include "fpmcal.h";      & setup_pmcal, pm_clean_swp                                  &
#include "cstim.h";       & Cdotrig, Cmode_TR                                          &
#include "fmain.h";       & drop_priority                                              &
#include "cmessag0.h";    & pmcal_done_cal, measuring_pm                               &
#include "fdif.h";        & abus_voltage                                               &
#include "fmemmgr4.h";    & mem_id_addr                                                &
    & cmemmgr.h                   ---- NO LABELS USED FROM THIS FILE ----              &
    & cmemmgr2.h           stim_list_1, stim_list_2                                    &
#include "ciolp.h";       & pl_lk_ind_reset                                            &
    & ciodif2.h            dif_status                                                  &
    & fiodif2.h                   ---- NO LABELS USED FROM THIS FILE ----              &
#include "fiocnfig.h";    & cpu_test_port                                              &
#include "cmsgbrk.h";     & phase_lock_fail                                            &
#include "futil2.h";      & clr_msg                                                    &
#include "futil3.h";      & warn                                                       &
#include "futil4.h";      & comp_tell                                                  &
    & cutil.h                     ---- NO LABELS USED FROM THIS FILE ----              &
#include "ffmt.h";        & fmt_int                                                    &
#include "cmsgserv.h";    & pll_pretune, pll_acquire, pll_track, pll_sweep             &
#include "fkernel5.h";    & preempt, wait                                              &
#include "fstring.h";     & i_str, app_str                                             &
#include "fcont2.h";      & restart_cont, curr_meas_swp, acq_param                     &
                          & check_swp_brk, clrout_swp_brk                              &
#include "fdirty.h";      & dirty                                                      &
#include "cchtabl1.h";    & hd_pm_valid                                                &
#include "fchtab2.h";     & ch_real                                                    &
#include "fchtab4.h";     & ch_bit, e_ch_bit                                           &
#include "fswptbl1.h";    & dirty_flag                                                 &
#include "fswptbl.h";     & swp_tbl_build, i_swp_tbl_ptrs                              &
COMMENT                     set_int_ptr_to_subswp, set_quad_ptr_tc_subswp
                            num_swp_tbl_subswps, swp_type, first_swp_ch
                            last_swp_ch, time_btwn_pts, vtc_harm_table
                            swp_tbl_quad_ptr, swp_tbl_bcdl_ptr
                            swp_tbl_int_ptr, fst_tm                                    ;
#include "cswptbl.h";     & num_points_in_subswp, band, pretune_value                  &
                          & ref_dac_value, stepped_subswp, fn_start, fn_step           &
                          & fn_stop, fn_increment, num_10us_steps, table_list          &
#include "cabus.h";       & low_res, aux_out_off, pl_pretune_dac                       &
#include "fabus2.h";      & sel_abus_ch, count, restore_abus                           &
```

```
#include "fpretcal.h";  & pret_cal, defer_cal, cal_reqd                              &
#include "fpll.h";      & pl_set_cont, pl_set_pretune_dac                            &
#include "cfracn1.h";   & fn_load_r1, fn_load_r2, fn_r2_to_r3, high, low             &
#include "ffracn1.h";   & fn_instruction, fn_wrt, fn_set_swp, fn_start_swp           &
                        & fn_start_swp_dn, fn_set_cw, rst_lswp                       &
#include "fsource.h";   & set_src_power, set_atten, set_src_range                    &
                        & rf_blank                                                   &
#include "cchtabl2.h";  & ch_start_power, ch_power_span, ch_power_span               &
                        & ch_source_power, ch_source_power                           &
 & cchconst.h                     ---- NO LABELS USED FROM THIS FILE ----            &
#include "ccontrol.h";  & ignore_swp_brk                                             &
#include "fcontrol.h";  & abort_cont                                                 &
#include "fcontv4.h";   & first_acq_loop, last_acq_loop, pset_up_param               &
 & ccontv4.h                      ---- NO LABELS USED FROM THIS FILE ----            &
#include "fdownld1.h";  & take_meas                                                  &
#include "fdownld5.h";  & fast_take_meas, wait_for_320                               &
#include "freceiv3.h";  & cntrl_wait                                                 &
#include "fsize.h";     & num_pts, num_mpts                                          &
#include "fterm.h";     & CRLF, WSTR                                                 &
#include "fterm3.h";    & WNUM                                                       &
#include "cdebugc2.h";  & lock_debug                                                 &
#include "crins.h";     & pll_pause_cont                                             &
#include "csrvc.h";     & Cfracn_tune, Cpll_auto, Cpll_diag, Csweep_pause            &
                        & Csrc_tune_off                                              &
#include "ftms3201.h";  & allow_ovrld                                                &
#include "cpll.h";      & pretune_yig1, acquire_yig1, track_yig1, hold_yig1          &
                        & yigs_off                                                   &

EXTERNAL QUAD TABLE max_fn_inc_per_10us.L;  &sswptbl&

EXTERNAL BOOLEAN abus_on,             & ** used to see if abus is on ** &
                 error_free_ths_grp,  & ** in SCONTROL ** &
                 error_free_last_grp; & ** in SCONTROL ** &

GLOBAL INTEGER subswp;
GLOBAL BOOLEAN ARRAY manswp[1:2],
                     pmcal_swp[1:2],
                     pmcal_on[1:2];

GLOBAL BOOLEAN 1st_m_lb, pm_cal, pm_cal_swp;

& ********** Local globals ********** &

BOOLEAN failure, tuned_rec;

INTEGER pll_seq, swp_pt_num;

BOOLEAN CONSTANT no_check   := FALSE,
                 on         := TRUE,
                 off        := FALSE,
                 include_if := TRUE,
                 exclude_if := FALSE,
                 yig1_range := TRUE,
                 yig2_range := FALSE,
                 do_new_subswp_setup := TRUE,
                 no_new_subswp_setup := FALSE;

INTEGER CONSTANT all_bands := 7, acquire_wait    :=    1,   &  10 us  &
                 track_wait      :=   50,   &  50 us  &
                 acq_wait        :=  100,   & **  1 ms ** &
                 fn_settle       :=  100,   & **  1 ms ** &
                 fn_retrace_wait :=  300,   & **  3 ms ** &
                 pretune_wait    := 3500,   &  35 ms  & band_1  :=  1,
                 band_4  :=  4,
                 band_8  :=  8,
                 band_9  :=  9,
                 band_12 := 12, pretune_seq := 0,
                 acquire_seq := 1,
                 track_seq   := 2,
```

```
                sweep_seq      := 3;

QUAD CONSTANT    quad_100kz     := 100000,
                 accuracy_factor := 10000000,
                 C_10Hz         := 100000000,        & ** in 100nHz ** &
                 C_10MHZ        := 100000000000000;

REAL CONSTANT    no_delay_time := 0,
                 relock_time   := 10e-3;

INTEGER TABLE    pll_msg.L := pll_pretune,
                              pll_acquire,
                              pll_track,
                              pll_sweep;

& ** IF modified THEN also update QUAD table in swptbl.s ** &
BCDL TABLE fn_start_min.L :=              0,    & Band  0 (placeholder) &
                            299000000000000,    & Band  1 &
                            300000000000000,    & Band  2 &
                            300000000000000,    & Band  3 &
                            380000000000000,    & Band  4 &
                            334000000000000,    & Band  5 &
                            348750000000000,    & Band  6 &
                            373333333333333,    & Band  7 &
                            300000000000000,    & Band  8 &
                            307777777777778,    & Band  9 &
                            339051724137931,    & Band 10 &
                            387411764705882,    & Band 11 &
                            437723214285714,    & Band 12 &
                            366220238095238;    & Band 13 &

BCDL TABLE fn_stop_or.L :=                0,    & Band  0 (placeholder) &
                            600000000000000,    & Band  1 &
                            600000000000000,    & Band  2 &
                            570000000000000,    & Band  3 &
                            556666666666667,    & Band  4 &
                            558000000000000,    & Band  5 &
                            560000000000000,    & Band  6 &
                            543333333333333,    & Band  7 &
                            554000000000000,    & Band  8 &
                            546250000000000,    & Band  9 &
                            567758620689655,    & Band 10 &
                            594411764705882,    & Band 11 &
                            549330357142857,    & Band 12 &
                            598363095238095;    & Band 13 &

BCDL TABLE fn_mid_start.L :=              0,    & Band  0 (placeholder) &
                            482500000000000,    & Band  1 &
                            490000000000000,    & Band  2 &
                            505000000000000,    & Band  3 &
                            532000000000000,    & Band  4 &
                            310277777777778,    & Band  5 &
                            341388888888889,    & Band  6 &
                            388333333333333;    & Band  7 &

BCDL TABLE max_fn_inc_dwn.L :=            0,    & Band  0 (placeholder) &
       & ** 100 GHz/s ** &    200000000000,    & Band  1 &
                              200000000000,    & Band  2 &
                              200000000000,    & Band  3 &
                              200000000000,    & Band  4 &
                              200000000000,    & Band  5 &
                              200000000000,    & Band  6 &
                              200000000000,    & Band  7 &
                              125000000000,    & Band  8 &
                               69444444444,    & Band  9 &
                               43100000000,    & Band 10 &
                               29410000000,    & Band 11 &
                               22320000000,    & Band 12 &
                               14880000000;    & Band 13 &
```

```
COMMENT
*************************************************************************
* SPECIFICATION FOR  wait_fracn
*
* FUNCTION: Waits for the frac-N to finish sweeping.  Includes time
*           for loop to settle after sweep.
*************************************************************************
;
PROCEDURE wait_fracn;
BEGIN
  INTEGER counter;

cntrl_wait(20);  & ** 200 us ** &

& ** wait until we are done sweeping ** &
  counter := 0;
  WHILE (dif_status AND %80) = 0 AND (counter < 10000) DO
    BEGIN
      cntrl_wait(1);
      counter := counter + 1;
    END;

cntrl_wait(fn_settle);

END wait_fracn;

COMMENT
*************************************************************************
* SPECIFICATION FOR  tell_pll_status
*
* FUNCTION: Creates a string which tells what the phaselock status is.
*************************************************************************
;
PROCEDURE tell_pll_status;
BEGIN
  DOUBLE CONSTANT fix_int_format := %01000300;           & 17001400 &
  INTEGER CONSTANT int_string_size := 3,                 & 01000600 &
                   fmt_string_size := 9;                 & 01000000 &
  BYTE ARRAY integer_array [-1:int_string_size],
             fmt_array     [-1:fmt_string_size];
  ALPHA      integer_string,
             fmt_string;

integer_string := ADRS (integer_array);
  fmt_string     := ADRS (fmt_array);
  i_str (integer_string, int_string_size);
  i_str (fmt_string, fmt_string_size);

app_str (fmt_string, "C");
  app_str (fmt_string,
           fmt_int (curr_meas_swp, integer_string, fix_int_format));
  app_str (fmt_string, " - B");
  app_str (fmt_string, fmt_int( swp_tbl_int_ptr[band], integer_string,
                        fix_int_format));
  comp_tell (fmt_string, pll_msg [pll_seq]);

END tell_pll_status;

COMMENT
*************************************************************************
*           SPECIFICATION FOR  check_if_cal_reqd
*
* FUNCTION: Check if pretune calibration is required.
*************************************************************************
;
```

```
PROCEDURE check_if_cal_reqd;
BEGIN
  INTEGER channel;

IF cal_reqd
     AND  e_ch_bit (Cpll_auto)          & ** auto cal is on         ** &
     AND  (NOT e_ch_bit(Cmode_TR) )     & ** NOT tuned receiver     ** &
     AND  (pret_cal <> all_bands)       & ** TRUE IF not failure    ** &
                                        & **   in all bands.        ** &
                         THEN &  If got this far then pretune values were updated.  &
     &  Rebuild sweep table                                &
     FOR channel := first_swp_ch UNTIL last_swp_ch DO
       swp_tbl_build(channel);

END check_if_cal_reqd;

COMMENT
***********************************************************************
* EXTERNAL SPECIFICATION FOR  clr_all_phlk_msgs
*
* FUNCTION: Clears all phaselock related error messages.
*           It is used in SCONTROL.
*
*    INTERNAL USE:   NONE
*    EXTERNAL USE:   scontrol
*    COMMENTS:  move to SCONTROL?  Only need to clear phase_lock_fail.
***********************************************************************
;
SUBROUTINE clr_all_phlk_msgs;                       ENTRY;
BEGIN
  clr_msg(phase_lock_fail);  & ** Phase lock failure ** &
END clr_all_phlk_msgs;

COMMENT
***********************************************************************
* SPECIFICATION FOR  pll_service_wait
*
* FUNCTION: Delays sweep steps for troubleshooting.  If "pause" function
*           is on, delays until turned off.  Currently, brk_fifo is not
*           being watched, so updates to ch_tbls will not cause this
*           indefinite wait to be exited.
***********************************************************************
;
PROCEDURE pll_service_wait;
BEGIN
  INTEGER CONSTANT long_wait_time := 32000;  &  320 ms  & count(curr_meas_swp);  &  abus count  &
  IF e_ch_bit(Cpll_diag) THEN
    BEGIN  & ** diagnostics on ** &
      clr_msg(phase_lock_fail);
      tell_pll_status;
      IF pll_seq <> sweep_seq THEN & ** don't extend sweep step times *&
        BEGIN
          REPEAT 3 DO
            cntrl_wait (long_wait_time);
          IF failure THEN
            BEGIN  & ** display phase lock failure message ** &
              warn(phase_lock_fail);
              REPEAT 3 DO
                cntrl_wait (long_wait_time);
            END;   & ** display phase lock failure message ** &
          preempt;  & ** to allow any pending commands to be done ** &
        END;
```

```
        IF e_ch_bit (Csweep_pause) THEN
          BEGIN
            tell_pll_status;
            wait(pll_pause_cont);
COMMENT
              ** had problems when command process waits for abort sweep **
              ** when in pll pause.  Now after wait is done ensure that  **
              ** pause is turned off as return from wait may be due to   **
              ** wake_control versus user shutting off pll pause.        **;
            h_set (0, Csweep_pause);
          END;
      END;   & ** diagnostics on ** &

END pll_service_wait;

COMMENT
*********************************************************************
* EXTERNAL SPECIFICATION FOR take_data
*
* FUNCTION: Starts the data taking for a subsweep (or single point)
*           and waits for a fifo sweep break to determine the status of
*           measurement.
*
* INPUT: delay_time: REAL number of the delay required before
*                    data taking begins.
*
* prepare_next_subswp:
*                    Tells tms320 whether this is the last point
*                    in a stepped subsweep or a swept subsweep. This
*                    allows him to prepare for the next subsweep while
*                    I am preparing the phaselock for the next subsweep.
*********************************************************************
;
PROCEDURE take_data(delay_time, prepare_next_subswp, chan);
VALUE delay_time, prepare_next_subswp, chan;
REAL delay_time;
BOOLEAN prepare_next_subswp;
INTEGER chan;
BEGIN
   INTEGER brk_status;
   BOOLEAN no_brk;
     take_meas(delay_time, prepare_next_subswp);
     no_brk := (NOT abort_cont) AND (NOT restart_cont);
     WHILE no_brk DO
       BEGIN  & ** WHILE no_brk ** &
         brk_status := check_swp_brk(chan);
         IF ((brk_status = ignore_swp_brk) AND
                    ( (NOT abort_cont) AND (NOT restart_cont))) THEN
            BEGIN &  do nothing  & END
         ELSE
            no_brk := FALSE;
       END;   & ** WHILE no_brk **&

END take_data;

COMMENT
*********************************************************************
*  If in manual trigger on point, then wait here until triggered.    *
*********************************************************************
;
PROCEDURE wait_pl_trig(chan);
VALUE chan;
INTEGER chan;
BEGIN
```

```
          INTEGER brk_status;
          BOOLEAN no_brk;

IF ch_bit(Cdctrig, chan) THEN
             BEGIN & ** manual trigger on point ** &
                clrout_swp_brk(chan);
                no_brk := (NOT abort_cont) AND (NOT restart_cont);

WHILE no_brk DO
                   BEGIN & **  WHILE no_brk ** &
                      manswp[chan] := TRUE;
                      brk_status := check_swp_brk(chan);
                      IF ((brk_status = ignore_swp_brk) AND
                         ( (NOT abort_cont) AND (NOT restart_cont))) THEN
                         BEGIN &  do nothing  & END
                      ELSE
                         no_brk := FALSE;

END; & **  WHILE no_brk ** &

END;   &  manual trigger on point  & manswp[chan] := FALSE;

END wait_pl_trig;

COMMENT
       ********************************************************************
       * SPECIFICATION FOR loop_unlocked
       *
       * Checks the lock indicator on the phaselock board to determine if the
       * loop has lost lock.  Has logic to set a bit used in error message
       * control.  "phase lock lost" error message is display if appropriate.
       *
       * Sets the local global BOOLEAN "failure" if not locked up.
       ********************************************************************
       ;
       PROCEDURE loop_unlocked(string);
       VALUE string;
       ALPHA string;
       BEGIN
          IF TBIT(cpu_test_port,3) <> 0 THEN & ** unlk status bit on cpu ** &
             BEGIN  & ** not locked ** &
                & ** flag SCONTROL that an error occured this group ** &
                error_free_ths_grp := FALSE;
                failure := TRUE;

COMMENT
                   ** Do NOT display phase lock failure message if this sweep  **
                   ** was aborted OR restarted, OR if in diagnostics, frac N   **
                   ** tune, source tune, OR tuned receiver modes.  Will        **
                   ** display warning in pll_service_wait if in diagnostics.   **
                   ;
                IF NOT (   abort_cont
                        OR restart_cont
                        OR e_ch_bit(Cpll_diag)
                        OR e_ch_bit(Cfracn_tune)
                        OR (NOT e_ch_bit(Csrc_tune_off)) ) THEN
                   BEGIN
                      warn(phase_lock_fail);

IF lock_debug THEN                              &debug&
                         BEGIN & ** loop unlocked message ** &        &debug&
                            WSTR(string);                             &debug&
                            WNUM(swp_tbl_int_ptr[band]);CRLF;         &debug&
                         END;  & ** loop unlocked message ** &        &debug&
                   END;
```

```
      END  & ** not locked ** &

ELSE & ** loop locked ** &
      failure := FALSE;

END loop_unlocked;

COMMENT
**********************************************************************
* EXTERNAL SPECIFICATION FOR  loop_false_locked
*
* FUNCTION:   Determines if the phase lock loop may be false locked.
*             It accomplishes this by comparing the 0.5V/GHz line at
*             pretune, and again at lock.  Since 0.5mv approx. = 1 MHz,
*             I can quickly tell if we may be false locked.
*
*    Since this procedure can determine the frequency difference between
*    pretune and lock frequencies (albeit indirectly), it can use this
*    information to dynamically update the pretune DAC values (as stored
*    in the sweep table) to those which give an optimal pretune-lock
*    frequency difference.  This is accomplished by using the frequency
*    difference between pretune and lock as feedback, modifying the
*    adaptive DAC value so that an optimal difference (about 10 MHz)
*    is obtained the next time this subswp is pretuned. This allows the
*    instrument to track the pretune DAC-to-source-frequency variations
*    without having to do a pretune calibration (and the subsequent
*    rebuilding of the sweep tables) between sweeps.  Each subsweep has
*    two DAC values stored in the sweep table.  The first is called
*    pretune_value and is the adaptive DAC value discussed above.  The
*    other is called ref_dac_value and is the original DAC value computed
*    at the time the sweep table was built.  This routine compares the
*    difference between these two values and thus can sense how much the
*    instrument pretune frequency has drifted.  If the difference between
*    the pretune_value and ref_dac_value is greater than 13 units
*    (~32 MHz), a pretune calibration is probably required prior to the
*    next sweep table build.  Therefore the defer_cal flag is set to flag
*    SWPTBL that a pretune calibration is required prior to computing the
*    DAC values for a brand new sweep.  This will ensure that the new
*    sweep table will be built using updated pretune slope/offset values.
*
* PARAMETER DESCRIPTION:
*
*    INPUT:  pret volt:    REAL that gives the value of the
*                          0.5V/GHz line at pretune.
*
*    OUTPUT: Returns BOOLEAN:
*
*            FALSE:  lock ok, pretuned within proper range and no
*                    possible false lock detected.
*
*             TRUE:  possible false lock, pretuned such that difference
*                    in 0.5V/GHz between pretune and lock indicates that
*                    may possibly have locked to wrong harmonic.
*
*         defer_cal: This is set if we have locked succesfully
*                    but have either drifted significantly from
*                    the orignal DAC values entered into the sweep
*                    table, or required two attempts at lock in
*                    order to obtain a good (i.e. no false lock) lock.
*
*    COMMENTS: I assume that the abus has been selected to read
*              the 0.5V/GHz line.
**********************************************************************
;
```

```
BOOLEAN PROCEDURE loop_false_locked(pret_volt);
VALUE pret_volt;
REAL pret_volt;
BEGIN COMMENT
     The ABUS returns a REAL value for the  0.25V/GHz line.  To   
     speed this routine up the REAL values from ABUS are converted 
     to INTEGER.  This is done by doing a REAL multiply by -4000  
     and storing the result in as INTEGER.  The least significant 
     bit of this result corresponds to 0.25 mV on the 0.25V/GHz   
                                                                  
                  One DAC unit => -2.442 MHz                      
;
    INTEGER lock_volt, difference, int_pret_volt;
    INTEGER CONSTANT ave_volt_per_unit := 2,  & **  -1.2 mV/2 * 4000  ** &
                                              &  /2 from DAC output  &
                                              &  (0.5V/GHz)/2        & target := 10; & ** 10 MHz optimum pret/lock difference&
                                  &    0.25V/GHz = 4 GHz/V           &
                                  & **   4 GHz/V  = 4000 MHz/V        ** &
                                  & **   10 MHz => 0.0025 V           ** &
                                  & **   0.0025 * 4000 = 10           ** & int_pret_volt := INTEGER(4000.0 * pret_volt);
    lock_volt := INTEGER(4000.0 * abus_voltage(10, low_res) );
    difference := lock_volt - int_pret_volt ;
    & ** Only restore abus if needed as it requires 5ms ** &
    IF abus_on THEN restore_abus;

COMMENT
    ** Check to see if pretuning in proper range.  Adjust DAC value  **
    ** if necessary, ELSE if too far out then flag this condition    **
;
              &(40 MHz)        (pretuned above)&
    IF difference > 40 OR difference < 0 THEN
       loop_false_locked := TRUE     & ** pretuned out of range ** &
    ELSE
       BEGIN & ** pretuned in range ** &
         loop_false_locked := FALSE;

& ** Dynamically adjust pretune DAC value in sweep table ** &
         swp_tbl_int_ptr[pretune_value] :=  swp_tbl_int_ptr[pretune_value]
                            + (difference - target)/ave_volt_per_unit;
COMMENT
        ** IF dynamic DAC value and sweep table reference DAC value   **
        ** are significantly different, set the defer_cal flag to     **
        ** indicate a pretune cal is required prior to the next sweep **
        ** table build.  This defers calibration until a stimulus     **
        ** parameter is changed.                                      **
;
       IF ABS(swp_tbl_int_ptr[pretune_value]
           - swp_tbl_int_ptr[ref_dac_value]) > 13 & ** ~32 MHz ** & THEN
          defer_cal := TRUE;

END;   & ** pretuned in range ** &

END loop_false_locked;
```

```
COMMENT
****************************************************************
* SPECIFICATION FOR sweep_to_freq
*
* Function: Assumes locked up in start_band at fn_freq1.  Sweep up to
*           fn_freq2 in stop_band.
*
*           Assumes (no error checking) start_band and stop_band are
*           within the same range (low, mid or high band).  Also
*           fn_freq1 < fn_freq2 if start_band = stop_band.
****************************************************************
;
PROCEDURE sweep_to_freq(start_band, stop_band, fn_freq1, fn_freq2);
VALUE start_band, stop_band, fn_freq1, fn_freq2;
INTEGER start_band, stop_band;
BCDL fn_freq1, fn_freq2;                                    ENTRY;
BEGIN
   INTEGER hold, acquire, track;
   BCDL fn_BCDL1, fn_BCDL2;
   QUAD fn_QUAD1 = fn_BCDL1,
        fn_QUAD2 = fn_BCDL2;

COMMENT
      ** In order to compare two BCDL numbers, I had to create **
      ** four temporary variables.  I set the BCDLs equal to   **
      ** the passed and table frequencies, then do a QUAD      **
      ** comparison on them.                                   **
      ;

#ifdef hp8722a
   IF start_band > 11 THEN
      BEGIN  & ** 20-40 GHz osc ** &
         hold := hold_yig2;
         acquire := acquire_yig2;
         track := track_yig2;
      END    & ** 20-40 GHz osc ** &
   ELSE
#endif
      BEGIN  &  2-20 GHz osc  &
         hold := hold_yig1;
         acquire := acquire_yig1;
         track := track_yig1;
      END;   & ** 2-20 GHz osc ** &

WHILE (start_band <> stop_band) DO
      BEGIN  &  skip band loop  & fn_BCDL1 := fn_freq1;
         fn_BCDL2 := fn_stop_or[start_band];

& ** Sweep down rate limited to 100 GHz/s.  Normal up   ** &
            & ** sweep rate caused too high a voltage on the fm coil ** &
            & ** driver and lock was lost.                           ** &

IF fn_QUAD1 < fn_QUAD2 THEN     & ** start freq < stop freq   **
            BEGIN & ** sweep frac-N up ** &
               fn_set_swp(fn_freq1,
                          max_fn_inc_per_10us[start_band],
                          fn_stop_or[start_band],
                          IF start_band = 1 THEN low ELSE high);
               fn_start_swp;
            END
         ELSE
            BEGIN & ** sweep frac-N down ** &
               fn_set_swp(fn_freq1,
                          max_fn_inc_dwn[start_band],
                          fn_stop_or[start_band],
```

```
                    IF start_band = 1 THEN low ELSE high);
        fn_start_swp_dn;
    END;

wait_fracn;                         & ** wait until done sweeping    ** &
        fn_instruction(fn_r2_to_r3);    &  set N.F freq to stop freq    & cntrl_wait(track_wait);         &  wait to settle               & start_band := start_band + 1;   &  bump start_band up           &
        fn_freq1 :=                     &  new start freq               &
            fn_start_min[start_band];
        pl_set_cont(hold);              & ** hold yig at present freq    ** &
        fn_set_cw(fn_freq1, high);      & ** high since not in band 1    ** &
        cntrl_wait(fn_retrace_wait);    & ** wait for N.F to settle      ** &
        pl_set_cont(acquire);           & ** set PLL to acquire          ** &
        cntrl_wait(acq_wait);           & ** wait to settle              ** &
        pl_set_cont(track);             &  set PLL to track             & cntrl_wait(track_wait);         &  wait to settle               & pl_lk_ind_reset := 0;           &  reset lock indicator         &

END;  &  skip band loop  & fn_set_swp(fn_freq1, max_fn_inc_per_10us[stop_band],
               fn_freq2, IF stop_band = 1 THEN low ELSE high);

fn_start_swp;                       & ** sweep frac-N up             ** &
    wait_fracn;                         &  wait until done sweeping     & fn_instruction(fn_r2_to_r3);        &  set N.F freq to stop freq    &
                                        &  check if still locked        & loop_unlocked("LOCK LOST during s-2-f,    band");

END sweep_to_freq;

COMMENT
*******************************************************************************
* SPECIFICATION FOR set_to_lowband
*
* Function: Locks up to the passed N.F freq in stop_band.  Assumes
*           locked up in band 8 at the minimum start freq.  No error
*           checking for violation of these conditions.
*******************************************************************************
;
PROCEDURE set_to_lowband(stop_band, fn_freq);
VALUE stop_band, fn_freq;
INTEGER stop_band;
BCDL fn_freq;
BEGIN &  sweep up from the minimum freq in band 8 up to the YIG 1         &
    &  freq in either band 8 or 9, depending on the final freq          & sweep_to_freq(band_8, IF stop_band <= band_4 THEN band_8 ELSE band_9,
                  fn_start_min[band_8], fn_mid_start[stop_band]);

IF NOT failure THEN
        BEGIN & ** switch to lowband ** &
            pl_set_cont(hold_yig1);     & ** hold yig at present freq    ** &
            set_src_range(band_1);     & ** switch to lowband range      ** &
            fn_set_swp(fn_start_min[stop_band],
```

```
                    max_fn_inc_per_10us[stop_band],
                    fn_freq,
                    IF stop_band = 1 THEN low ELSE high);
        cntrl_wait(fn_retrace_wait);   & ** wait for N.F to settle        ** &
        pl_set_cont(acquire_yig1);     & ** set PLL to acquire             ** &
        cntrl_wait(acq_wait);          & ** wait to settle                 ** &
        pl_set_cont(track_yig1);       & ** set PLL to track               ** &
        cntrl_wait(track_wait);        & ** wait to settle                 ** &
        pl_lk_ind_reset := 0;          & ** reset lock indicator           ** &
        fn_start_swp;                  & ** sweep frac-N up                ** &
        wait_fracn;                    & ** wait until done sweeping       ** &
        fn_instruction(fn_r2_to_r3);   & ** set N.F freq to stop freq      ** &
        loop_unlocked("LOCK LOST during TRACK, s-2-Lband");
    END;   & ** switch to lowband ** &

END set_to_lowband;

COMMENT
*****************************************************************
* SPECIFICATION FOR set_up_pretune_dac
*
* FUNCTION: Sets up the pretune DAC on the phaselock board using the
*           sweep table INTEGER pointer.  This procedure assumes that
*           the pointer is pointing at a valid entry in the sweep
*           table, sets the source to the proper frequency range and
*           turns ALC off.  Includes YIG slewing time delay.
*
*   INPUT:  yig_range to select yig1 or yig2
*           channel for setting source power
*****************************************************************
;
PROCEDURE set_up_pretune_dac(yig_range);
VALUE yig_range;
BOOLEAN yig_range;
BEGIN
  INTEGER CONSTANT slewing_wait := 500; &  5 ms  & ifdef hp8722a
  IF yig_range = yig2_range THEN
    set_src_range(band_12)
  ELSE
#endif
    set_src_range(band_8);

rf_blank(on);                 & ** set ALC to blank RF                ** &
  pl_set_cont(yigs_off);        & ** set main coil current = 0          ** &
  cntrl_wait(slewing_wait);     & ** wait for YIG to slew down          ** &
  pl_set_pretune_dac(swp_tbl_int_ptr[pretune_value]);

#ifdef hp8722a
  IF yig_range = yig2_range THEN
    pl_set_cont(pretune_yig2)
  ELSE
#endif
    pl_set_cont(pretune_yig1);

cntrl_wait(pretune_wait);              & ** wait for YIG to settle ** &
  rf_blank(off);

END set_up_pretune_dac;

COMMENT
*****************************************************************
* SPECIFICATION FOR pretune_and_lock
*
* FUNCTION: Pretunes and locks to the start frequency of the
*           corresponding oscillator.
```

```
*
*           If the first attempt at phaselocking fails, another attempt
*           is made at locking.  The second time through the pretune DAC
*           value is decremented by 6 MHz prior to pretuning as the
*           reason for the bad lock may have been due to pretuning just
*           above the desired lock point.
*
* PARAMETER DESCRIPTION:
*
*  INPUT: yig_range:    BOOLEAN to indicate which oscillator to
*                       lock up.
*
* OUTPUT: Updated as a result of this procedure and loop_false_locked
*         are the two varaibles that are used to trigger a pretune
*         calibration:
*
*  defer_cal: Set if we have locked succesfully but have eiher drifted
*             significantly from the original DAC values entered into
*             the sweep table, or required two attempts at lock in order
*             to obtain a good lock (i.e. no false lock). Triggers a
*             pretune calibration only when a stimulus parameter is
*             changed.
*
*   cal_reqd: Set if we obtained either a false lock or no lock
*             condition.  Cal_reqd triggers a pretune calibration and
*             sweep table build at the end of the current sweep.
*************************************************************************
;
PROCEDURE pretune_and_lock(yig_range, chan);
VALUE yig_range, chan;
BOOLEAN yig_range;
INTEGER chan;
BEGIN BOOLEAN relock_tried, false_lock;
  INTEGER acquire, track;
  REAL pret_volt;

relock_tried := FALSE;        & ** Initialize error control   ** &
  false_lock   := FALSE;        & **    variables               ** &
  failure      := FALSE;

allow_ovrld(FALSE);           &  disable overload check      & ifdef hp8722a
  IF yig_range = yig2_range THEN
    BEGIN  & ** 20-40 osc ** &
      acquire := acquire_yig2;
      track := track_yig2;
      fn_set_cw(fn_start_min[band_12], high);
    END    & ** 20-40 osc ** &
  ELSE
#endif
    BEGIN  & ** 2-20 osc ** &
      acquire := acquire_yig1;
      track := track_yig1;
      fn_set_cw(fn_start_min[band_8], high);
    END;   &  2-20 osc  & set_up_pretune_dac(yig_range);

&  loop attempts to lock twice if first attempt fails  &
  DO
    BEGIN  & ** start of lock loop ** &
        & ** select 0.5/GHz and allow time to settle ** &
      sel_abus_ch(pl_pretune_dac, aux_out_off);
```

```
    IF (failure OR false_lock) THEN
       BEGIN  & ** second attempt at lock ** &
          relock_tried := TRUE;
          false_lock   := FALSE;
          failure      := FALSE;
          swp_tbl_int_ptr[pretune_value] :=
                               swp_tbl_int_ptr[pretune_value] - 3;
          set_up_pretune_dac(yig_range);   & ** pretune YIG ** &

END;    & ** second attempt at lock ** &

& ** now take the abus reading ** &
    pret_volt := abus_voltage(10,low_res);

& ** Only restore abus if needed as it requires 5 ms ** &
    IF abus_on THEN restore_abus;

pll_seq := pretune_seq;
    pll_service_wait;
    pl_set_cont(acquire);

& ** select 0.25V/GHz and allow time to settle ** &
       & ** wait time in sel_abus_ch factored into    ** &
       & ** acquire_wait time                          ** &
       sel_abus_ch(pl_pretune_dac, aux_out_off);
COMMENT
       ** time from pl_set_cont(acquire) to pl_set_cont(track)  **
       ** (without added wait for ALC settling)                 **
       ** is ~3.5 ms. Most of this is from loop_false_locked    **
       ** which is ~2.2 ms. ~1.9 ms is used up in abus_voltage  **
       ** which is called at the start of loop_false_locked.   **;

& ** IF false lock occurred defer_cal is ** &
       & ** set in loop_false_locked.            ** &
       IF loop_false_locked(pret_volt) THEN
          false_lock := TRUE;

pl_lk_ind_reset := 0;       & ** reset lock indicator      ** &
       loop_unlocked("NO LOCK: PRETUNE to ACQUIRE, band");

END    & ** of lock loop ** &
UNTIL ( (NOT failure AND NOT false_lock) OR relock_tried );

pll_seq := acquire_seq;

pll_service_wait;

IF (failure OR false_lock) THEN
   BEGIN   & ** failure OR false_lock ** &
      IF (NOT abort_cont) AND (NOT restart_cont) THEN
         cal_reqd := TRUE;

& ** IF relock tried and lock is still not OK THEN    ** &
      & ** add the two DAC units subtracted earlier.         ** &
      IF relock_tried THEN
         swp_tbl_int_ptr[pretune_value] :=
                              swp_tbl_int_ptr[pretune_value] + 3;
   END     & ** failure OR false_lock ** &
ELSE
   clr_msg(phase_lock_fail); & ** IF locked 2nd time through ** &
                             & ** clear warn from first time ** &
                             & ** failure.                    ** &
pl_set_cont(track);

& ** check if loop remained locked in track mode ** &
loop_unlocked("NO LOCK: A to T,Pret-lock,   band");
pll_seq := track_seq;
```

```
    pll_service_wait;
    allow_ovrld(TRUE);   & ** enable overload check ** &

END pretune_and_lock;

COMMENT
***********************************************************************
* SPECIFICATION FOR list_subsweep
*
* FUNCTION: Performs a table list subsweep
***********************************************************************
;
PROCEDURE list_subsweep(chan);
VALUE chan;
INTEGER chan;
BEGIN
    INTEGER mem_id, num_pts, subswp_pt_num, counter, bandnum;
    QUAD fn_start_freq, fn_stop_freq, fn_incr_freq, num_10us_steps,
        fn_delta;
    BCDL fn_stop_bcdl, fn_incr_bcdl;
    QUAD POINTER list_freq_ptr;

& ** set pointer to start of proper list ** &
    mem_id := IF chan = 1 THEN stim_list_1 ELSE stim_list_2;
    STPNTR(list_freq_ptr, mem_id_addr[mem_id]);

subswp_pt_num := 0;
    bandnum := swp_tbl_int_ptr[band];
    num_pts := swp_tbl_int_ptr[num_points_in_subswp];
    fn_start_freq := ( (list_freq_ptr[swp_pt_num] * accuracy_factor)
                    + C_10MHZ ) /
                    QUAD( vto_harm_table[bandnum] );

WHILE ((subswp_pt_num < num_pts - 1)
            AND (NOT abort_cont) AND (NOT restart_cont)) DO
        BEGIN & ** point loop ** &
            IF pm_cal THEN
                setpm(swp_pt_num, list_freq_ptr[swp_pt_num]);
            wait_pl_trig(chan);
            IF fst_tm[chan] THEN & ** use fast_take_meas ** &
                fast_take_meas(no_delay_time, no_new_subswp_setup)
            ELSE
                take_data(time_btwn_pts[chan], no_new_subswp_setup, chan);

swp_pt_num := swp_pt_num + 1;

COMMENT
    ** 10 Hz is added to fn_stop_freq as frac N only stops sweeping  **
    ** (i.e. adding increments) when frac N stop freq is exceeded.   **
    ** Adding 10 Hz ensures that it will only exceed the desired     **
    ** frac N stop freq by about 10 Hz at the end of the frac N      **
    ** sweep. This makes the settling time for fn_r2_r3 faster and   **
    ** ensures that we won't lose lock.                              **
;
            fn_stop_freq := ( ( (list_freq_ptr[swp_pt_num] * accuracy_factor)
                        + C_10MHZ ) /
                        QUAD( vto_harm_table[bandnum] ) )
                        + C_10Hz;
            fn_stop_bcdl := BCDL(fn_stop_freq);
            fn_delta := fn_stop_freq - fn_start_freq;

IF fn_delta <> 0 THEN
                BEGIN  &  move to next point  & fn_instruction(fn_load_r2);  &  load fn stop freq  &
                    fn_wrt(fn_stop_bcdl);
```

```
        IF fn_delta < max_fn_inc_per_10us[bandnum] THEN

& ** step to next point ** &
            fn_set_cw(fn_stop_bcd1, IF bandnum = 1 THEN low ELSE high)
        ELSE
            BEGIN  &  sweep to next point  & num_10us_steps := 1 + (fn_delta
                                       / max_fn_inc_per_10us[bandnum]);
                fn_incr_freq := fn_delta / num_10us_steps;
                fn_incr_bcdl := BCDL(fn_incr_freq);

fn_instruction(fn_load_r1);  & ** load fn incr freq ** &
                fn_wrt(fn_incr_bcdl);

rst_lswp;
                fn_start_swp;

cntrl_wait(num_10us_steps + 2);
                  & ** Wait until we are actually done sweeping ** &
                counter := 0;
                WHILE (dif_status AND %80) = 0   & ** lswp low ** &
                AND (counter < 10000)   & ** AND have not timed out ** & DO
                    BEGIN
                        cntrl_wait(1);
                        counter := counter + 1;
                    END;

& ** set fn start = present fn stop ** &
                    fn_instruction(fn_r2_to_r3);

END;   & ** sweep to next point ** &

COMMENT     ** IF have not lost lock up until now check to see IF we **
            ** are still locked. Warning message in loop_unlocked   **
            ;
            IF (NOT failure) AND (NOT tuned_rec) THEN
                loop_unlocked("LOCK LOST during TRACK,    band");

END;   &  move to next point  & wait_for_320;    &  wait for 320 data taking to complete  &
        fn_start_freq := fn_stop_freq;
        subswp_pt_num := subswp_pt_num + 1;

END;  & ** point loop ** &

& ** take data for last point ** &

IF pm_cal THEN
        setpm(swp_pt_num, list_freq_ptr[swp_pt_num]);
    wait_pl_trig(chan);
    IF fst_tm[chan] THEN  & ** use fast_take_meas ** &
        fast_take_meas(no_delay_time, do_new_subswp_setup)
    ELSE
        take_data(time_btwn_pts[chan], do_new_subswp_setup, chan);

swp_pt_num := swp_pt_num + 1;

wait_for_320;    & ** wait for 320 data taking to complete ** &

END list_subsweep;
```

```
COMMENT
*******************************************************************
* SPECIFICATION FOR step_subsweep
*
* FUNCTION: Performs a stepped subsweep measurement.
*
* COMMENTS: Most frac-N frequencies in the sweep table are stored as
*           BCDLs. Frac-N requires these be sent as BCDL. In stepped
*           sweep some math must be performed on the frac-N start and
*           stop freqs so these are stored as QUADs. There are no
*           Wheelgol BCDL math routines, nor BCDL to QUAD conversion
*           routines.
*******************************************************************
;
PROCEDURE step_subsweep(chan);
VALUE chan;
INTEGER chan;
BEGIN
  QUAD fn_step_freq, fn_stop_freq;
  BCDL fn_stop_bcdl;
  REAL delay_time, slew_wait;
  INTEGER step_num,
          num_stepped_pnts,
          num_10_us_tics,
          counter;
REAL CONSTANT fn_step_time  := 10@-6,
              settling_time := 0.0;
BOOLEAN zero_span;

num_stepped_pnts := swp_tbl_int_ptr[num_points_in_subswp];

& ** fn_step_freq = step btwn measured frequencies ** &
fn_step_freq := swp_tbl_quad_ptr[fn_step];
IF fn_step_freq = 0 THEN
  zero_span := TRUE
ELSE
  zero_span := FALSE;

IF NOT zero_span THEN
  BEGIN  & ** prepare for sweep up to next point ** &

& ** load increment into fracn ** &
    fn_instruction(fn_load_r1);
    fn_wrt(swp_tbl_bcdl_ptr[fn_increment]);

fn_stop_freq := swp_tbl_quad_ptr[fn_start] + fn_step_freq;
    fn_stop_bcdl := BCDL(fn_stop_freq);

num_10_us_tics := swp_tbl_quad_ptr[num_10us_steps];
    slew_wait := fn_step_time * num_10_us_tics;
  END    & ** prepare for sweep up to next point ** &
ELSE
  slew_wait := 0.0;

& ** determine the delay time required between points ** &
delay_time := time_btwn_pts[chan] - slew_wait;
IF (delay_time <= settling_time) THEN
  delay_time := settling_time;

step_num := 1;
WHILE (step_num <= num_stepped_pnts)
      AND (NOT abort_cont) AND (NOT restart_cont) DO
  BEGIN  & ** main loop ** &
    IF pm_cal THEN
      setpm(swp_pt_num, ch_freq_at_mpt(swp_pt_num, chan) );

IF step_num = num_stepped_pnts THEN
```

```
    BEGIN  & ** take last data point ** &
      wait_pl_trig(chan);
      take_data(delay_time, do_new_subswp_setup, chan)
    END    & ** take last data point ** &
ELSE
  BEGIN    & ** take data and set up for next sweep ** &
    IF zero_span THEN
      BEGIN
        wait_pl_trig(chan);
        take_data(delay_time, no_new_subswp_setup, chan)
      END
    ELSE
      BEGIN  & ** NOT zero span ** &

& ** pre-load frac N stop frequency ** &
        fn_instruction(fn_load_r2);
        fn_wrt(fn_stop_bcdl);
            wait_pl_trig(chan);
            take_data(delay_time, no_new_subswp_setup, chan);

& ** sweep up to next point ** &
        rst_lswp;       & ** reset lswp on frac N board ** &
        fn_start_swp;

& ** compute next frac N stop freq ** &
        fn_stop_freq := fn_stop_freq + fn_step_freq;
        fn_stop_bcdl := BCDL(fn_stop_freq);

& ** Wait until we are actually done sweeping ** &
        counter := 0;
        WHILE (dif_status AND %80) = 0    &  lswp low  &
            AND (counter < 10000) & ** AND have not timed out ** & DO
          BEGIN
            cntrl_wait(1);
            counter := counter + 1;
          END;

& ** make frac N stop freq current start freq ** &
        fn_instruction(fn_r2_to_r3);

END;    & ** NOT zero span ** &

END;    & ** take data and set up for next sweep ** &

& ** IF have not lost lock up until now check to see IF we ** &
      & ** are still locked. Warning message in loop_unlocked   ** &
    IF (NOT failure) AND (NOT tuned_rec) THEN
      loop_unlocked("LOCK LOST during TRACK,      band");

step_num := step_num + 1;
    swp_pt_num := swp_pt_num + 1;

END;  & ** main loop ** &

END step_subsweep;

COMMENT
****************************************************************************
* SPECIFICATION FOR swept_subsweep
*
* FUNCTION: Performs a swept subsweep measurement.
****************************************************************************
;
PROCEDURE swept_subsweep(chan);
VALUE chan;
INTEGER chan;
```

```
BEGIN
  REAL delay_time;

fn_set_swp(swp_tbl_bcdl_ptr[fn_start],
             swp_tbl_bcdl_ptr[fn_increment],
             swp_tbl_bcdl_ptr[fn_stop],
             IF (swp_tbl_int_ptr[band] <> 1) THEN high ELSE low);
  delay_time := time_btwn_pts[chan] - relock_time;
  IF delay_time < 0 THEN
    delay_time := 0;

IF e_ch_bit (Cpll_diag) THEN
    BEGIN
      pll_seq := sweep_seq;
      tell_pll_status;
    END;

take_data(delay_time, do_new_subswp_setup, chan);

fn_instruction(fn_r2_to_r3);   & ** set N.F freq to stop freq ** &

IF (NOT failure) AND (NOT tuned_rec) THEN
    loop_unlocked("LOCK LOST during TRACK,       band");

END swept_subsweep;

COMMENT
****************************************************************
* SPECIFICATION FOR sweep
*
* FUNCTION: Performs all the necessary operations required to
*           implement a multi-band sweep.
****************************************************************
;
PROCEDURE sweep(chan);
VALUE chan;
INTEGER chan;
BEGIN
  BCDL previous_fn_stop;

INTEGER old_range, new_range, sweep_type, subswp_band, previous_band;

INTEGER CONSTANT low_band  := 0,  swept   := 0,
                   mid_band  := 1,  stepped := 1,
                   high_band := 2,  list    := 2,
                   null      := -1;

IF tuned_rec THEN
    BEGIN  &  tuned receiver  &
      rf_blank(on);
      pl_set_cont(yigs_off);
    END    &  tuned receiver  &
  ELSE IF NOT pm_cal THEN
      BEGIN  & ** power meter cal off ** &
        set_atten(chan);
        set_src_power(ch_real(ch_source_power, chan), chan);
      END;   & ** power meter cal off ** &

FOR acq_param := first_acq_loop[chan]
        WHILE (acq_param <= last_acq_loop[chan]) DO
    BEGIN   & ** acquire parameter loop ** &
      pset_up_param(acq_param, chan);
      check_if_cal_reqd;

subswp := 0;                 & ** initialize to 0 ** &
      old_range := null;           & ** initialize to unused constant ** &
```

```
            previous_band := null;       & ** initialize to unused constant ** &
            previous_fn_stop := 0;       & ** initialize to 0                ** &
            swp_pt_num := 0;             & ** initialize sweep point counter ** &

IF swp_type[chan] = table_list THEN
                & ** list sweep ** &
              sweep_type := list
            ELSE
              sweep_type := null;

WHILE ( (subswp < num_swp_tbl_subswps[chan])
                    AND (NOT abort_cont)
                    AND (NOT restart_cont) ) DO
              BEGIN & ** subsweep loop ** &
                set_int_ptr_to_subswp(swp_tbl_int_ptr, subswp, chan);
                set_quad_ptr_to_subswp(swp_tbl_quad_ptr, subswp, chan);
                subswp_band := swp_tbl_int_ptr[band];

IF sweep_type <> list THEN
                  IF swp_tbl_int_ptr[stepped_subswp] THEN
                    sweep_type := stepped
                  ELSE
                    sweep_type := swept;

IF tuned_rec THEN
                  BEGIN  &  tuned receiver  &
                    fn_set_cw(IF sweep_type = stepped THEN
                                BCDL(swp_tbl_quad_ptr[fn_start])
                              ELSE
                                swp_tbl_bcdl_ptr[fn_start],
                              IF subswp_band = 1 THEN low ELSE high);
                    cntrl_wait(fn_retrace_wait);
                  END     & ** tuned receiver ** &
                ELSE
                  BEGIN  &  NOT tuned receiver  &

IF subswp_band <= 7 THEN         & ** set range flag ** &
                      new_range := low_band
#ifdef hp8722a
                    ELSE IF subswp_band > 11 THEN
                      new_range := high_band
#endif
                    ELSE
                      new_range := mid_band;

IF new_range <> old_range THEN
                      BEGIN  & ** set to new range ** &
                        old_range := new_range;
#ifdef hp8722a
                        IF subswp_band > 11 THEN
                          pretune_and_lock(yig2_range, chan)
                        ELSE
#endif
                          pretune_and_lock(yig1_range, chan);
                        IF new_range = low_band THEN
                          set_to_lowband(subswp_band,
                                         IF sweep_type = stepped THEN
                                           BCDL(swp_tbl_quad_ptr[fn_start])
                                         ELSE
                                           swp_tbl_bcdl_ptr[fn_start])
#ifdef hp8722a
                        ELSE IF new_range = high_band THEN
                          sweep_to_freq(band_12, subswp_band,
```

```
                            fn_start_min[band_12],
                            IF sweep_type = stepped THEN
                              BCDL(swp_tbl_quad_ptr[fn_start])
                            ELSE
                              swp_tbl_bcdl_ptr[fn_start])
#endif
                ELSE
                  sweep_to_freq(band_8, subswp_band,
                            fn_start_min[band_8],
                            IF sweep_type = stepped THEN
                              BCDL(swp_tbl_quad_ptr[fn_start])
                            ELSE
                              swp_tbl_bcdl_ptr[fn_start]);
              END    & ** set to new range ** &
            ELSE IF NOT failure THEN
              sweep_to_freq(previous_band, subswp_band,
                            previous_fn_stop,
                            IF sweep_type = stepped THEN
                              BCDL(swp_tbl_quad_ptr[fn_start])
                            ELSE
                              swp_tbl_bcdl_ptr[fn_start]);
          END;    & ** NOT tuned receiver ** &

CASE sweep_type OF
            BEGIN
              swept_subsweep(chan);
              step_subsweep(chan);
              list_subsweep(chan);
            END;

previous_band := subswp_band;
          subswp := subswp + 1;
          IF sweep_type = stepped THEN
            previous_fn_stop := BCDL(swp_tbl_quad_ptr[fn_start] +
                                (swp_tbl_quad_ptr[fn_step] *
                                QUAD(swp_tbl_int_ptr[num_points_in_subswp]
                                    - 1) ) )
          ELSE
            previous_fn_stop := swp_tbl_bcdl_ptr[fn_stop];

END; & ** subsweep loop ** &

END;    & ** acquire parameter loop ** &

END sweep;

COMMENT
************************************************************************
* SPECIFICATION FOR cw
*
* FUNCTION:    performs all of the necessary operations to phase lock the
*              source to a particular frequency and intitiate data taking.
*
* PARAMETER DESCRIPTION:
*
* INPUT: chan = channel sweep table to be used
************************************************************************
;
PROCEDURE cw(chan);
VALUE chan;
INTEGER chan;
BEGIN
   INTEGER subswp_band;

IF tuned_rec THEN
```

```
       BEGIN  & ** tuned receiver ** &
         rf_blank(on);
         pl_set_cont(yigs_off);
       END    &  tuned receiver  &
    ELSE IF ( NOT ch_bit(Cpow_dac, chan) ) AND
             ( NOT pm_cal ) THEN
       BEGIN  & ** NOT tuned receiver OR service test OR pm cal ** &
         set_atten(chan);
         set_src_power(ch_real(ch_source_power, chan), chan);
       END;   & ** NOT tuned receiver OR service test OR pm cal ** &

FOR acq_param := first_acq_loop[chan]
                    WHILE ( (acq_param <= last_acq_loop[chan]) )   DO
  BEGIN  & ** acquisition parameter loop ** &
    pset_up_param(acq_param,chan);
    subswp := 0;

& ** IF frac N OR source tune enabled in service menu    ** &
       & ** THEN don't set up frac N and source                 ** &
    IF   ( NOT ch_bit(Csrc_tune_off,chan)     & ** source tune ON ** &
                                OR ch_bit(Cfracn_tune,chan) )  THEN
       BEGIN
         restore_abus;
         take_data(no_delay_time, do_new_subswp_setup, chan);
       END
    ELSE
       BEGIN   & ** normal cw ** &
         check_if_cal_reqd;
         i_swp_tbl_ptrs(chan);
         lst_m_lb := FALSE;   &  Flag for lowband to tms320  &

& ** IF previously locked for this sweep THEN  ** &
         & ** no need to relock                         ** &
         IF (  first_swp_ch<>last_swp_ch  & ** different sweeps ** &
                      OR
                     (dirty<>0)           & ** first sweep          ** &
                      OR
                    dirty_flag[ chan ]    & ** sweep table rebuild ** &
                                          & ** due to a cal        ** &
                      OR
                 ( TBIT(cpu_test_port,3)  & ** loop unlocked AND    ** &
                   AND (NOT tuned_rec ) ) & ** NOT tuned receiver   ** &
                      OR
              (error_free_last_grp = FALSE) )   THEN BEGIN &  perform pretune/acquire/track sequence  & subswp_band := swp_tbl_int_ptr[band];

IF tuned_rec THEN  &  just set N.F frequency  &
                BEGIN  & ** tuned receiver ** &
                  fn_set_cw(swp_tbl_bcdl_ptr[fn_start],
                                      IF subswp_band = 1 THEN low ELSE high);
                  cntrl wait(fn_retrace_wait);
                END    & ** tuned receiver ** &
              ELSE
                BEGIN  &  NOT tuned receiver  &
                   allow_ovrld(FALSE) ;      & ** disable overload check ** &
#ifdef hp8722a
                   IF subswp_band > 11 THEN
                     pretune_and_lock(yig2_range, chan)
                   ELSE
#endif
                     pretune_and_lock(yig1_range, chan);
                   IF NOT failure THEN
                     IF subswp_band <= 7 THEN &  low band  &
                       set_tc_lowband(subswp_band,
```

```
                                swp_tbl_bcdl_ptr[fn_start])
#ifdef hp8722a
                    ELSE IF subswp_band > 11 THEN   &  20-40 osc  &
                        sweep_to_freq(band_12, subswp_band,
                                      fn_start_min[band_12],
                                      swp_tbl_bcdl_ptr[fn_start])
#endif
                    ELSE &  mid band  &
                        sweep_to_freq(band_8, subswp_band,
                                      fn_start_min[band_8],
                                      swp_tbl_bcdl_ptr[fn_start]);

allow_ovrld(TRUE);       & ** enable overload check ** &
                END;    & ** NOT tuned receiver ** &
            END   & ** perform pretune/acquire/track sequence ** &
        ELSE
            BEGIN
                IF abus_on THEN restore_abus;
                    &  count the abus if it's on  &
                count (curr_meas_swp);
            END;

END;    & ** normal cw ** &

IF pm_cal THEN
            setpm(0, ch_quad(ch_cw_frequency, chan) );

take_data(no_delay_time, do_new_subswp_setup, chan);

END;    & ** acquisition parameter loop ** &

END cw;

COMMENT
************************************************************************
* SPECIFICATION FOR power_swp
*
* FUNCTION:  performs all of the necessary operations to phase lock the
*            source to a particular frequency and intitiate data taking.
*
* PARAMETER DESCRIPTION:
*
* INPUT: chan = channel sweep table to be used
************************************************************************
;
PROCEDURE power_swp(chan);
VALUE chan;
INTEGER chan;
BEGIN
    INTEGER subswp_band;
    INTEGER point_num, num_points;
    BOOLEAN setup_flag_320;
    REAL delay_time, start_power, delta_power, power;
    REAL CONSTANT ave_time_per_pt := 2.5@-3;

num_points := num_mpts[chan] - 1;
    start_power := ch_real(ch_start_power, chan);
    delta_power := ch_real(ch_power_span, chan) / num_points;
    set_src_power(start_power, chan);

IF (delay_time := time_btwn_pts[chan] - ave_time_per_pt) < 0 THEN
        delay_time := 0;

set_atten(chan);
```

```
    FOR acq_param := first_acq_loop[chan]
              WHILE ( (acq_param <= last_acq_loop[chan]) )  DO
    BEGIN  & ** acquisition parameter loop ** &
      pset_up_param(acq_param,chan);
      setup_flag_320 := no_new_subswp_setup;
      subswp := 0;
      check_if_cal_reqd;
      i_swp_tbl_ptrs(chan);
      lst_m_lb := FALSE;   &  Flag for lowband to tms320  &

& ** IF previously locked for this sweep THEN   ** &
        & ** no need to relock                           ** &
        IF ( first_swp_ch<>last_swp_ch   & ** different sweeps ** &
                     OR
                  (dirty <> 0)           & ** first sweep          ** &
                     OR
                dirty_flag[ chan ]   & ** sweep table rebuild ** &
                                     & ** due to a cal         ** &
                     OR
             TBIT(cpu_test_port,3)    & ** loop unlocked AND    ** &
                     OR
             (error_free_last_grp = FALSE) )  THEN BEGIN &  perform pretune/acquire/track sequence  & subswp_band := swp_tbl_int_ptr[band];

allow_ovrld(FALSE);      &  disable overload check  &
#ifdef hp8722a
              IF subswp_band > 11 THEN
                  pretune_and_lock(yig2_range, chan)
              ELSE
#endif
                  pretune_and_lock(yig1_range, chan);
              IF NOT failure THEN
                  IF subswp_band <= 7 THEN &  low band  &
                      set_to_lowband(subswp_band,
                                     swp_tbl_bcdl_ptr[fn_start])
#ifdef hp8722a
              ELSE IF subswp_band > 11 THEN   &  20-40 osc  &
                      sweep_to_freq(band_12, subswp_band,
                                    fn_start_min[band_12],
                                    swp_tbl_bcdl_ptr[fn_start])
#endif
              ELSE &  mid band  &
                      sweep_to_freq(band_8, subswp_band,
                                    fn_start_min[band_8],
                                    swp_tbl_bcdl_ptr[fn_start]);

allow_ovrld(TRUE);       & ** enable overload check ** &
           END   & ** perform pretune/acquire/track sequence ** &
        ELSE
           BEGIN
              IF abus_on THEN restore_abus;
                &  count the abus if it's on  &
              count (curr_meas_swp);
           END;

power := start_power;
        point_num := 0;
        WHILE point_num <= num_points AND
                        (NOT abort_cont) AND (NOT restart_cont) DO
           BEGIN  & ** main point processing loop ** &
              wait_pl_trig(chan);
              IF point_num = num_points THEN
                  setup_flag_320 := do_new_subswp_setup;
```

```
            IF pm_cal THEN
              pwr_swp_set_pm(point_num, power)
            ELSE
              set_src_power(power, chan);

IF fst_tm[chan] THEN & ** use fast_take_meas ** &
              fast_take_meas(no_delay_time, setup_flag_320)
            ELSE
              take_data(delay_time, setup_flag_320, chan);

power := power + delta_power;
            wait_for_320;
            point_num := point_num + 1;

END;   & ** main point processing loop ** &

END;   & ** acquisition parameter loop ** &

END power_swp;

COMMENT
*****************************************************************
* EXTERNAL SPECIFICATION FOR tuned_receiver
*
* FUNCTION: High level procedure that uses the sweep table and the sweep
*           type of the current measurement channel tune the receiver
*           to the appropriate frequency(s).
*
*           This procedure is called by control.s and is in the
*           CONTROL process.
*
*   INPUT: chan = channel to be measured. This determines which sweep
*                 table is to be used for this sweep.
*****************************************************************
;
PROCEDURE tuned_receiver(chan);
VALUE chan;
INTEGER chan;                                                   ENTRY;
BEGIN tuned_rec := TRUE;
  clr_all_phlk_msgs;

CASE swp_type[chan] OF
    BEGIN
      sweep(chan);
      cw(chan);
      cw(chan);         & ** was power sweep in 8753...cw is a dummy ** &
      sweep(chan);
    END;

& ** clear dirty flag for this channel ** &
    dirty_flag[chan] := FALSE;

END tuned_receiver;

COMMENT
*****************************************************************
* EXTERNAL SPECIFICATION FOR network_anal
*
* FUNCTION: High level procedure that uses the sweep table and the sweep
*           type of the current measurement channel to perform all
*           the necessary operations to carry out a full sweep.
*
```

```
*          This procedure is called by SCONTROL and is in the
*          CONTROL process.
*
* PARAMETER DESCRIPTION:
*
*     INPUT: chan = channel to be measured. This determines which sweep
*                   table is to be used for this sweep.
***********************************************************************
;
PROCEDURE network_anal(chan);
VALUE chan;
INTEGER chan;                                                   ENTRY;
BEGIN INTEGER POINTER tptr;

tuned_rec := FALSE;

COMMENT
     ** pm_cal and pm_cal_swp are set/reset at the start of network_anal **
     ** These two GLOBALS are used in phlock and pmcal.  By setting here **
     ** we avoid the problems created by pmcal_on and pmcal_swp flags    **
     ** changing after the start of network_anal.                        **
;
   pm_cal_swp := pmcal_swp[chan];
   pm_cal := pmcal_on[chan] OR pm_cal_swp;
   IF pm_cal_swp THEN
      tell(measuring_pm);
```

APPENDIX B

```
IF pm_cal THEN
   BEGIN
      setup_pmcal(chan);
         & ** set again in case setup_pmcal turns off due to no memory. ** &
      pm_cal := pmcal_on[chan] OR pm_cal_swp;
   END;

pm_clean_swp := TRUE;

CASE swp_type[chan] OF
   BEGIN
      sweep(chan);
      cw(chan);
      power_swp(chan);
      sweep(chan);
   END;

& ** clear dirty flag for this channel ** &
dirty_flag[chan] := FALSE;

IF pm_cal_swp AND pm_clean_swp AND (NOT (abort_cont OR restart_cont)) THEN
   BEGIN  & ** clean power meter cal sweep ** &
      pmcal_valid[chan] := TRUE;
      STPNTR(tptr, old_array);
         & ** set power meter cal array entry for pm valid to TRUE ** &
      IF e_ch_bit(Ccouple_stim) THEN  & ** coupled channels ** &
         BEGIN
            tptr[hd_pm_valid] := -1;   & ** TRUE ** &
            tptr[hd_pm_valid + hd_header_size] := -1;
            pmcal_valid[3 - chan] := TRUE;
         END
      ELSE IF chan = 1 THEN  & ** channel 1 ** &
         tptr[hd_pm_valid] := -1    & ** TRUE ** &
```

```
        ELSE  & ** channel 2 ** &
          tptr[hd_pm_valid + hd_header_size] := -1;

END;   & ** clean power meter cal sweep ** &

IF pm_cal_swp THEN
     BEGIN  & ** power meter cal sweep ** &
       pmcal_swp[chan] := FALSE;
       tell(pmcal_done_cal);
     END;   &  power meter cal sweep  & drop_priority;   &  make sure other processes have a chance  &

END network_anal;

END$

M68KL,P,"pll"
BEGIN include "ciolp.h";   & pl_control, pl_pret_dac_mid, pl_pret_dac_up      &
   & ciodif2.h                  ---- NO LABELS USED FROM THIS FILE ----  &
     & fiodif2.h                ---- NO LABELS USED FROM THIS FILE ----  &
#include "cpll.h";    & pl_control_mask, yigs_off                        &

GLOBAL BYTE pl_cont_v;

COMMENT
************************************************************************
* Basic phase lock control procedure.  Integer passed becomes control
* word, but ABUS is masked and controlled separately.
*
* IF yigs are turned off, also turn off the ALC.
************************************************************************
;
PROCEDURE pl_set_cont (number);
VALUE number;
INTEGER number;                                                  ENTRY;
BEGIN pl_control := pl_cont_v := TURN(pl_cont_v, number, pl_control_mask);

END pl_set_cont;

PROCEDURE pl_set_pretune_dac (number);
VALUE number;
INTEGER number;                                                  ENTRY;
BEGIN
   pl_pret_dac_mid := number;
   pl_pret_dac_up := number := ARIGHT(number, 8);

END pl_set_pretune_dac;

END$

PROCEDURE i_pll;                                                 ENTRY;
  BEGIN
  BYTE CONSTANT pl_control_norm:=%DF;       & pret NA mode &
                                            & wide limiting &
                                            & abus off & pl_control:=pl_cont_v:=pl_control_norm;
  pl_set_pretune_dac (0);
  END i_pll;
```

APPENDIX C

```
M68KL,P,"fracn"
BEGIN include "fterm.h";      & CRLF, WSTR                                        &
include "ciolp.h";      & fracn_chip_control, fracn_chip_eclk, fracn_control &
                         & fracn_status                                      &
     & ciodif2.h                 ---- NO LABELS USED FROM THIS FILE ----     &
      & fiodif2.h                ---- NO LABELS USED FROM THIS FILE ----     &
#include "cfracn.h";     & fracn_control_init, fracn_control_norm            &
                         & fracn_stop_max, fn_noop, fn_load_r1, fn_swp_up    &
                         & fn_swp_dn, fn_set_freq, fn_load_r2, fn_inc_freq   &
                         & fn_dec_ph, high, low                              &
#include "cdebugc2.h";   & driver_debug                                      &

INTEGER PROCEDURE CNV89(B,A); VALUE B;BCDL B;BYTE ARRAY A[*];EXTERNAL;
INTEGER PROCEDURE CNV29(R,A); VALUE R;REAL R;BYTE ARRAY A[*];EXTERNAL;

GLOBAL BYTE fn_cont_v;

BYTE TABLE digit :='0,'1,'2,'3,
                   '4,'5,'6,'7,
                   '8,'9,'#,'#,
                   '#,'#,'#,'#;
BCDL CONSTANT
            fracn_mid_f := 450000000000000;

COMMENT
   Writes a 16-digit BCDL number to RS-232 terminal.
   Assumes no scaling.
;
PROCEDURE write_bcdl (number);
BCDL number;
   BEGIN
   INTEGER index;
   INTEGER high,low;
   BYTE POINTER bptr;
   BYTE ARRAY byte [0:17];
   byte:=16;
   FOR index := 0 TO 7 DO
      BEGIN
      STPNTR(bptr,ADRS(number)+index);
      high:=low:=INTEGER(bptr);
      high:=RIGHT(high,4) AND %000F;
      low:=low AND %000F;
      byte[index*2+1]:= digit [high];
      byte[index*2+2]:= digit [low];
      END;
   WSTR(ADRS(byte[0]));
   WSTR("/(BCDL)");
   END write_bcdl;

COMMENT
   Compares two BCDLs, returns TRUE if identical, FALSE if not.
      (Wheelgol's BCD and BCDL math is not to be trusted!)
;
BOOLEAN PROCEDURE comp_bcdl (first,second);
BCDL first, second;                                                    ENTRY;
   BEGIN
   INTEGER i_index;
   INTEGER f_integer, s_integer;
   INTEGER POINTER f_ptr, s_ptr;
   BOOLEAN boolean_temp;
```

```
  boolean_temp:=TRUE;
  FOR i_index:=0 TO 3 DO
    BEGIN
    STPNTR(f_ptr,ADRS(first)+i_index*2);
    STPNTR(s_ptr,ADRS(second)+i_index*2);
    f_integer:=f_ptr;
    s_integer:=s_ptr;
    IF f_integer<>s_integer THEN boolean_temp:=FALSE;
    END;
  comp_bcdl:=boolean_temp;
  END comp_bcdl;

COMMENT
  Fracn chip needs at least one, sometimes two, cycle starts to
    implement one instruction before doing another.
  This wait loop checks for that condition, and burns up time
    until it occurs.
  Should add a timeout in case of failures.
;
PROCEDURE fracn_wait;
  BEGIN
  LABEL wait_exit;
  REPEAT 25 DO BEGIN END;       & WAIT changed from 20 to 25 &
  REPEAT 125 DO                 & WAIT changed from 100 to 125 &
    IF TBIT(fracn_status,4) THEN
      GO TO wait_exit;
  & tell (fn wait fail) &
  wait_exit:
  END fracn_wait;

COMMENT
  Writes an instruction to the fracn control chip.
  See cfracn for summary.
  See fracn chip drawing A-1820-2004-M4-4 for details.
  Note that precautions for the phase inc/dec and freq inc/dec
    are included. These must not be immediately followed by
    an instruction of this set. Read r2 is also of this class?
    Insert a noop to be safe.
;
PROCEDURE fn_instruction(function);
VALUE function;
INTEGER function;                                                ENTRY;
BEGIN
  fracn_wait;
  fracn_chip_control := function;
  IF function >= fn_inc_freq AND function <= fn_dec_ph THEN
    BEGIN
      fracn_wait;
      fracn_chip_control := fn_noop;
      fracn_wait;
    END;

END fn_instruction;

COMMENT
  Writes a 64-bit, 16-digit long BCD value to fracn control chip.
  Must be preceded by a write-type instruction.
  Assumes BCDL is scaled for LSD = 100nHz.
;
PROCEDURE fn_wrt (number);
BCDL number;                                                     ENTRY;
  BEGIN
  BYTE POINTER BPTR=REGISTER 9;
  STPNTR(BPTR,ADRS(fracn_chip_eclk));
```

```
    fracn_wait;
    ASSEMBLE(
        MOVE.L 4(R8), R0;
        MOVE.B R0, (R9); LSR #4, R0; MOVE.B R0, (R9); LSR #4, R0;
        MOVE.B R0, (R9); LSR #4, R0; MOVE.B R0, (R9); SWAP R0;
        MOVE.B R0, (R9); LSR #4, R0; MOVE.B R0, (R9); LSR #4, R0;
        MOVE.B R0, (R9); LSR #4, R0; MOVE.B R0, (R9);
        MOVE.L 0(R8), R0;
        MOVE.B R0, (R9); LSR #4, R0; MOVE.B R0, (R9); LSR #4, R0;
        MOVE.B R0, (R9); LSR #4, R0; MOVE.B R0, (R9); SWAP R0;
        MOVE.B R0, (R9); LSR #4, R0; MOVE.B R0, (R9); LSR #4, R0;
        MOVE.B R0, (R9); LSR #4, R0; MOVE.B R0, (R9));
    fn_instruction (fn_noop);
    END fn_wrt;

COMMENT
    Reads a 64-bit, 16-digit long BCD number from fracn control chip.
    Result winds up in R0/R1, so is used as a typed procedure.
    All digits are significant, LSD = 100nHz.
    It seems that the first (LSD) is available from the fracn chip
        immediately after the read instruction, so no eclk is given
        before reading the LSD in. (Not completely verified, but
        gives the right answer.)
    Usage must be preceded by a read-type instruction.
    Should issue a NOP after read is complete to get fn chip refresh
        going again?
;
BCDL PROCEDURE fn_read;                                                 ENTRY;
    BEGIN
    DOUBLE STATPNTR=REGISTER 10;
    BYTE POINTER CLKPNTR=REGISTER 9;
    STPNTR (CLKPNTR, ADRS(fracn_chip_eclk));
    STATPNTR:=ADRS(fracn_status);
    fracn_wait;
    &          clock              read              shift            &
    ASSEMBLE ( EQU*;
                                  MOVE.B (R10),R1;  ROR.L    #4,R1;
        MOVE.B  #0,(R9);          MOVE.B (R10),R1;  ROR.L    #4,R1;
        MOVE.B  #0,(R9);          MOVE.B (R10),R1;  ROR.L    #4,R1;
        MOVE.B  #0,(R9);          MOVE.B (R10),R1;  ROR.L    #4,R1;
        MOVE.B  #0,(R9);          MOVE.B (R10),R1;  ROR.L    #4,R1;
        MOVE.B  #0,(R9);          MOVE.B (R10),R1;  ROR.L    #4,R1;
        MOVE.B  #0,(R9);          MOVE.B (R10),R1;  ROR.L    #4,R1;
        MOVE.B  #0,(R9);          & 8 &
        MOVE.B  (R10),R3;
        ANDI.L  =H0000000F,R3;
        ANDI.L  =HFFFFFFF0,R1;
        OR.L    R3,R1;
        ROR.L   #4,R1;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          MOVE.B (R10),R0;  ROR.L    #4,R0;
        MOVE.B  #0,(R9);          & 16 &
        MOVE.B  (R10),R3;
        ANDI.L  =H0000000F,R3;
        ANDI.L  =HFFFFFFF0,R0;
        OR.L    R3,R0;
        ROR.L   #4,R0);
    END fn_read;
```

```
COMMENT
   Intializes fracn at turn on only.
   Pulls L INIT low to divide by 999 to drive first cycle start.
      (Need to pull L SWPRST low to clear sweep control logic.??)
   Sets fracn control and variable to "normal" mode, high range.
   Loaded r2 here to avoid sweep control problems per WTP.
;
PROCEDURE i_fn;                                                      ENTRY;
BEGIN fracn_control := fracn_control_init;
   fracn_control := fn_cont_v := fracn_control_norm;
   fn_instruction (fn_load_r2);
   fn_wrt (fracn_stop_max);
   fn_instruction (fn_load_r1);
   fn_wrt (fracn_mid_f);
   fn_instruction (fn_set_freq);

END i_fn;

SUBROUTINE rst_lswp;                                                 ENTRY;
BEGIN
   fracn_control := fn_cont_v := RBIT(fn_cont_v, 0);    & put L SWP high &
END rst_lswp;

PROCEDURE fn_set_cw (frequency, high_range);
VALUE frequency, high_range;
BCDL frequency;
BOOLEAN high_range;                                                  ENTRY;
BEGIN IF high_range THEN
      fracn_control := fn_cont_v := RBIT(fn_cont_v, 1)
   ELSE
      fracn_control := fn_cont_v := SBIT(fn_cont_v, 1);

fn_instruction (fn_load_r1);
   fn_wrt (frequency);
   fn_instruction (fn_set_freq);
END fn_set_cw;

PROCEDURE fn_cw_test(frequency);
VALUE frequency;
QUAD frequency;   & scaled to 100nHz &                               ENTRY;
BEGIN
   IF frequency < 1200000000000000 THEN & ** low range ** &
      fn_set_cw (BCDL(frequency/2), low)
   ELSE & ** high range ** &
      fn_set_cw (BCDL(frequency/4), high);

END fn_cw_test;

PROCEDURE fn_set_swp (start, increment, stop, high_range);
VALUE start, increment, stop, high_range;
BCDL start, increment, stop;
BOOLEAN high_range;                                                  ENTRY;
BEGIN
  IF driver_debug THEN
   BEGIN  & ** debug ** &
    WSTR("FRACN SET SWEEP");
    CRLF;
   END;    & ** debug ** &
```

```
    IF high_range THEN
       fracn_control := fn_cont_v := RBIT(fn_cont_v, 1)
    ELSE
       fracn_control := fn_cont_v := SBIT(fn_cont_v, 1);

rst_lswp;
    fn_instruction (fn_load_r1);          & set start freq &
    fn_wrt (start);
    fn_instruction (fn_set_freq);
    fn_instruction (fn_load_r1);          & set increment freq &
    fn_wrt (increment);                   & Hz per 10uSec &
    fn_instruction (fn_load_r2);
    fn_wrt (stop);
 END fn_set_swp;

SUBROUTINE fn_start_swp;                                       ENTRY;
 BEGIN
    IF driver_debug THEN
       BEGIN
       WSTR("FRACN START SWEEP");
       CRLF;
       END;
    fracn_control := fn_cont_v := SBIT(fn_cont_v, 0);  & release L SWP &
    fn_instruction (fn_swp_up);
 END fn_start_swp;

SUBROUTINE fn_start_swp_dn;                                    ENTRY;
 BEGIN
    IF driver_debug THEN
       BEGIN
       WSTR("FRACN START SWEEP DOWN");
       CRLF;
       END;
    fracn_control := fn_cont_v := SBIT(fn_cont_v, 0);  & release L SWP &
    fn_instruction (fn_swp_dn);
 END fn_start_swp;
 END$
```

APPENDIX D

```
M68KL,P,"pretcal"
BEGIN include "cmsgbrk.h";   & swp_sync_err, phase_lock_cal                      &
include "cmessag2.h";  & all_messages                                      &
  & cmessag0.h                  ---- NO LABELS USED FROM THIS FILE ----     &
#include "futil2.h";    & clr_msg                                           &
#include "futil3.h";    & tell, warn                                        &
#include "fdif.h";      & abus_voltage                                      &
#include "fpll.h";      & pl_set_cont, pl_set_pretune_dac                   &
#include "cpll.h";      & pretune_yig1, acquire_yig1, track_yig1, yigs_off  &
#include "fabus2.h";    & sel_abus_ch, abus_freq                            &
#include "cabus.h";     & low_res, aux_out_off, pl_pretune_dac, pl_if       &
#include "ffracn1.h";   & fn_instruction, fn_start_swp, fn_set_cw, rst_lswp &
#include "fsource.h";   & set_src_range, abus_ok, rf_blank                  &
#include "cfracn1.h";   & fn_r2_to_r3, high                                 &
#include "ciolp.h";     & pl_lk_ind_reset                                   &
   & ciodif2.h            dif_status                                        &
   & fiodif2.h                   ---- NO LABELS USED FROM THIS FILE ----    &
#include "fiocnfig.h";  & cpu_test_port                                     &
#include "freceiv3.h";  & cntrl_wait                                        &
#include "cdebugc2.h";  & lock_debug                                        &
#include "fterm.h";     & CRLF, WSTR                                        &
#include "fterm2.h";    & WQUAD                                             &
#include "fterm3.h";    & WNUM, WREAL                                       &
#include "fcmos.h";     & dac_seed0                                         &

& ***** GLOBALS ***** &
```

```
GLOBAL BOOLEAN defer_cal,      & ** set in SPHLOCK ** &
               cal_reqd;        & ** set in SPHLOCK ** &

GLOBAL INTEGER dac_num0, dac_num1;

& ***** LOCAL GLOBALS ***** &

INTEGER  Vmin, Vmax, abort_cal, band;

REAL slope;

BOOLEAN CONSTANT no_check   := FALSE,
                 on         := TRUE,
                 off        := FALSE,
                 yig1_range := TRUE,
                 yig2_range := FALSE;

INTEGER CONSTANT mid_band     := 1,
                 high_band    := 2,
                 all_bands    := 7,
                 band_8       := 8,
                 band_10      := 10,
                 band_12      := 12,
                 settling_wait :=   500,      & **  5 ms ** &
                 long_wait     :=  2000,      & ** 20 ms ** &
                 gate_4ms      :=  4000;      & **  4 ms ** &

QUAD CONSTANT accuracy_factor := 10000000;    & ** 100 nHz ** &

COMMENT
****************************************************************
* SPECIFICATION FOR settled_freq
*
* FUNCTION: Repeatedly count the abus until the two subsequent
*           measurements are within the tolerance specified.  Times out
*           after ~400 ms.  Tolerance set for 5 kHz.  If timeout
*           occurs abort_cal flag is set.
****************************************************************
;
QUAD PROCEDURE settled_freq;
BEGIN
  QUAD new, old, initial_freq;
  INTEGER counter;
  INTEGER CONSTANT tolerance := 5000,
                   timeout   := 50;
  counter := 0;
  new := QUAD( abus_freq(pl_if, gate_4ms) );
  initial_freq := new;
  DO
    BEGIN
      old := new;
      new := QUAD( abus_freq(pl_if, gate_4ms) );
      counter := counter + 1;
    END
  UNTIL (ABS(new - old) < tolerance) OR (counter > timeout);

IF lock_debug THEN
  BEGIN
    WSTR("Settled_freq counter:"); WNUM( counter );
    WSTR(" initial_freq: "); WQUAD( initial_freq );
    WSTR(" final freq: "); WQUAD( new );   CRLF;
  END;

settled_freq := new;

END settled_freq;
```

```
COMMENT
********************************************************************
* SPECIFICATION FOR settled_volt
*
* FUNCTION: Repeatedly measure the abus voltage until the two subsequent
*           measurements are within 1 count (0.25 mV).  Measurements
*           take (very) roughly 0.5 ms.  Timeout set for 50 ms.
*           Scales by 4000.
********************************************************************
;
INTEGER PROCEDURE settled_volt;
BEGIN
  INTEGER new, old, counter;
  INTEGER CONSTANT timeout := 100;

counter := 0;
  new := INTEGER( 4000.0 * abus_voltage(10, low_res) );
  DO
    BEGIN
      old := new;
      new := INTEGER( 4000.0 * abus_voltage(10, low_res) );
      counter := counter + 1;
    END
  UNTIL (ABS(new - old) <= 1) OR (counter > timeout);

IF lock_debug THEN
    IF counter > timeout THEN
      BEGIN
        CRLF; WSTR("Settled_volt timed out!"); CRLF;
        WSTR("New volt: "); WNUM( new );
        WSTR("  Old volt: "); WNUM( old ); CRLF;
      END;

settled_volt := new;

END settled_volt;

COMMENT
********************************************************************
* SPECIFICATION FOR sweep_fracn
*
* FUNCTION: Resets lswp, starts the frac N sweep, waits for end
*           of sweep, sets start freq of next sweep to stop freq of
*           previous sweep.
*
* COMMENTS: Assumes frac N start, step, and stop frequencies have
*           been set.
********************************************************************
;
PROCEDURE sweep_fracn;
BEGIN
  INTEGER counter;

& ** reset lswp on frac N board ** &
  rst_lswp;
  fn_start_swp;
  cntrl_wait(100);  & ** 1 ms ** &

& ** Wait until we are actually done sweeping ** &
  counter := 0;
  WHILE (dif_status AND %80) = 0    &  lswp low  &
        AND (counter < 30000)       & ** AND have not timed out ** & DO
    BEGIN                           & ** (time out = 300 ms)    ** &
      cntrl_wait(1);
      counter := counter + 1;
    END;
```

```
      & ** make frac N frequency equal to the stop frequency ** &
   fn_instruction(fn_r2_to_r3);

END sweep_fracn;

COMMENT
******************************************************************
* SPECIFICATION FOR   derive_dac_num
*
* FUNCTION: Derive the DAC number for the frequency just less than
*           or equal to the target frequency (voltage level).
*
* PARAMETER DESCRIPTION:
*
*   INPUT:   target voltage to derive
*
*   OUTPUT:  DAC number which corresponds to target voltage
*
*   COMMENTS:  Turns off YIG main coil current.
******************************************************************
;
INTEGER PROCEDURE derive_dac_num( target );
VALUE target;
INTEGER target;
BEGIN
   INTEGER number, Vtemp, counter;
   INTEGER CONSTANT timeout := 50;

IF TBIT(abort_cal, band) = 0 THEN
      BEGIN  &  NOT abort_cal in this band  & number := REAL(target - Vmin)/slope;
         pl_set_cont(yigs_off);
         pl_set_pretune_dac(number);
         Vtemp := settled_volt;
         counter := 0;
         DO
            BEGIN
               number := number + 1;
               counter := counter + 1;
               IF (counter > timeout) OR (number > 4095) THEN
                  abort_cal := SBIT(abort_cal, band);
               pl_set_pretune_dac(number);
               Vtemp := settled_volt;
            END
         UNTIL ( ( Vtemp > target ) OR ( TBIT(abort_cal, band) <> 0 ) );

counter := 0;
         DO
            BEGIN
               number := number - 1;
               counter := counter + 1;
               IF (counter > timeout) OR (number < 1) THEN
                  abort_cal := SBIT(abort_cal, band);
               pl_set_pretune_dac(number);
               Vtemp := settled_volt;
            END
         UNTIL ( ( Vtemp <= target ) OR ( TBIT(abort_cal, band) <> 0 ) );

derive_dac_num := number;

END;   & ** NOT abort_cal in this band ** &

END derive_dac_num;
```

```
COMMENT
*****************************************************************
* SPECIFICATION FOR  first_lock_up
*
* FUNCTION: Pretunes using the DAC seed value and attempts to lock up
*           to the first source freq.  Checks for false locking, either
*           to the wrong comb tooth or a harmonic of the source.  Pretunes
*           near the acquired frequency for an IF of -12 MHz.  Sweeps
*           frac N up so IF shifts -24 MHz (through dc) and counts the
*           IF before and after sweep.  Uses this frequency difference to
*           determine if on the correct harmonic.  Determines the correct
*           DAC number for locking to the first source frequency.
*
* PARAMETER DESCRIPTION:
*
*    INPUT:
*
*    OUTPUT:      dac_num0 (and dac_num1 for 8722a)
*
*    INTERNAL USE: pret_cal
*
*    COMMENTS:  I found that after the YIG osc is pretuned it will
*               continue to drift in frequency.  In the first 20 ms it
*               will drift about 400 kHz, the next about 250 kHz,
*               the third about 175 kHz and so on.  I found the initial
*               drift was so high that the difference between the first
*               IF count and the second were so far off that the
*               firmware thinks it's on the wrong harmonic.
*****************************************************************
;
PROCEDURE first_lock_up(yig_range);
VALUE yig_range;
BOOLEAN yig_range;
BEGIN
  BCDL fn_start, fn_stop;
  BOOLEAN done;
  INTEGER temp_dac, test_dac, tries, pret_volt, start_lock_volt,
          pretune_yig, acquire_yig, track_yig;
  QUAD first_freq, second_freq, freq_shift, min_allowance, max_allowance,
       fn_shift;

IF lock_debug THEN
    BEGIN
      CRLF; WSTR("Top of first_lock_up"); CRLF;
    END;

& ** initialize ** &
#ifdef hp8722a
  IF yig_range = yig2_range THEN
    BEGIN  & ** 20-40 GHz osc ** &
      set_src_range(band_12);
      temp_dac := dac_seed1;
      band := high_band;
      pretune_yig := pretune_yig2;
      acquire_yig := acquire_yig2;
      track_yig   := track_yig2;
      min_allowance := -107000;    & ** N = 111.5 ** &
      max_allowance := 171400;     &  N = 112.8  & fn_start := 437500000000000;  &  source freq = 19.600 GHz    &
      fn_shift :=     535714285714; & ** 53.5... kHz * 448 = 24 MHz ** &
      fn_stop  := BCDL( QUAD(437500000000000) - fn_shift );
    END    & ** 20-40 GHz osc ** &
  ELSE
#endif
BEGIN  &  2-20 GHz osc  &
  set_src_range(band_8);
```

```
      temp_dac := dac_seed0;
      band := mid_band;
      pretune_yig := pretune_yig1;
      acquire_yig := acquire_yig1;
      track_yig   := track_yig1;
      min_allowance := -600000;     & ** N = 19.5 ** &
      max_allowance := 840000;      &  N = 20.7  & fn_start  := 300000000000000;  &  source freq = 2.390 GHz  &
      fn_shift  :=   3000000000000;  & ** 300 kHz * 80 = 24 MHz    ** &
      fn_stop   := BCDL( QUAD(300000000000000) - fn_shift );
   END;     &  2-20 GHz osc  & tries := 0;
done := FALSE;

DO
   BEGIN & ** pretune/acquire loop ** &
      fn_set_cw(fn_start, high);

pl_set_pretune_dac(temp_dac);
      rf_blank(on);
      pl_set_cont(yigs_off);
      cntrl_wait(settling_wait);
      pl_set_cont(pretune_yig);
      cntrl_wait(long_wait);
      rf_blank(off);

pret_volt := settled_volt;

pl_set_cont(acquire_yig);
      cntrl_wait(long_wait);
      start_lock_volt := settled_volt;

pl_lk_ind_reset := 0;
      IF TBIT(cpu_test_port,3) <> 0 THEN
         BEGIN   & ** loop unlocked ** &
            IF start_lock_volt < Vmax THEN
                  & ** locked up, but excessive phase error   ** &
                  & ** so probably at a harmonic of the source ** &
               BEGIN
                  IF lock_debug THEN
                     BEGIN
                        WSTR("Noisy lock, try #: "); WNUM(tries);
                        WSTR(" dac number: "); WNUM(temp_dac);
                        WSTR(" start_lock_volt: "); WNUM(start_lock_volt);
                        CRLF;
                     END;
               END
            ELSE
                 & ** no lock at all, we're pulled up to da limit! ** &
               BEGIN
                  IF lock_debug THEN
                     BEGIN
                        WSTR("UP TO THE LIMIT!  try #: "); WNUM(tries);
                        WSTR(", dac number: "); WNUM(temp_dac); CRLF;
                     END;
                  abort_cal := SBIT(abort_cal, band);
               END;

END    & ** loop unlocked ** &
      ELSE
         BEGIN  & ** loop locked ** &
            IF start_lock_volt < pret_volt THEN
               BEGIN  & ** locked to a frequency BELOW pretune frequency ** &
                  IF lock_debug THEN
                     BEGIN
                        WSTR("Locked below pretune, try #: "); WNUM(tries);
```

```
                        WSTR(", dac number: "); WNUM( temp_dac ); CRLF;
                      END;
                END    & ** locked to a frequency BELOW pretune frequency ** &
              ELSE
                BEGIN  & ** locked to a frequency ABOVE pretune freq ** &
                  test_dac := derive_dac_num(start_lock_volt);
                  pl_set_pretune_dac(test_dac);
                  pl_set_cont(pretune_yig);
#ifdef hp8722a
                  IF yig_range = yig2_range THEN
                    REPEAT 5 DO   & ** wait 100 ms ** &
                      cntrl_wait(long_wait)
                  ELSE
#endif
                    cntrl_wait(50);  & ** wait 0.5 ms ** &

& ** count IF freq ** &
                  first_freq := settled_freq;

IF first_freq < 10000000 THEN
                    BEGIN  & ** bump up IF freq by decreasing source freq ** &
                      test_dac := test_dac +
                                  ( (first_freq - 13300000) / 2442000 );
                      pl_set_pretune_dac(test_dac);
                      first_freq := settled_freq;
                    END;   &  bump up IF freq by decreasing source freq  & fn_set_cw(fn_stop, high);
                  second_freq := settled_freq;

IF lock_debug THEN
                    BEGIN
                      WSTR("first_freq: ");   WQUAD(first_freq);
                      WSTR("second_freq: ");  WQUAD(second_freq);
                      WSTR("test_dac: ");     WNUM(test_dac);
                      CRLF;
                    END;

sel_abus_ch(pl_pretune_dac, aux_out_off);

freq_shift := (first_freq + second_freq) - 24000000;

IF (freq_shift > max_allowance) OR
                     (freq_shift < min_allowance) THEN
                    BEGIN  & ** wrong harmonic ** &
                      IF test_dac > temp_dac THEN
                        temp_dac := test_dac;
                      IF lock_debug THEN
                        BEGIN
                          WSTR("Locked to wrong harmonic.  Try #: ");
                          WNUM( tries ); WSTR("dac number: ");
                          WNUM(temp_dac); WSTR("harmonic: ");
                          WREAL( REAL(first_freq + second_freq ) /
                                 REAL( (4 * fn_shift)
                                 / accuracy_factor ) );
                          CRLF;
                        END;
                    END    & ** wrong harmonic ** &
                  ELSE
                    BEGIN  & ** correct harmonic ** &
                        & ** store dac_num for 7 to 10 MHz below ** &
                        & ** lock frequency                       ** &
#ifdef hp8722a
                      IF yig_range = yig2_range THEN
                        dac_num1 := test_dac - 3
                      ELSE
#endif
                        dac_num0 := test_dac - 3;
```

```
                          done := TRUE;
                          IF lock_debug THEN
                            BEGIN
                              WSTR("done is TRUE");
                              IF yig_range = yig1_range THEN
                                BEGIN
                                  WSTR("dac_num0: ");
                                  WNUM(dac_num0);
                                END
                              ELSE
                                BEGIN
                                  WSTR("dac_num1: ");
                                  WNUM(dac_num1);
                                END;
                              WSTR("harmonic: ");
                              WREAL( REAL(first_freq + second_freq ) /.
                                     REAL( (4 * fn_shift)
                                     / accuracy_factor ) );
                              CRLF;
                            END;
                    END;    & ** correct harmonic ** &

END;    & ** locked to a frequency ABOVE pretune freq ** &

END;    & ** loop locked ** &

& ** Pretune -2.4MHz above and try again. ** &
            temp_dac := temp_dac + 1;

tries := tries + 1;
            IF tries > 20 THEN
              abort_cal := SBIT(abort_cal, band);

END   & ** pretune/acquire loop ** &

UNTIL (done OR (TBIT(abort_cal, band) <> 0) );

IF lock_debug THEN
       BEGIN & ** debug ** &
         WSTR("Bottom of first_lock_up"); CRLF; CRLF;
       END; & ** debug ** &
    END first lock up;

COMMENT
    ****************************************************************
    * EXTERNAL SPECIFICATION FOR   pret_cal
    *
    * FUNCTION: Derive the pretune dac numbers for the two YIGs.
    *
    *    OUTPUT:   INTEGER: bit 1 = 1 if cal failed in mid band
    *                       bit 2 = 1 if cal failed in high band
    ****************************************************************
    ;
    INTEGER PROCEDURE pret_cal;                                 ENTRY;
    BEGIN
    clr_msg(all_messages);
    tell(phase_lock_cal);

IF abus_ok THEN
       BEGIN  & ** abus is functional ** &

COMMENT
         ** Find the voltages that correspond to DAC numbers 0 and 4095.  **
         ** From these compute slope and offset values.  (offset = Vmin)  **
         ** Used in derive_dac_num                                        **
    ;
         sel_abus_ch(pl_pretune_dac, aux_out_off);
```

```
      pl_set_pretune_dac(0);
      rf_blank(on);
      pl_set_cont(yigs_off);
      Vmin := settled_volt;
      pl_set_pretune_dac(4095);
      Vmax := settled_volt;
      slope := REAL(Vmax - Vmin) / 4095.0;

IF lock_debug THEN
        BEGIN  & ** debug ** &
          WSTR("Vmin: "); WNUM(Vmin); CRLF;
          WSTR("Vmax: "); WNUM(Vmax); CRLF;
          WSTR("slope: "); WREAL(slope); CRLF;
        END;   & ** debug ** &

& ** initialize abort_cal flag ** &
      abort_cal := 0;

& ** calibrate 2-20 osc ** &
      band := mid_band;
      first_lock_up(yig1_range);

#ifdef hp8722a
        & ** calibrate 20-40 osc ** &
      band := high_band;
      first_lock_up(yig2_range);
endif clr_msg(phase_lock_cal);

END      &  abus is functional  &
  ELSE
    abort_cal := all_bands;

IF (abort_cal <> 0) THEN   & ** warn user "phase lock cal failure" ** &
     warn( swp_sync_err )
   ELSE
     BEGIN
       defer_cal := FALSE;
       cal_reqd := FALSE;
     END;

iF lock_debug THEN
     BEGIN
       IF (abort_cal <> 0) THEN
         BEGIN  & ** abort_cal TRUE ** &
           WSTR("Pretune Calibration FAILURE"); CRLF;
           IF NOT abus_ok THEN
             WSTR("ABUS not functioning properly");
         END    & ** abort_cal TRUE ** &
       ELSE
         WSTR("Pretune Calibration Successful");
       CRLF; CRLF;
     END;

pret_cal := abort_cal;

END pret_cal;

END$
```

What is claimed is:

1. A swept synthesized source comprising:

tunable oscillator means having a tuning input and an output;

low-frequency synthesizer means having a control input and an output;

frequency sampler means having a first input connected to the output of the tunable oscillator means, a second input connected to the output of the low-frequency synthesizer means, and an output;

reference oscillator means having an output;

phase detector means having a first input connected to the output of the frequency sampler means, a second input connected to the output of the reference oscillator means, and an output;

signal conditioning means having an input connected to the output of the phase detector means and an output;

electronic pretuning means having a control input and an output;

switching means having a control input, an output connected to the tuning input of the tunable oscillator means, and at least three positions, including a first position in which the tuning input of the tunable oscillator means is connected to the output of the signal conditioning means, a second position in which the tuning input of the tunable oscillator means is connected to the output of the electronic pretuning means, and a third position in which there is no connection the to tuning input of the tunable oscillator means; and controller means connected to the control inputs of the low-frequency synthesizer means, electronic pretuning means, and switching means for generating control signals;

the controller means initially providing a control signal to operate the switching means to the third position so that energy stored in the tunable oscillator means is dissipated;

whereby hysteresis effects in the operation of the tunable oscillator means are eliminated.

2. The swept synthesizer source of claim 1 wherein the electronic pretuning means comprises a digital-to-analog converter (DAC).

3. The swept synthesizer source of claim 1 wherein the swept synthesized source is operated across a plurality of frequency bands the swept synthesized source further comprising at rack and hold circuit having an input connected to the output of the signal conditioning means and an output, and wherein the switching means has at least a fourth position in which the tuning input of the tunable oscillator means is connected to the output of the track and hold circuit when a maximum frequency of a frequency band is reached in response to a control signal from the controller means.

4. The swept synthesized source of claim 1, further comprising a frequency counter connected to the output of the frequency sampler means, a voltage comparator connected to the output of the phase detector means, and a voltmeter connected to the tuning input of the tunable oscillator means.

5. The swept synthesized source of claim 1 wherein the low-frequency synthesizer means comprises:

a voltage controlled oscillator (VCO) having a tune input and an output, the output of the VCO being connected to the second input of the frequency sampler means;

frequency divider means having a control input connected to the controller means, an input connected to the output of the VCO, and an output;

second reference oscillator means having an output;

second phase detector means having a first input connected to the output of the second reference oscillator means, a second input connected to the output of the frequency divider means, and an output;

first integrator means having an input connected to the output of the second phase detector means and an output; and second integrator means having an input connected to the output of the first integrator means and an output coupled to the tune input of the VCO.

6. The swept synthesized source of claim 5 wherein the low-frequency synthesizer means further comprises a passive lag-lead network having an input connected to the output of the second integrator means and an output connected to the tune input of the VCO for coupling the second integrator means to the VCO, whereby phase-lock loop acquisition time is reduced.

7. The swept synthesized source of claim 6 wherein the low-frequency synthesizer means further comprises a phase-lock loop stability enhancement circuit connected between the input and the output of the lag-lead network.

8. The swept synthesized source of claim 7 wherein the lag-lead network comprises a resistor connected between the output of the second integrator means and the tune input of the VCO and a capacitor coupled between the input of the VCO and common and wherein the phase-lock loop stability enhancement circuit comprises a reverse-biased zener diode connected between the output of the second integrator means and the tune input of the VCO to control charging and discharging of the capacitor during large-signal operation.

9. In a low-frequency synthesizer comprising a voltage controlled oscillator (VCO) having a tune input and an output; frequency divider means having a control input, an input connected to the output of the VCO, and an output; reference oscillator means having an output; phase detector means having a first input connected to the output of the reference oscillator means, a second input connected to the output of the frequency divider means, and an output; first integrator means having an input connected to the output of the phase detector means and an output; second integrator means having an input connected to the output of the first integrator means and an output; a passive lag-lead network having an input connected to the output of the second integrator means and an output connected to the tune input of the VCO; and controller means connected to the control input of the frequency divider means; the improvement comprising:

a phase-lock loop stability enhancement circuit connected between the input and the output of the lag-lead network.

10. The low-frequency synthesizer of claim 9 wherein the lag-lead network comprises a resistor connected between the output of the second integrator means and the tune input of the VCO and a capacitor coupled between the input of the VCO and common and wherein the phase-lock loop stability enhancement circuit comprises a reverse-biased zener diode connected between the output of the second integrator means and the tune input of the VCO to control charging and discharging of the capacitor during large-signal operation.

11. A swept synthesized source comprising:

tunable oscillator means having a tuning input and an output;

low-frequency synthesizer means having a control input and an output, the low-frequency synthesizer means comprising:

a voltage controlled oscillator (VCO) having a tune input and an output; frequency divider means having a control input, an input connected to the output of the VCO, and an output; first reference oscillator means having an output; first phase detector means having a first input connected to the output of the reference oscillator means, a second input connected to the output of the frequency divider means, and an output; first integrator means having an input connected to the output of the first phase detector means and an output; second integrator means having an input connected to the output of the first integrator means and an output; a passive lag-lead network having an input connected to the output of the second integrator means and an output connected to the tune input of the VCO, and a phase-lock loop stability enhancement circuit connected between the input and the output of the lag-lead network;

frequency sampler means having a first input connected to the output of the tunable oscillator means, a second input connected to the output of the VCO of the low-frequency synthesizer means, and an output;

second reference oscillator means having an output;

second phase detector means having a first input connected to the output of the frequency sampler means, a second input connected to the output of the second reference oscillator means, and an output;

signal conditioning means having an input connected to the output of the second phase detector means and an output;

electronic pretuning means having a control input and an output;

switching means having a control input, an output connected to the tuning input of the tunable oscillator means, and at least three positions, including a first position in which the tuning input of the tunable oscillator means is connected to the output of the signal conditioning means, a second position in which the tuning input of the tunable oscillator means is connected to the output of the electronic pretuning means, and a third position in which there is no connection to the tuning input of the tunable oscillator means; and controller means connected to the control inputs of the frequency divider means of the low-frequency synthesizer means, electronic pretuning means, and switching means for generating control signals;

the controller means initially providing a control signal to operate the switching means to the third position so that energy stored in the tunable oscillator means is dissipated;

whereby hysteresis effects in the operation of the tunable oscillator means are eliminated.

12. The swept synthesized source of claim 11 wherein the swept synthesized source is operated across a plurality of frequency bands, the swept synthesized source further comprising a track and hold circuit having an input connected to the output of the signal conditioning means and an output, and wherein the switching means has at least a fourth position in which the tuning input of the tunable oscillator means is connected to the output of the track and hold circuit when a maximum frequency of a frequency band is reached in response to a control signal from the controller means.

13. A method of operating a swept synthesized source, comprising the steps of:

initially zeroing the tuning current fed to a tunable oscillator means included in the swept synthesized source to eliminate hysteresis effects by initially disconnecting a tuning input of the tunable oscillator means from means for driving the tunable oscillator means;

initially setting electronic pretuning means to produce a voltage to drive the tunable oscillator means so that the tunable oscillator means will operate near its minimum operating frequency;

resetting a divide number N so that a low-frequency synthesizer means is initialized near its minimum frequency of operation;

connecting the electronic pretuning means to the tuning input of the tunable oscillator means;

disconnecting the electronic pretuning means from the tuning input of the tunable oscillator means;

closing a main phase-lock loop so that the tunable oscillator means phase locks to its minimum operating frequency; and sweeping the low-frequency synthesizer means in the main phase-lock loop to drive the tunable oscillator means over a desired frequency span.

14. The method of claim 13 wherein the desired frequency span extends over a plurality of frequency bands, further comprising the steps of:

sweeping the low-frequency synthesizer means over its operating frequency range to in turn sweep the tunable oscillator means to a maximum frequency of a present frequency band;

opening the main phase-lock loop;

connecting the tuning input of the tunable oscillator means to a track and hold circuit so that the frequency of the tunable oscillator means is held at the maximum frequency of the present frequency band;

re-initializing the low-frequency synthesizer means;

disconnecting the track and hold circuit;

again closing the main phase-lock loop; and sweeping the low-frequency synthesizer means again.

15. The swept synthesized source of claim 11 wherein the lag-lead network comprises a resistor connected between the output of the second integrator means and the tune input of the VCO and a capacitor coupled between the input of the VCO and common and wherein the phase-lock loop stability enhancement circuit comprises a reverse-biased zener diode connected between the output of the second integrator means and the tune input of the VCO to control charging and discharging of the capacitor during large-signal operation.

16. A pretune calibration method for determining a pretuning signal so that a tunable oscillator means incorporated into a swept synthesized source will initially phase-lock to its minimum operating frequency as the swept synthesized source is initialized to begin its sweep, comprising the steps of:

a) setting electronic pretuning means for the tunable oscillator means to a minimum value;

b) measuring a minimum tuning voltage in response to setting the electronic pretuning means to the minimum value;

c) setting the electronic pretuning means for the tunable oscillator means to a maximum value;

d) measuring a maximum tuning voltage in response to setting the electronic pretuning means to the maximum value;

e) deriving a slope and offset from the measured minimum and maximum values to allow computing calibrated values corresponding to each pretuning voltage over a given range of available pretuning voltages;

f) providing an initial seed value representative of a setting of the electronic pretuning means to pretune the tunable oscillator means to a frequency which is a predetermined frequency below a desired initial phase-lock frequency corresponding to the minimum operation frequency of the tunable oscillator means;

g) setting the electronic pretuning means with the seed value so that the tunable oscillator means is initially pretuned using the seed value;

h) initializing the frequency of a low-frequency synthesizer means incorporated into the swept synthesized source to near its minimum frequency of operation;

i) connecting the electronic pretuning means to a tuning input of the tunable oscillator means for pretuning the tunable oscillator means;

j) measuring an actual tuning voltage produced by the electronic pretuning means;

k) storing the measured actual tuning voltage produced by the electronic pretuning means;

l) disconnecting the electronic pretuning means from the tuning input of the tunable oscillator means;

m) closing a main phase-lock loop for attempting phase-lock of the tunable oscillator means;

n) measuring an actual tuning voltage present at the tuning input of the tunable oscillator means when the main phase-lock loop is closed;

o) storing the measured actual tuning voltage present at the tuning input of the tunable oscillator means when the main phase-lock loop is closed;

p) monitoring operation of the main phase-lock loop to determine if phase-lock occurs;

q) incrementing the value used to set the electronic pretuning means so that the tunable oscillator means is subsequently pretuned using the incremented value if phase-lock does not occur at step p);

r) repeating steps h) through p) if the value used to set the electronic pretuning means is incremented at step q);

s) measuring an actual tuning voltage at which phase-lock occurs and comparing this actual tuning voltage with the tuning voltage at pretune using the present value used to set the electronic pretuning means if phase-lock occurs at step p);

t) determining the relationship of the phase-lock frequency to the selected pretune frequency from the two values compared at step s);

u) incrementing the value used to set the electronic pretuning means and repeating steps h) through t) if the phase-lock frequency is determined to be below the selected pretune frequency at step t);

v) determining if the actual phase-lock frequency corresponds to the minimum operating frequency of the tunable oscillator means if the phase-lock frequency is above the selected pretune frequency;

w) storing the present value used to set the electronic pretuning means corresponding to the tuning voltage which resulted in initial phase-lock if phase-lock to the correct harmonic is determined to have occurred at step v) for use in pretuning to produce phase-lock at the minimum operating frequency of the tunable oscillator means during subsequent operation; and x) incrementing the value used to set the electronic pretuning means and repeating steps h) through w) if it is determined at step v) that phase-lock to the correct harmonic has not occurred.

17. The pretune calibration method of claim 16, wherein step v) comprises:

1) opening the main phase-lock loop;
2) deriving a value used to set the electronic pretuning means needed to produce the actual phase-lock frequency based on measurement of the actual phase-lock frequency tuning voltage and slope and offset;
3) setting the electronic pretuning means with the value derived at step 2) and using a corresponding pretuning voltage produced by the electronic pretuning means to pretune the tunable oscillator means;
4) counting and storing a first frequency output of a frequency sampler means;
(5) shifting a frequency of the low-frequency synthesizer means connected to the frequency sampler means a known amount;
6) counting and storing a second frequency output of the frequency sampler means;
7) computing a difference between the first and second frequency outputs determined at steps 4) and 6), respectively; and
8) using the difference computed at step 7) and the known amount that the frequency of the low-frequency synthesizer means shifts to determine the harmonic to which the tunable oscillator means is tuned.

18. A method of operating a swept synthesized source, comprising the steps of:

a) setting electronic pretuning means for the tunable oscillator means incorporated into the swept synthesized source to a minimum value;

b) measuring a minimum tuning voltage in response to setting the electronic pretuning means to the minimum value;

c) setting the electronic pretuning means for the tunable oscillator means to a maximum value;

d) measuring a maximum tuning voltage in response to setting the electronic pretuning means to the maximum value;

e) deriving a slope and offset from the measured minimum and maximum values to allow computing calibrated values corresponding to each pretuning voltage over a given range of available pretuning voltages;

f) providing an initial seed value representative of a setting of the electronic pretuning means to pretune the tunable oscillator means to a frequency which is a predetermined frequency below a desired initial phase-lock frequency corresponding to the minimum operation frequency of the tunable oscillator means;

g) setting the electronic pretuning means with the seed value so that the tunable oscillator means is initially pretuned using the seed value;

h) initializing the frequency of a low-frequency synthesizer means incorporated into the swept synthesized source to near its minimum frequency of operation;

i) connecting the electronic pretuning means to a tuning input of the tunable oscillator means for pretuning the tunable oscillator means;

j) measuring an actual tuning voltage produced by the electronic pretuning means;

k) storing the measured actual tuning voltage produced by the electronic pretuning means;

l) disconnecting the electronic pretuning means from the tuning input of the tunable oscillator means;

m) closing a main phase-lock loop for attempting phase-lock of the tunable oscillator means;

n) measuring an actual tuning voltage present at the tuning input of the tunable oscillator means when the main phase-lock loop is closed;

o) storing the measured actual tuning voltage present at the tuning input of the tunable oscillator means when the main phase-lock loop is closed;

p) monitoring operation of the main phase-lock loop to determine if phase-lock occurs;

q) incrementing the value used to set the electronic pretuning means so that the tunable oscillator means is subsequently pretuned using the incremented value if phase-lock does not occur at step p);

r) repeating steps h) through p) if the value used to set the electronic pretuning means is incremented at step q);

s) measuring an actual tuning voltage at which phase-lock occurs and comparing this actual tuning voltage with the tuning voltage at pretune using the present value used to set the electronic pretuning means if phase-lock occurs at step p);

t) determining the relationship of the phase-lock frequency to the selected pretune frequency from the two values compared at step s);

u) incrementing the value used to set the electronic pretuning means and repeating steps h) through t) if the phase-lock frequency is determined to be below the selected pretune frequency at step t);

v) determining if the actual phase-lock frequency corresponds to the minimum operating frequency of the tunable oscillator means if the phase-lock frequency is above the selected pretune frequency;

w) storing the present value used to set the electronic pretuning means corresponding to the tuning voltage which resulted in initial phase-lock if phase-lock to the correct harmonic is determined to have occurred at step v) for use in pretuning to produce phase-lock at the minimum operating frequency of the tunable oscillator means during subsequent operation; and x) incrementing the value used to set the electronic pretuning means and repeating steps h) through w) if it is determined at step v) that phase-lock to the correct harmonic has not occurred;

y) initially zeroing the tuning current fed to the tunable oscillator means included in the swept synthesized source to eliminate hysteresis effects by initially disconnecting a tuning input of the tunable oscillator means from means for driving the tunable oscillator means;

z) initially setting the electronic pretuning means to produce a voltage to drive the tunable oscillator means so that the tunable oscillator means will operate near its minimum operating frequency;

aa) resetting a divide number N so that the low-frequency synthesizer means is initialized near its minimum frequency of operation;

bb) connecting the electronic pretuning means to the tuning input of the tunable oscillator means;

cc) disconnecting the electronic pretuning means form the tuning input of the tunable oscillator means;

dd) closing the main phase-lock loop so that the tunable oscillator means phase locks to its minimum operating frequency; and ee) sweeping the low-frequency synthesizer means in the main phase-lock loop to drive the tunable oscillator means over a desired frequency span.

19. The method of claim 18 wherein the desired frequency span extends over a plurality of frequency bands, further comprising the steps of:

sweeping the low-frequency synthesizer means over its operating frequency range to in turn sweep the tunable oscillator means to a maximum frequency of a present frequency band;

opening the main phase-lock loop;

connecting the tuning input of the tunable oscillator means to a track and hold circuit so that the frequency of the tunable oscillator means is held at the maximum frequency of the present frequency band;

re-initializing the low-frequency synthesizer means;

disconnecting the track and hold circuit;

again closing the main phase-lock loop; and sweeping the low-frequency synthesizer means again.

20. The pretune calibration method of claim 18, wherein step v) comprises:

1) opening the main phase-lock loop;

2) deriving a value used to set the electronic pretuning means needed to produce the actual phase-lock frequency based on measurement of the actual phase-lock frequency tuning voltage and slope and offset;

3) setting the electronic pretuning means with the value derived at step 2) and using a corresponding pretuning voltage produced by the electronic pretuning means to pretune the tunable oscillator means;

4) counting and storing a first frequency output of a frequency sampler means;

(5) shifting a frequency of the low-frequency synthesizer means connected to the frequency sampler means a known amount;

6) counting and storing a second frequency output of the frequency sampler means;

7) computing a difference between the first and second frequency outputs determined at steps 4) and 6), respectively; and 8) using the difference computed at step 7) and the known amount that the frequency of the low-frequency synthesizer means shifts to determine the harmonic to which the tunable oscillator means is tuned.

* * * * *

UNITED STATES PATENT AND TRADEMARK OFFICE
CERTIFICATE OF CORRECTION

PATENT NO. : 5,130,670

DATED : July 14, 1992

INVENTOR(S) : Stanley E. Jaffe

Page 1 of 2

It is certified that error appears in the above-identified patent and that said Letters Patent is hereby corrected as shown below:

Column 1, Line 35, "close the phase lock" should read --close the phase-lock--
Column 4, Line 66, "close the phase lock" should read --close the phase-lock--
Column 7, Line 33, "to which he" should read --to which the--
Column 8, Line 48, "filter 22'" should read --filter 22'.--
Column 9, Line 12, "12," should read --12'--

Column 10, Line 68, "o synthesized" should read --synthesized--
Column 11, Line 33, "microwave at the highest frequency of the previous" should read --microwave oscillator 12' will move from its lock on the comb tooth at the highest frequency of the previous--
Column 11, Line 46, "12'" should read --12'.--
Column 12, Line 10, "connected to the 25 output" should read --connected to the output--
Column 97, Line 24, "The swept synthesizer" should read --The swept synthesized--
Column 97, Line 28, "The swept synthesizer" should read --The swept synthesized--
Column 97, Line 30, "of frequency bands" should read --of frequency bands,--
Column 97, Line 31, "comprising at rack" should read --comprising a track--
Column 101, Line 4, "the minimum operation" should read --the minimum operating--
Column 103, Line 46, "operation; and" should read --operation;--

UNITED STATES PATENT AND TRADEMARK OFFICE
CERTIFICATE OF CORRECTION

PATENT NO. : 5,130,670

DATED : July 14, 1992

INVENTOR(S) : Stanley E. Jaffe

It is certified that error appears in the above-identified patent and that said Letters Patent is hereby corrected as shown below:

Column 104, Line 9, "form the" should read --from the--.

Signed and Sealed this

Twenty-first Day of December, 1993

Attest:

BRUCE LEHMAN

*Attesting Officer*     *Commissioner of Patents and Trademarks*